(12) United States Patent
Fukagai

(10) Patent No.: US 10,186,840 B2
(45) Date of Patent: Jan. 22, 2019

(54) SEMICONDUCTOR DEVICE

(71) Applicant: Renesas Electronics Corporation, Tokyo (JP)

(72) Inventor: Kazuo Fukagai, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 1 day.

(21) Appl. No.: 15/235,013

(22) Filed: Aug. 11, 2016

(65) Prior Publication Data

US 2017/0063046 A1    Mar. 2, 2017

(30) Foreign Application Priority Data

Aug. 31, 2015   (JP) ................................. 2015-170334

(51) Int. Cl.
| | |
|---|---|
| *H01S 5/343* | (2006.01) |
| *H01S 5/223* | (2006.01) |
| *H01S 5/042* | (2006.01) |
| *H01S 5/028* | (2006.01) |
| *H01S 5/22* | (2006.01) |

(Continued)

(52) U.S. Cl.
CPC ........ *H01S 5/34333* (2013.01); *H01S 5/0425* (2013.01); *H01S 5/1014* (2013.01); *H01S 5/2231* (2013.01); *H01S 5/0287* (2013.01); *H01S 5/1039* (2013.01); *H01S 5/168* (2013.01); *H01S 5/2224* (2013.01); *H01S 2301/166* (2013.01)

(58) Field of Classification Search
CPC .... H01S 5/2231; H01S 5/1014; H01S 5/0425; H01S 5/16–5/168; H01S 5/22–5/24; H01S 5/1003; H01S 5/06256–5/06258; H01S 5/1071–5/1075
See application file for complete search history.

(56) References Cited

U.S. PATENT DOCUMENTS 4,523,317 A * 6/1985 Botez ........................ H01S 5/16
                                                                   372/45.01
4,594,718 A * 6/1986 Scifres ................... B82Y 20/00
                                                                   372/45.01

(Continued)

FOREIGN PATENT DOCUMENTS

| JP | 57159079 A | * | 10/1982 | ......... H01S 5/06203 |
| JP | 02159783 A | * | 6/1990 | ............. H01S 5/162 |
| JP | 2000-196188 A | | 7/2000 | |

*Primary Examiner* — Joshua King
(74) *Attorney, Agent, or Firm* — McGinn IP Law Group, PLLC

(57) ABSTRACT

A semiconductor laser including current block layers disposed between a p-type clad layer and a p-type light guide layer and a current confinement region which is a region between the current block layers is configured as follows. A width of an opening portion of an insulating layer is made narrow above a wide portion of the current confinement region in which the wide portion, a tapered portion, a narrow portion, a tapered portion and the wide portion are disposed in this order between an incidence side (HR side) and an emission side (AR side), and both ends of the wide portion are covered by an insulating layer. According to such a configuration, it is possible to suppress generation of super luminescence in the wide portion, and it is thus possible to achieve improvement in beam quality and higher output of the beam.

13 Claims, 42 Drawing Sheets

(51) Int. Cl.
*H01S 5/16* (2006.01)
*H01S 5/10* (2006.01)

(56) References Cited

U.S. PATENT DOCUMENTS

| | | | | |
|---|---|---|---|---|
| 4,606,033 | A * | 8/1986 | Sakamoto | H01S 5/20 372/45.01 |
| 4,769,821 | A * | 9/1988 | Gotoh | H01S 5/164 372/45.012 |
| 5,111,469 | A * | 5/1992 | Narui | H01S 5/10 372/45.01 |
| 5,809,053 | A * | 9/1998 | Nakatsuka | H01S 5/0425 372/45.01 |
| 5,920,586 | A * | 7/1999 | Nagai | H01S 5/22 372/45.01 |
| 6,226,310 | B1 * | 5/2001 | Takagi | H01S 5/0265 372/102 |
| 8,615,027 | B2 * | 12/2013 | Oota | H01S 5/22 372/43.01 |
| 2001/0011730 | A1 * | 8/2001 | Saeki | B82Y 20/00 257/79 |
| 2003/0012241 | A1 * | 1/2003 | Onishi | B82Y 20/00 372/46.01 |
| 2003/0057427 | A1 * | 3/2003 | Chida | H01S 5/227 257/98 |
| 2004/0066822 | A1 * | 4/2004 | Ohkubo | B82Y 20/00 372/46.01 |
| 2004/0184501 | A1 * | 9/2004 | Takayama | H01S 5/162 372/46.011 |
| 2004/0218646 | A1 * | 11/2004 | Mihashi | H01S 5/0425 372/46.01 |
| 2004/0264520 | A1 * | 12/2004 | Takase | B82Y 20/00 372/36 |
| 2005/0202679 | A1 * | 9/2005 | Stoltz | H01S 5/0265 438/694 |
| 2005/0213911 | A1 * | 9/2005 | Stoltz | H01S 5/0265 385/129 |
| 2005/0254538 | A1 * | 11/2005 | Asatsuma | H01S 5/1082 372/49.01 |
| 2006/0011946 | A1 * | 1/2006 | Toda | H01S 5/32341 257/202 |
| 2007/0184591 | A1 * | 8/2007 | Morizumi | B82Y 20/00 438/166 |
| 2008/0037607 | A1 * | 2/2008 | Hashimoto | B82Y 20/00 372/45.01 |
| 2008/0063020 | A1 * | 3/2008 | Fukuda | H01S 5/32341 372/45.012 |
| 2008/0219312 | A1 * | 9/2008 | Sugiyama | B82Y 20/00 372/46.01 |
| 2009/0323750 | A1 * | 12/2009 | Inoue | B82Y 20/00 372/46.01 |
| 2010/0046566 | A1 * | 2/2010 | Kudo | B82Y 20/00 372/45.01 |
| 2011/0164642 | A1 * | 7/2011 | Onishi | H01S 5/02461 372/46.012 |
| 2012/0033698 | A1 * | 2/2012 | Morizumi | H01S 5/0281 372/45.011 |
| 2012/0213242 | A1 * | 8/2012 | Tanaka | B82Y 20/00 372/50.1 |
| 2012/0243074 | A1 * | 9/2012 | Hasegawa | H01S 5/1064 359/341.1 |
| 2015/0349496 | A1 * | 12/2015 | Miyasaka | H01S 5/164 372/44.011 |

* cited by examiner

HORIZONTAL AND VERTICAL EMISSION PATTERNS AT LIGHT OUTPUT OF 300 mW

SEMICONDUCTOR DEVICE

CROSS-REFERENCE TO RELATED APPLICATION

The present application claims priority from Japanese Patent Application No. 2015-170334 filed on Aug. 31, 2015, the content of which is hereby incorporated by reference into this application.

TECHNICAL FIELD OF THE INVENTION

The present invention relates to a semiconductor device and can be effectively applied to, for example, a semiconductor laser using a nitride semiconductor.

BACKGROUND OF THE INVENTION

In recent years, semiconductor lasers have been used in precision measuring instruments (industrial or medical sensor devices or analyzing devices).

For example, Japanese Patent Application Laid-Open Publication No. 2000-196188 (Patent Document 1) discloses a gallium nitride-based compound semiconductor laser element including an InGaNMQW active layer.

SUMMARY OF THE INVENTION

The inventors of the present invention have been engaged in research and development of a semiconductor laser using a nitride semiconductor, and have conducted intensive studies regarding the improvement of the performance thereof. During the course of the studies, it has been found out that there is still room for improvement in terms of the structure for the improvement in the performance of the semiconductor laser.

The other objects and novel characteristics of the present invention will be apparent from the description of the present specification and the accompanying drawings.

The following is a brief description of an outline of the typical invention disclosed in the present application.

A semiconductor device shown in an embodiment disclosed in the present application includes a current confinement region that includes a first portion, a second portion disposed on a first side surface on one side of the first portion, and a third portion disposed on a second side surface on the other side of the first portion. The semiconductor device further includes an insulating film having an opening portion provided above the current confinement region. In addition, a width of the second portion is larger than a width of the opening portion of the insulating film positioned above the second portion, and both ends of the second portion are covered by the insulating film.

According to the semiconductor device to be shown in representative embodiments disclosed in the present application, it is possible to improve the characteristics of the semiconductor device.

BRIEF DESCRIPTIONS OF THE DRAWINGS

DESCRIPTIONS OF THE PREFERRED EMBODIMENTS

Figure 1:
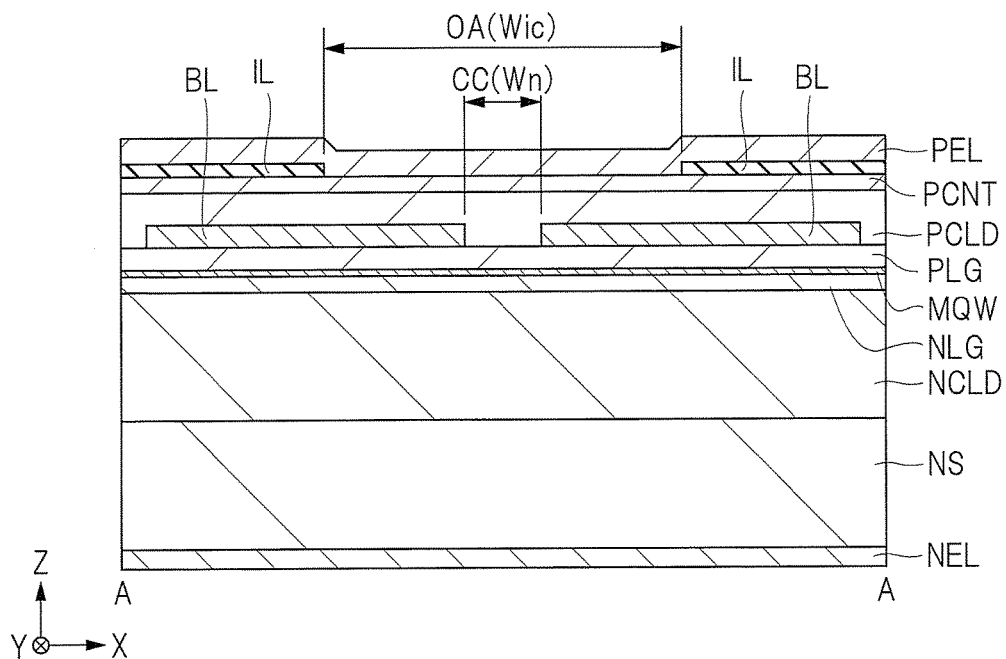
FIG. 1 is a cross-sectional view showing a configuration of a semiconductor laser according to the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof and the like are mentioned, the substantially approximate and similar shapes and the like are included therein unless otherwise stated or except the case where it is conceivable that they are apparently excluded in principle. The same goes for the numbers (including the number of pieces, numerical value, amount, range and others) described above.

Hereinafter, typical embodiments will be described in detail based on the drawings. Note that the components having the same function are denoted by the same reference characters throughout the drawings for describing the embodiments, and the repetitive description thereof will be omitted. Also, when there are a plurality of similar members (portions), an individual or specific portion is indicated by adding a symbol to a generic character in some cases. In addition, the description of the same or similar portions is not repeated in principle unless particularly required in the following embodiments.

Further, in the drawings used in the following embodiments, hatching is omitted in some cases even in a cross-sectional view so as to make the drawings easy to see. Also, hatching is used in some cases even in a plan view so as to make the drawings easy to see.

Further, the size of respective portions does not correspond to that of an actual device in a cross-sectional view and a plan view, and a specific portion is shown in a relatively enlarged manner in some cases so as to make the drawings easy to see. Also, even when a cross-sectional view and a plan view correspond to each other, a specific portion is shown in a relatively enlarged manner in some cases so as to make the drawings easy to see.

First Embodiment

Hereinafter, items examined by the inventors of the present invention will be described before describing the first embodiment in detail with reference to the drawings.

[Examined Item]

It is possible to improve a light output by enlarging a width of a waveguide in a semiconductor laser (first method). The waveguide refers to a passage of light, and refers to mainly a region inside an active layer in which light reciprocates (oscillates) in a semiconductor laser. In this first method, when the waveguide is excessively enlarged, not only the fundamental mode but also high order modes up to the primary mode or secondary mode potentially become an allowable mode in which light can oscillate. Further, the oscillation in which the fundamental mode and the high order mode are mixed is generated due to distortion in the horizontal-direction gain distribution of the waveguide caused by hole burning by the oscillated light. Accordingly, kinks are generated in current-light output characteristics, and deterioration occurs in oscillation characteristics and beam quality such as destabilization in oscillation wavelength spectrum characteristics and distortion in a far field pattern. The fundamental mode is unimodal, the number of peaks is two in the primary mode, and the number of peaks is three in the secondary mode.

To be specific, it has been found out that the deterioration of the beam quality occurs at the light output of 100 mW or lower when a width of the waveguide of the semiconductor laser is enlarged so as to have the light output of 300 mW or higher. Thus, it has been understood that it is difficult to simultaneously achieve the light output of 300 mW or higher and the high beam quality.

Meanwhile, a design in which light is less likely to oscillate in the high order mode can be provided by weakening one or both of configurations of light confinement in the longitudinal direction and the lateral direction in order to secure the beam quality (second method). In this second method, however, an oscillation threshold current density increases and temperature characteristics degrade.

As described above, in order to suppress the degradation of the temperature characteristics while maintaining both the high output of the semiconductor laser and the high beam quality, it is preferable to decrease the width of the waveguide to such a degree that does not allow the high order mode while employing the configurations of the light confinement in the longitudinal direction and the lateral direction and further to enlarge the width of the waveguide to such a degree that enables the high-output operation in a light-emitting end surface. In this manner, it is preferable to employ a structure in which the width of the waveguide differs in a longitudinal direction of the waveguide and also to provide a configuration in which a waveguide loss caused when light passes through a resonator is sufficiently small and the influence on the oscillation threshold current density and the temperature characteristics is suppressed as much as possible.

Figure 31:
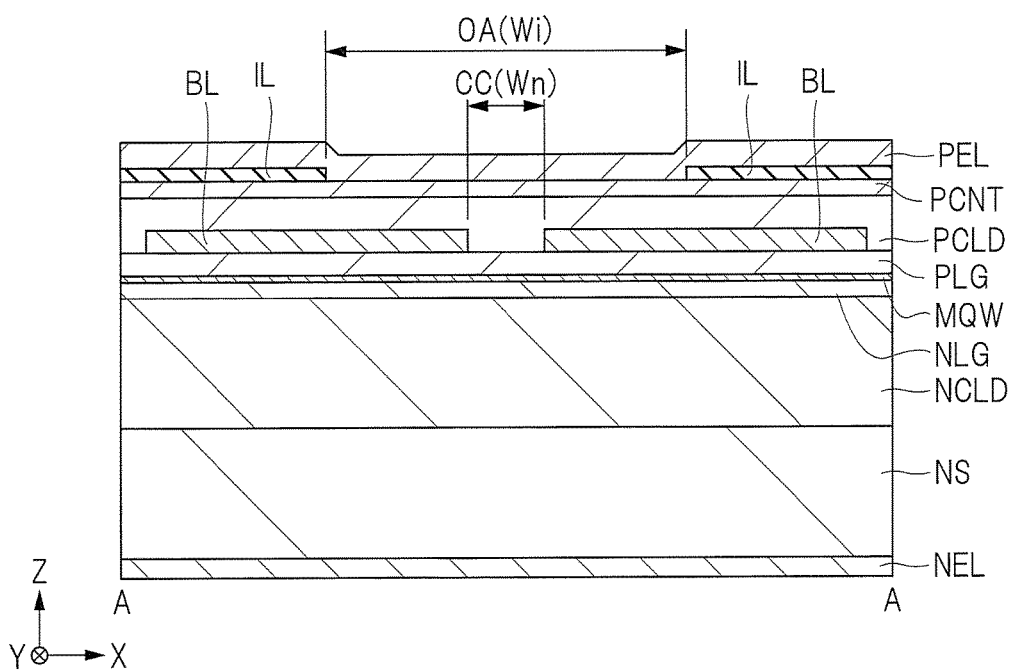
FIG. 31 is a cross-sectional view showing a configuration of a semiconductor laser according to an examination example.
Figure 32:
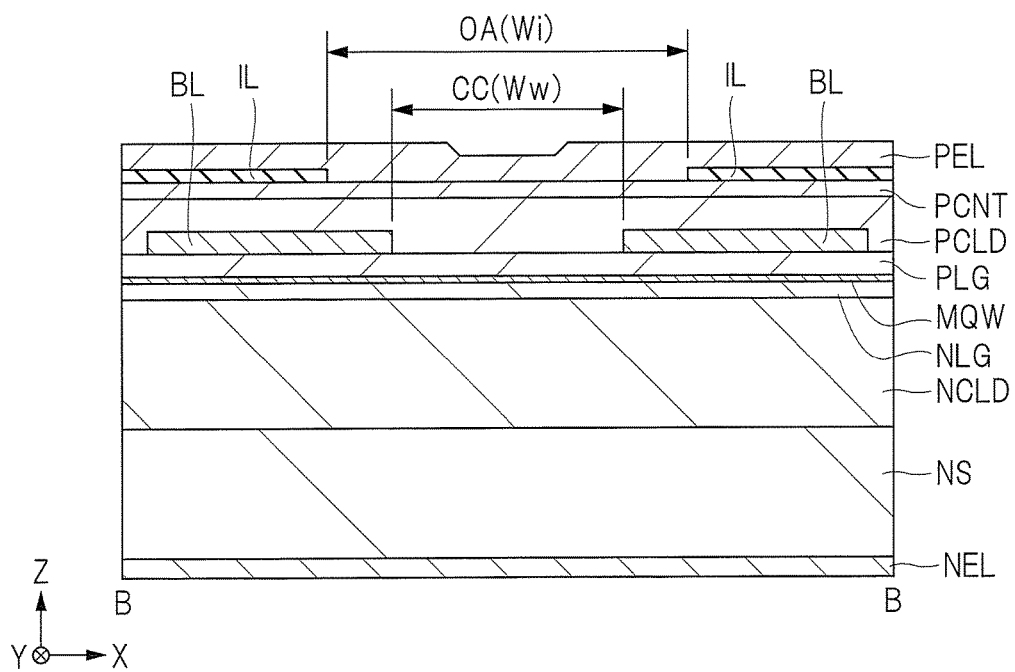
FIG. 32 is a cross-sectional view showing the configuration of the semiconductor laser according to the examination example.
Figure 33:
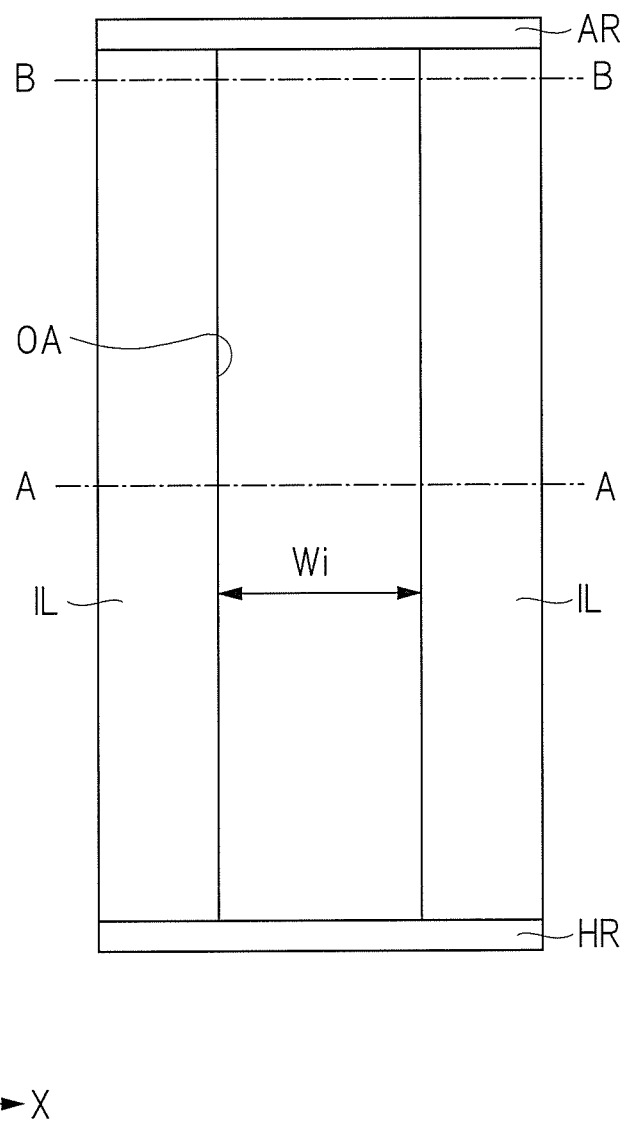
FIG. 33 is a plan view showing the configuration of the semiconductor laser according to the examination example.
Figure 34:
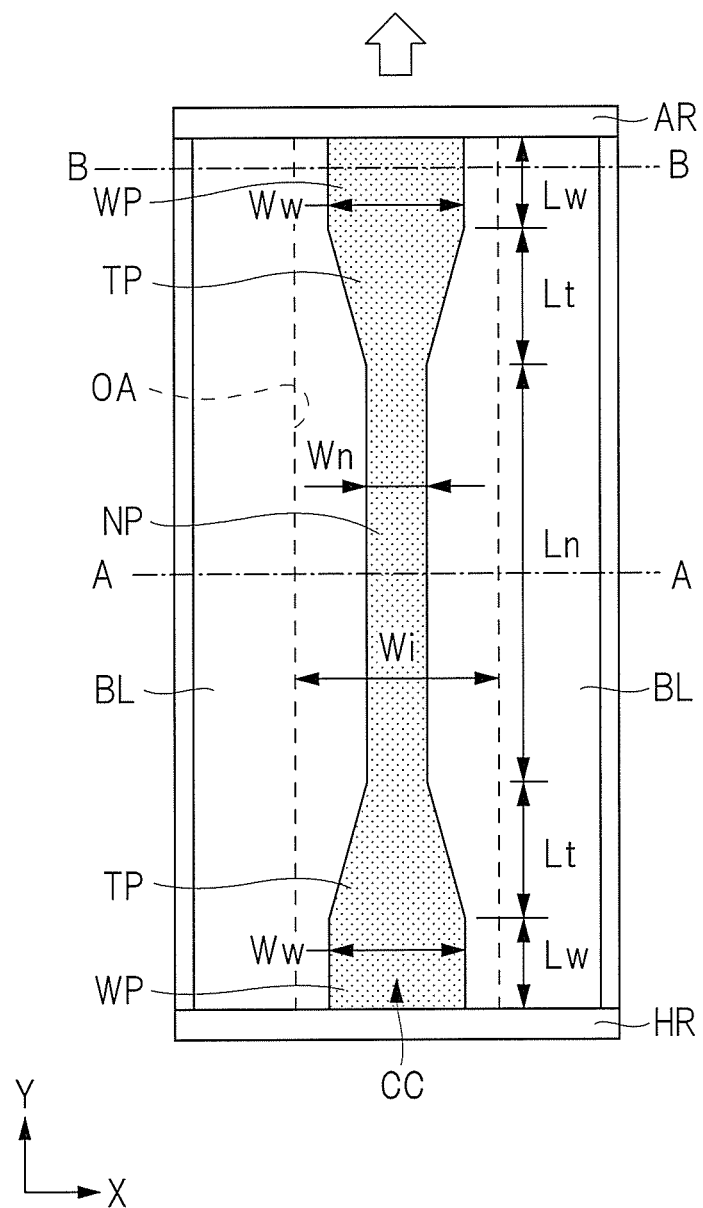
FIG. 34 is a plan view showing the configuration of the semiconductor laser according to the examination example.

Subsequently, a semiconductor device (semiconductor laser) that the inventors of the present invention have examined in advance will be described. FIGS. 31 to 34 are plan views and cross-sectional views showing a configuration of the semiconductor laser of an examination example. FIGS. 31 and 32 are the cross-sectional views and FIGS. 33 and 34 are the plan views. The cross-sectional views of FIGS. 31 and 32 correspond to an A-A cross section and a B-B cross section of FIGS. 33 and 34.

As shown in FIGS. 31 and 32, the semiconductor laser of the examination example uses an n-type substrate NS as a substrate and includes a plurality of nitride semiconductor layers sequentially laminated on the substrate. To be specific, an n-type clad layer NCLD, an n-type light guide layer NLG, an active layer MQW, a p-type light guide layer PLG, a p-type clad layer PCLD and a p-type contact layer PCNT are sequentially disposed on the n-type substrate NS in this order from bottom. In addition, a p-side electrode PEL is disposed on the p-type contact layer PCNT as the uppermost layer, and an n-side electrode NEL is disposed on a back surface of the n-type substrate NS. The p-type contact layer PCNT and the p-side electrode PEL are in contact with each other via an opening portion OA of an insulating layer (insulating film) IL (see FIG. 33).

Further, current block layers BL are disposed between the n-type clad layer NCLD and the n-type light guide layer NLG in the semiconductor laser of the examination example. A current confinement region CC is formed between these current block layers BL. As shown in FIG. 34, the current confinement region CC includes a narrow portion NP positioned at a central portion in the Y direction and wide portions WP positioned at end portions of the narrow portion NP. A tapered portion TP is formed between the narrow portion NP and the wide portion WP. A width of the narrow portion NP is a width Wn, and a width of the wide portion WP (a length in the X direction or a width in the X direction) is a width Ww. In addition, a width of the opening portion OA is a width Wi. A relation that the width Wn<the width Ww<the width Wi is established. A length of the narrow portion NP in the Y direction is a length Ln, a length of the wide portion WP in the Y direction is a length Lw, and a length of the tapered portion TP in the Y direction is a length Lt.

Figure 35:
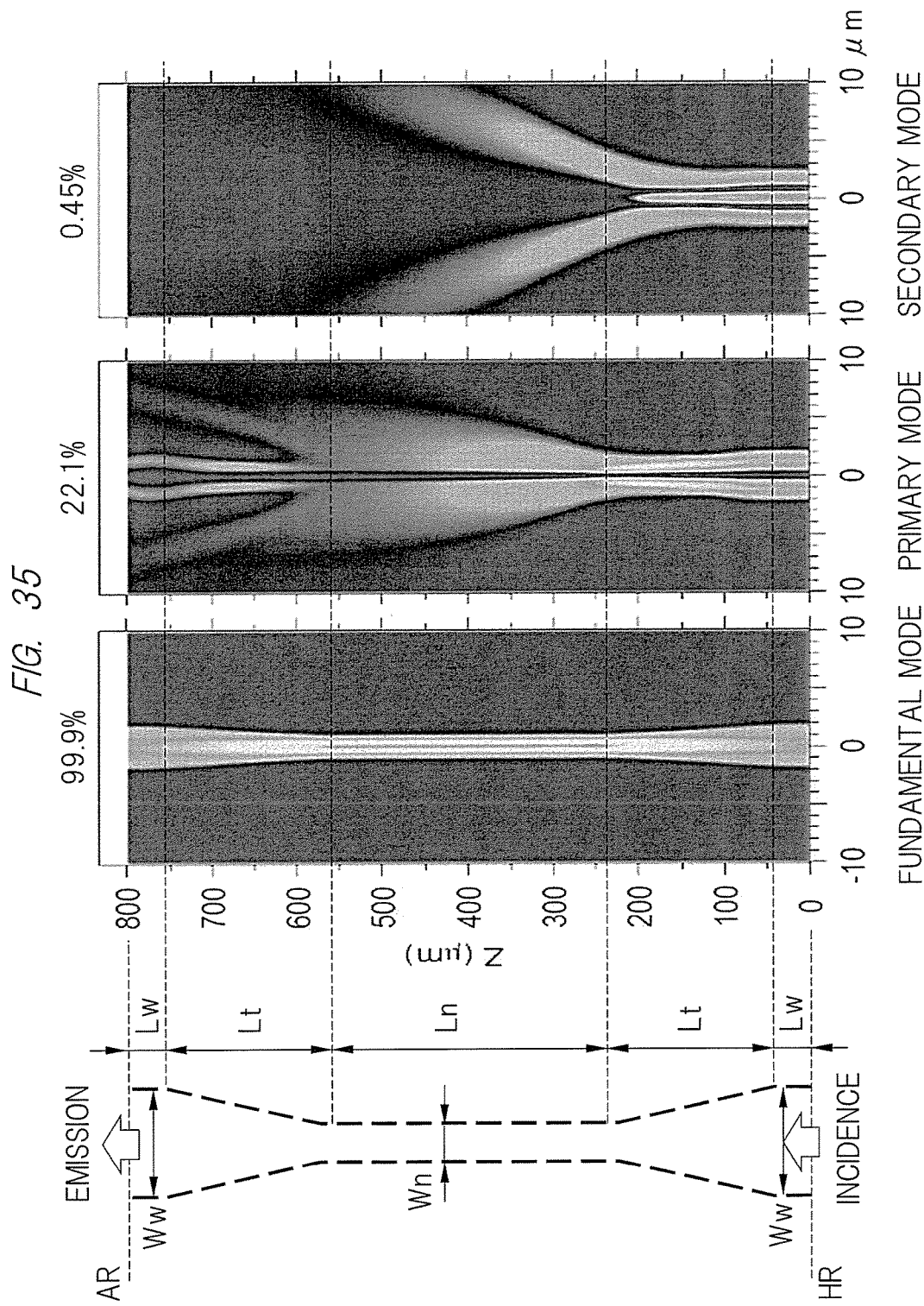
FIG. 35 is a diagram showing a relation between an incidence mode to a waveguide of a semiconductor laser and an electric field intensity distribution.

FIG. 35 is a diagram showing a relation between an incidence mode to a waveguide of the semiconductor laser and an electric field intensity distribution. The left drawing shows a plan view of the current confinement region and the right drawings show the case of the fundamental mode, the case of the primary mode and the case of the secondary mode, respectively. Herein, the resonator of the semiconductor laser is assumed as a passive waveguide. In addition, the electric field intensity distribution when a light propagates through a waveguide of 800 μm from an end surface on the HR side to an end surface on the AR side is calculated by using a beam propagation method and displayed in contour. The width Ww is set to 4 μm, the width Wn is set to 1.3 μm, the length Lw is set to 40 μm, the length Lt is set to 200 μm, and the length Ln is set to 320 μm.

When the incident light is the fundamental mode, the light is recursively incident several times and is converged to obtain an emittance electric field pattern of 1Path of the waveguide having the length of 800 μm in consideration of a mode in which the light reciprocates with end surfaces of the resonator as mirrors. In this case, transmittance of 1Path of the waveguide is 99.9%.

On the other hand, when the incident light is the high order mode, the light is dissipated outside the waveguide in the narrow portion, and the transmittance of 1Path of the waveguide is 22.1% in the primary mode and 0.45% in the secondary mode.

As described above, by controlling the width of the waveguide in a longitudinal direction of the resonator, it is possible to obtain the resonator in which the waveguide loss in the fundamental mode hardly occurs while causing the narrow portion inside the resonator to function as a filter to stop guiding in the high order mode.

In addition, on the basis of the narrow portion NP (the width Wn=1.3 μm) as a reference, it is calculated that a peak value of light intensity density in the fundamental mode at an end surface of the wide portion WP (the width Ww=4.0 μm) decreases by 0.45 times. Since an upper limit of an operation light output relating to an optical breakdown resistance of the end surface is determined by the light intensity density, an operation with a light output more than twice as high as the case in which the narrow portion NP is extended to the end can be performed by setting the width Ww to 4.0 μm.

In this manner, the wide portion WP is provided at both ends of the narrow portion NP of the current confinement region CC in the semiconductor laser of the examination example, and accordingly, it is possible to achieve the suppression of the degradation of the beam quality and the improvement of the operation light output.

Figure 36B:
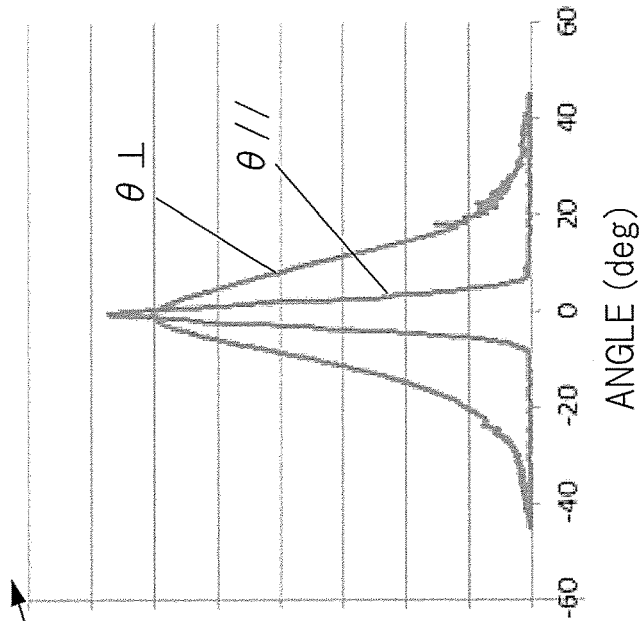
FIG. 36B is a diagram showing a far field pattern of emitted light.
Figure 36A:
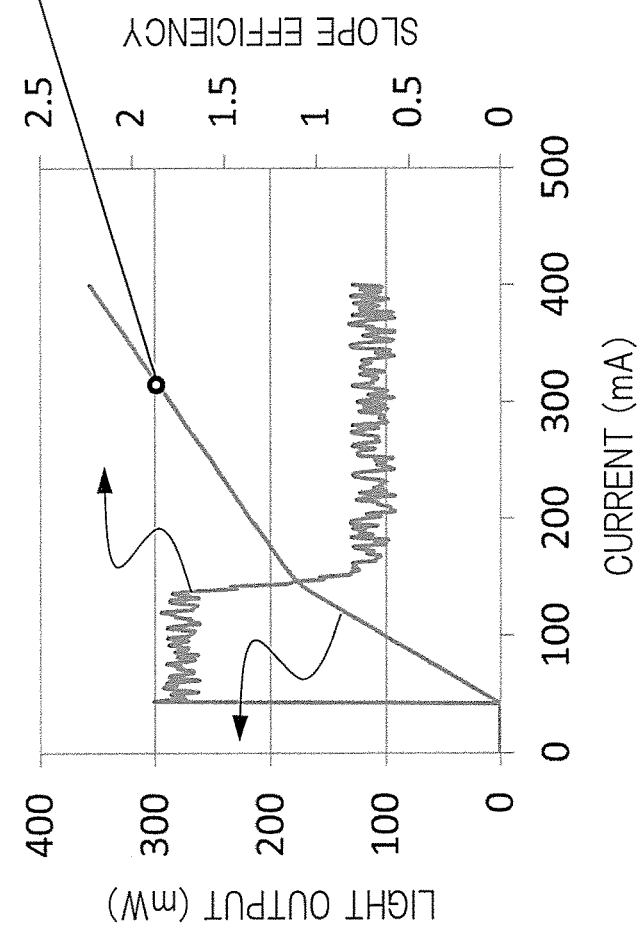
FIG. 36A is a diagram showing current-light output characteristics of the semiconductor laser.

FIGS. 36A and 36B are diagrams showing current-light output characteristics of the semiconductor laser and a far field pattern of emitted light. FIG. 36A shows the current-light output characteristics. The horizontal axis represents the current (mA), and the vertical axis represents the light output (mW). The vertical axis on the right side represents a slope efficiency (W/A). As shown in FIG. 36A, a flexure of a current-light output line appears in the vicinity of the light output of 170 mW, and the slope efficiency (thin line) drastically decreases in the vicinity thereof.

However, the far field pattern in the horizontal direction represents the unimodal regarding the far field pattern at the light output of 300 mW as shown in FIG. 36B, and there is no difference from the far field pattern in the fundamental mode. Namely, a mixed waveform in the primary mode or the secondary mode accompanying the generation of kinks appearing at the time of enlarging a width of the current confinement region CC is not confirmed.

From the above result, it is considered that the flexure of the current-light output line shown in FIG. 36A is associated with "generation of super luminescence" in the wide portion WP.

Conditions that cause the super luminescence in the light-emitting element of an edge emitter type include: (1) a reflectance of the end surface of the resonator is low; (2) an extending direction of the current confinement region CC is shifted from a direction orthogonal to the end surface; and the like. In this manner, the waveguide loss during round trip of light in the resonator is increased so that a threshold gain in a mode advantageous for the oscillation becomes a large value. In such a case, since the oscillation does not occur even in a high-current region, an intensive induced emission occurs during the short-distance guiding that does not reach a round trip, due to an increase in carrier density of the active layer and an increase in spontaneous emission light intensity, so that the super luminescence is caused (first mechanism).

However, the "super luminescence", which becomes remarkable after the flexure of the current-light output line in the semiconductor laser of the examination example, is caused by a mechanism different from the first mechanism mentioned above. This mechanism will be described as follows.

In conclusion, the super luminescence accompanying the flexure of the current-light output line is caused due to a drastic difference in height generated in the carrier distribution in the horizontal direction in the wide portion WP near the end surface.

The drastic difference in height of the carrier distribution is triggered by the spatial hole burning supposed to occur in the high-output area of the semiconductor laser, and is caused by the following mechanism in a structure in which a width of the current confinement region CC in the extending direction is changed.

First, general hole burning will be described. In a region with a relatively low light output, the carrier distribution of the active layer of each cross section of the current confinement region CC is clamped in a stationary profile, and the fundamental mode is in the state of receiving a stable gain. Thus, the stable oscillation state is maintained in the course of increasing the current to increase the light output. Namely, the light intensity is strong in each central portion of the cross sections due to a single peak shape in the fundamental mode, and a consumption rate of a carrier of the active layer caused by the induced emission becomes fast. However, an adjustment mechanism to make the carrier density uniform functions through a current injection balance from the clad layer to the active layer and the diffusion of the carrier inside the active layer. Thus, the amount of decrease of the carrier density in the central portion of the cross section and a difference in height thereof are suppressed to be slight. Thus, the fundamental mode oscillation is held under stable refractive index/gain profile in the horizontal direction. Here, when the light intensity is further increased, the carrier consumption rate of the active layer increases, so that a difference in the carrier consumption rate increases among the cross sections. In accordance with this, a region in which the response speed of the mechanism to suppress the decrease of the carrier density and the mechanism to make the carrier density uniform becomes insufficient is eventually reached. At this time, a local decrease of the carrier density becomes remarkable in a portion in which the light intensity is strong, and accordingly, a self-focusing phenomenon is caused due to the decrease of the gain and the increase of the refractive index in the light intensity peak portion, thereby causing the waveguide instability. Consequently, the flexure (kinks) of the current-light output line is eventually caused.

Further, the carrier density of the current confinement region CC including the wide portion WP will be described. The carrier density in the X direction of the active layer of the narrow portion NP is in a stable clamped state in a region of the current-light output line having the low light output slightly exceeding the oscillation threshold. Thus, the variation of the carrier density is small with respect to the increase and decrease of the light output. This is because the distribution width of the light intensity overlaps the width (Wn) of the narrow portion NP, and thus, the carriers injected in the active layer are rapidly consumed by the induced emission regardless of injected positions in the X direction.

However, although the distribution width of the light intensity is enlarged in the wide portion WP than in the narrow portion NP, since the light confinement effect to the current confinement region CC increases, both end portions of the wide portion WP are turned into a state in which the lightwave intensity is low and the carrier consumption rate by the induced emission is lower than in the central portion. In other words, the clamp of the carrier is weakened.

When the current from such a region with the low light output is increased, the following phenomena (1) to (4) occur.

(1) The carrier density is increased in both end portions of the wide portion WP.

(2) Since the width Wi of the opening portion OA is larger than the width Ww of the wide portion WP, the current (carrier) is injected at the same degree of speed in the central portion and both end portions of the wide portion WP. Thus, the difference in carrier density is small in the initial stage of oscillation (the region with the low light output) and the adjustment mechanism, which makes the carrier density uniform through the injection balance of the current and the diffusion of the carrier, hardly functions.

(3) When the light output is increased and the spatial hole burning is caused in the central portion of the wide portion WP, the carrier density of the central portion becomes relatively low. Further, when the self-focusing starts to occur, positive feedback generates due to the weakening of the clamp of the carrier and the increase of the carrier density in the phenomena (1) and (2). Thus, the difference in height of the carrier density in the X direction of the wide portion WP is further enlarged.

(4) An electrical resistance per unit length in the extending direction of the current confinement region CC becomes smaller in the wide portion WP than in the narrow portion NP. Thus, an injection amount of the carrier per unit length becomes larger in the wide portion WP. The increase of the injection amount of the carrier promotes the phenomena (1) to (3).

The intensity of spontaneous emission (ASE) caused by the increase of the carrier injection density increases in both end portions of the wide portion WP near the end surface along with the progress of these phenomena (1) to (4). Further, when the current is increased, the spontaneous emission (ASE) reaches a level of causing the induced emission and is turned into the super luminescence state.

In this manner, a conflict occurs in the wide portion WP between the induced emission contributing to the fundamental mode and the induced emission caused by the spontaneous emission (ASE). When the induced emission caused by the spontaneous emission (ASE) starts to be remarkable in the wide portion WP and the intensity of the spontaneous emission (ASE) increases along with the increase of the current, the gain in the fundamental mode decreases. Accordingly, the oscillation threshold in the fundamental mode increases.

As described above, the flexure of the current-light output line of the semiconductor laser of the examination example is a point at which the super luminescence of the wide portion WP is caused, and a subsequent decrease of the slope efficiency is caused because the oscillation threshold in the fundamental mode gradually increases. The embodiments will be described hereinafter in consideration of the generation mechanism of the flexure of the current-light output line described above.

Description of First Embodiment

Figure 2:
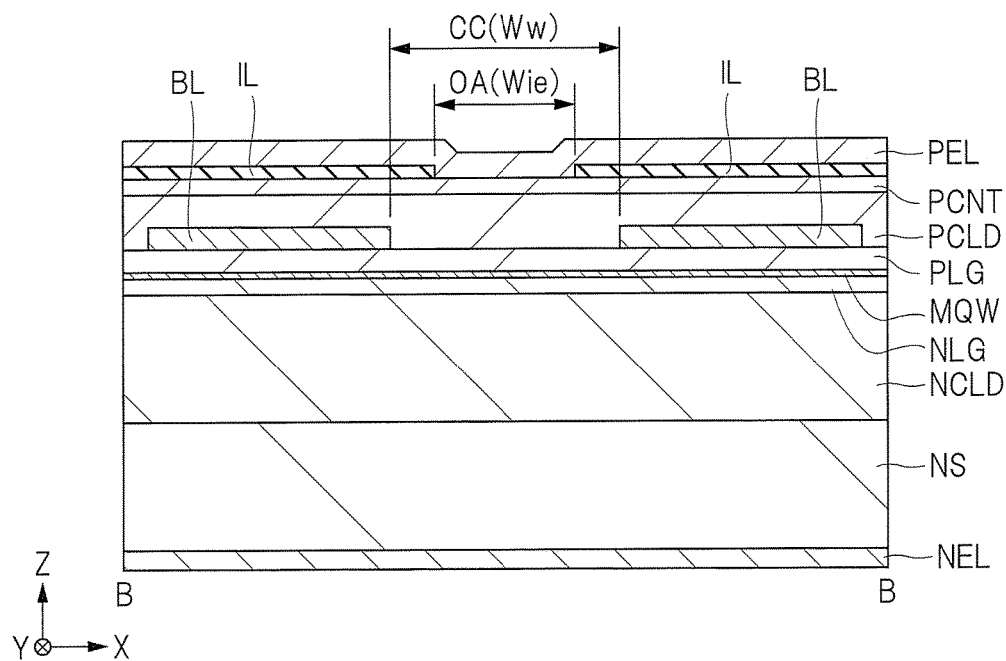
FIG. 2 is a cross-sectional view showing the configuration of the semiconductor laser according to the first embodiment.
Figure 3:
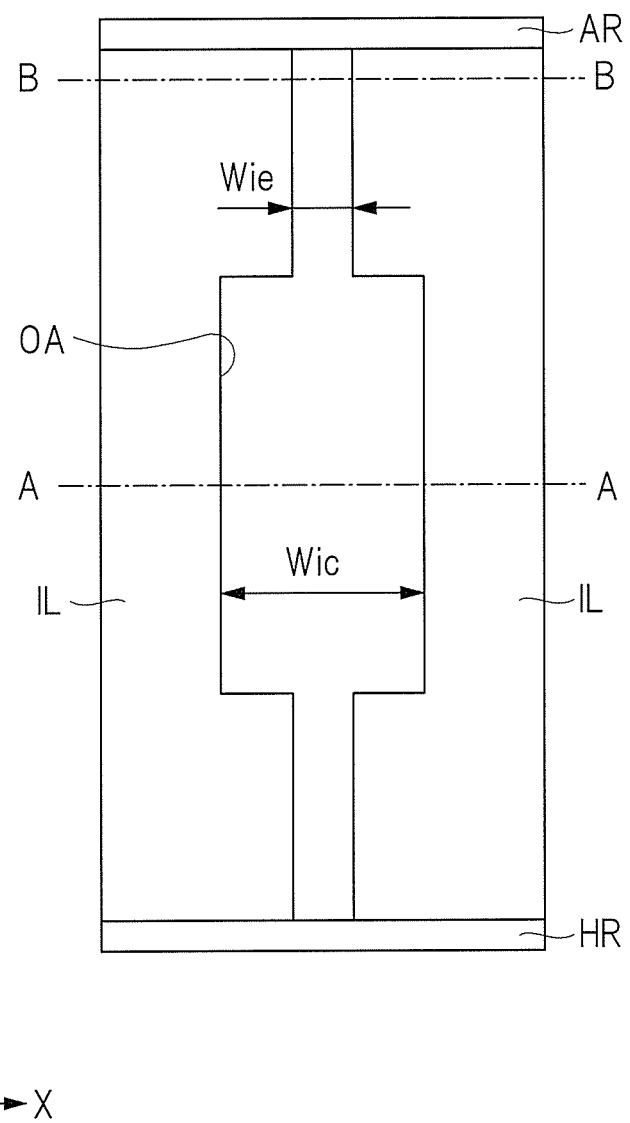
FIG. 3 is a plan view showing the configuration of the semiconductor laser according to the first embodiment.
Figure 4:
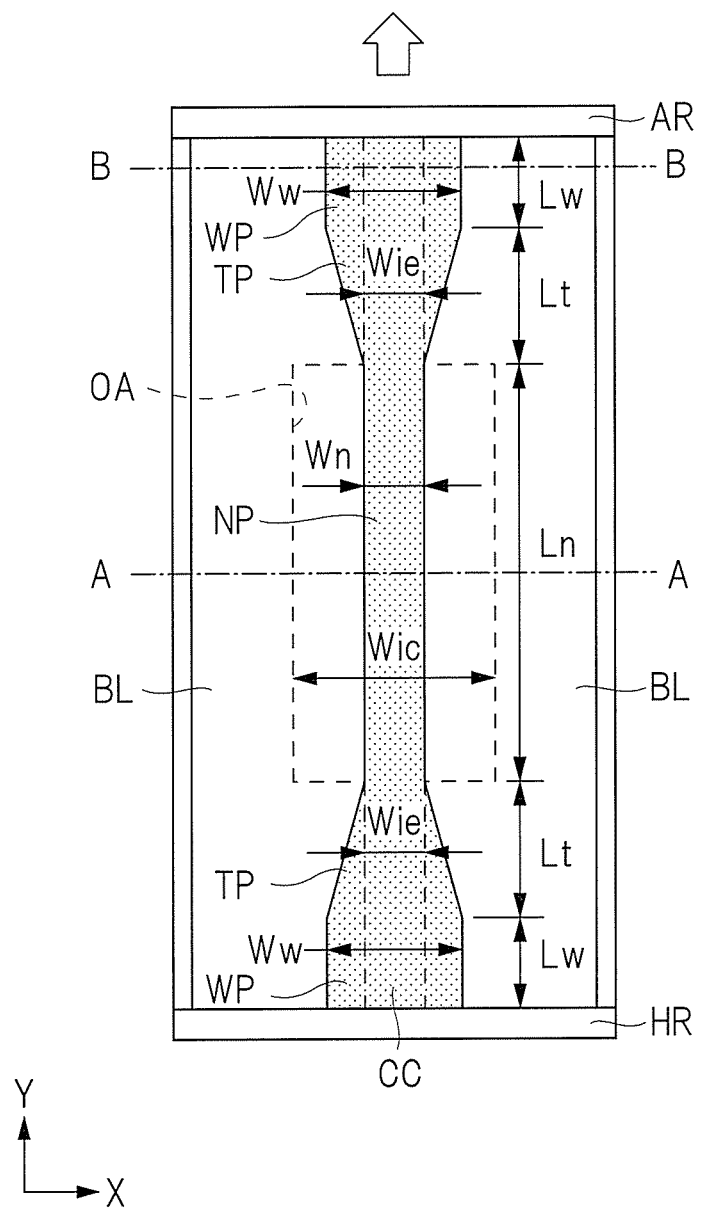
FIG. 4 is a plan view showing the configuration of the semiconductor laser according to the first embodiment.

Hereinafter, a semiconductor laser (semiconductor device) of the first embodiment will be described in detail with reference to the drawings. FIGS. 1 to 4 are plan views and cross-sectional views showing a configuration of the semiconductor laser of the first embodiment. FIGS. 1 and 2 are the cross-sectional views and FIGS. 3 and 4 are the plan views. The cross-sectional views of FIGS. 1 and 2 correspond to an A-A cross section and a B-B cross section of FIGS. 3 and 4.

[Description of Structure]

As shown in FIGS. 1 and 2, the semiconductor laser of the first embodiment uses an n-type substrate NS as a substrate and includes a plurality of nitride semiconductor layers sequentially laminated on the substrate. To be specific, an n-type clad layer NCLD, an n-type light guide layer NLG, an active layer MQW, a p-type light guide layer PLG, a p-type clad layer PCLD and a p-type contact layer PCNT are disposed on the n-type substrate NS in this order from bottom. In this manner, the semiconductor laser of the first embodiment has a structure in which the active layer MQW is interposed between the nitride semiconductors having the opposite conductivity types disposed in an upper layer and a lower layer.

Further, the p-side electrode PEL is disposed on the p-type contact layer PCNT as the uppermost layer, and the n-side electrode NEL is disposed on the back surface of the n-type substrate NS. The p-type contact layer PCNT and the p-side electrode PEL are in contact with each other via the opening portion OA of the insulating layer (insulating film) IL (see FIG. 3). The current block layer (a current block film or a current block region) BL is disposed between the p-type clad layer PCLD and the p-type light guide layer PLG. The two current block layers BL are disposed at a predetermined interval, and the current confinement region CC is formed between the current block layers BL (see FIG. 4). Side surfaces (a surface on an upper side and a surface on a lower side or end surfaces in FIGS. 3 and 4) on which the active layer MQW is exposed become cleavage surfaces constituting a resonator to be described below. An anti-reflection film AR or a high-reflection film HR is formed on the two cleavage surfaces opposed to each other. A side (HR side) on which the high-reflection film HR is formed is an incidence side of light, and a side (AR side) on which the anti-reflection film AR is formed is a light emission side.

Hereinafter, an operation of the semiconductor laser will be briefly described.

First, a positive voltage is applied to the p-side electrode PEL, and a negative voltage is applied to the n-side electrode NEL. Accordingly, a forward current flows from the p-side electrode PEL toward the n-side electrode NEL, and holes are injected from the p-side electrode PEL to the active layer MQW via the p-type contact layer PCNT, the p-type clad layer PCLD and the p-type light guide layer PLG. At this time, the current flows from the p-side electrode PEL to the active layer MQW via the opening portion OA of the insulating layer IL and the current confinement region CC. Meanwhile, electrons are injected from the n-side electrode NEL to the n-type substrate NS, and the injected electrons are injected to the active layer MQW via the n-type clad layer NCLD and the n-type light guide layer NLG.

The inverted distribution is formed in the active layer MQW by the injected holes and electrons, and the electrons are transitioned from a conduction band to a valence band by the induced emission, and accordingly, the light with coherent phase is generated. Further, the light generated in the active layer MQW is trapped inside the active layer MQW by surrounding semiconductor layers (the p-type clad layer PCLD and the n-type clad layer NCLD) having a lower refractive index than the active layer MQW. Further, the light trapped inside the active layer MQW reciprocates in the resonator constituted of the cleavage surfaces formed in the semiconductor laser, and is amplified by the induced emission. Thereafter, laser light oscillates in the active layer MQW, and the laser light is emitted.

Here, the p-type contact layer PCNT and the p-side electrode PEL are in contact with each other via the opening portion OA of the insulating layer IL in the semiconductor laser of the first embodiment as described above. As shown in FIG. 3, the opening portion OA extends in the Y direction. In other words, a longitudinal direction of the opening portion OA is the Y direction. Further, a width (central width) of the opening portion OA at a substantially central portion in the Y direction is a width Wic which is relatively wide. In addition, a width of the opening portion OA on the HR side on one side of the substantially central portion in the Y direction (the lower side in FIG. 3) is a width Wie which is relatively narrow. In addition, a width (end width) of the opening portion OA on the AR side on the other side of the substantially central portion in the Y direction (the upper side in FIG. 3) is the width Wie which is relatively narrow. A relation that the width Wic>the width Wie is established. In this manner, a shape seen from the upper surface (hereinafter, referred to as a planar shape) of the opening portion OA has a wide portion which is positioned at the substantially central portion and narrow portions positioned on both sides of the wide portion. The width Wic is, for example, about 4 µm, and the width Wie is, for example, about 1.6 µm.

In addition, the current block layer (the current block film or the current block region) BL is disposed between the n-type clad layer NCLD and the n-type light guide layer NLG in the semiconductor laser of the first embodiment. As shown in FIG. 4, the two current block layers BL extending in the Y direction are disposed with the predetermined interval. The current confinement region CC is formed between these current block layers BL. The current confinement region CC extends in the Y direction. In other words, a longitudinal direction of the current confinement region CC is the Y direction. To be specific, the current confinement region CC includes the narrow portion NP which is positioned at the substantially central portion in the Y direction and the wide portions WP which are positioned at end portions in the Y direction. The wide portions WP are in contact with the side surfaces (the surface on the upper side and the surface on the lower side, the end surfaces or the cleavage surfaces in FIGS. 3 and 4). The tapered portion (a substantially trapezoidal-shaped portion) TP is formed between the narrow portion NP and the wide portion WP, and a width thereof gradually increases from the narrow portion NP to the wide portion WP. A width of the narrow portion NP is the width Wn and a width of the wide portion WP is the width Ww. In addition, the above-described width of the opening portion OA is the width Wic at the central portion in the Y direction and is the width Wie at the end in the Y direction, and the relation that the width Wic>the width Wie is established. Further, a relation that the width Ww>the width Wie and a relation that the width Wic>the width Wn are established. A length of the narrow portion NP in the Y direction is the length Ln, a length of the wide portion WP in the Y direction is the length Lw, and a length of the tapered portion TP in the Y direction is the length Lt. Incidentally, in the opening portion OA of the insulating layer IL, a length of the wide portion in the Y direction positioned at the substantially central portion in the Y direction is the length Ln, and a length of the narrow portion in the Y direction positioned at the end in the Y direction is a length (Lt+Lw).

In this manner, since the width (Wie) of the opening portion OA of the insulating layer IL is made narrow above the wide portion WP of the current confinement region CC and both ends (right and left ends in the X direction in FIG. 4) of the wide portion WP are covered by the insulating layer IL in the first embodiment, it is possible to suppress the generation of the super luminescence in the wide portion WP that has been described in the paragraphs of "Examined Item". Accordingly, it is possible to achieve the improvement of the beam quality and the higher output of the beam. In addition, it is also possible to improve the beam quality in a high-light-output area, the operability at high temperature and the power consumption.

Figure 5A:
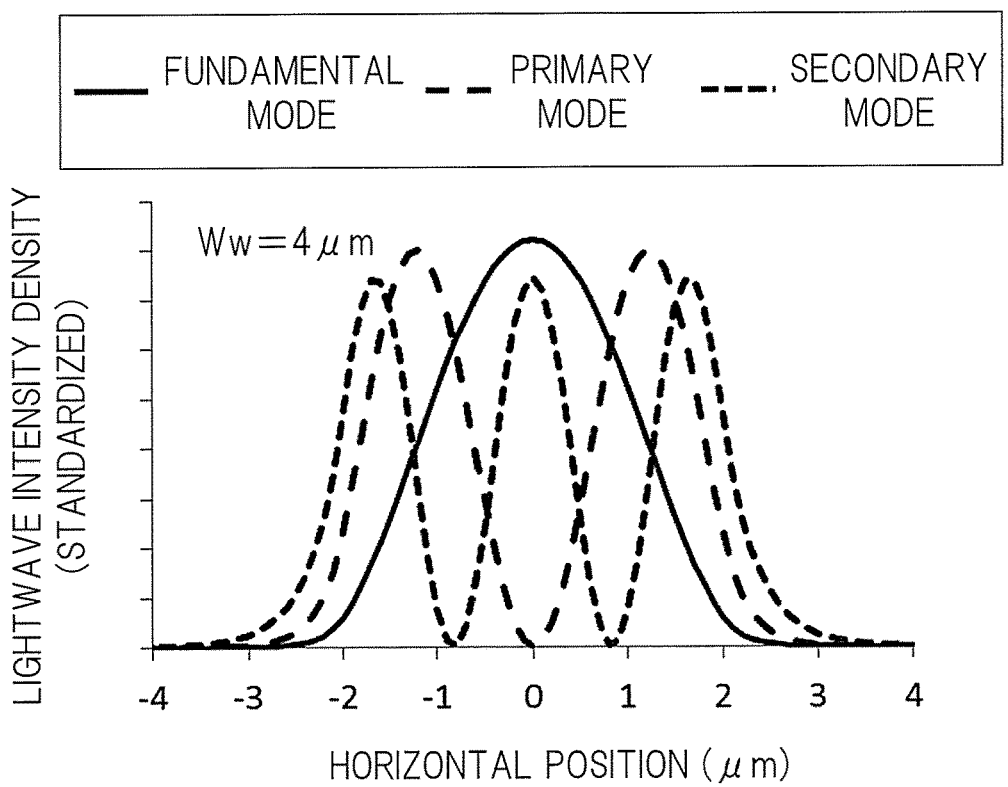
FIG. 5A is a diagram showing a lightwave intensity density in a horizontal direction of a current confinement region.
Figure 5B:
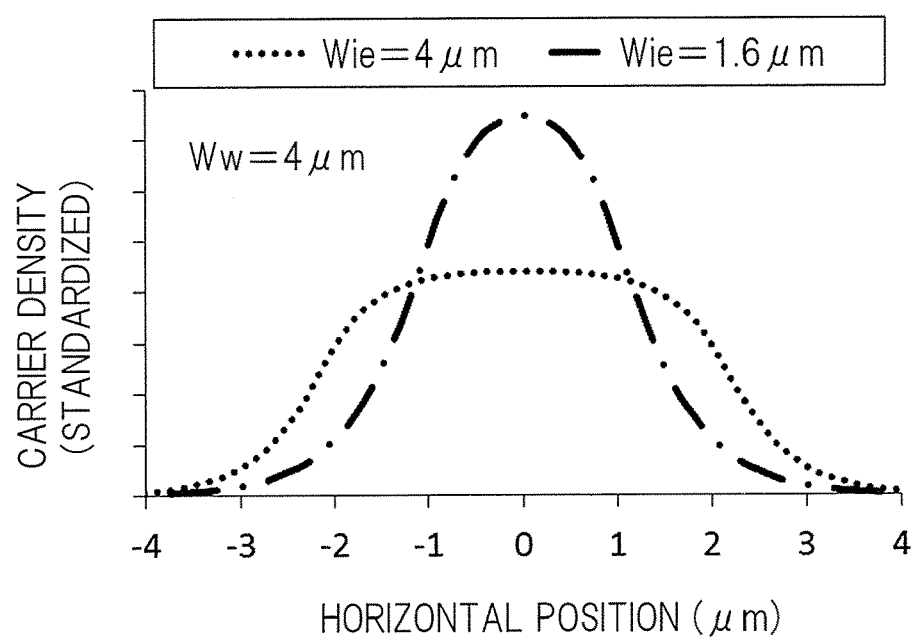
FIG. 5B is a diagram showing a carrier density in a horizontal direction of the current confinement region.

FIGS. 5A and 5B are diagrams showing a lightwave intensity density and a carrier density in a horizontal direction of the current confinement region. FIG. 5A shows a lightwave intensity density of the wide portion and FIG. 5B shows each carrier density of the wide portion and the narrow portion. The density is calculated based on optical waveguide calculation regarding a case in which the width Ww is 4 µm.

As shown in FIG. 5A, three modes including a fundamental mode, a primary mode and a secondary mode are allowed. Each intensity of the modes is standardized so that integrated values in the horizontal direction are the same value among the different modes. An effective refractive index difference in the horizontal direction ($\Delta n$) is set to $5 \times 10^{-3}$ as a calculation condition.

A graph of a one-dot chain line of FIG. 5B shows the carrier density in the wide portion WP having the width Ww=4 µm in a case in which the width Wie of the end of the opening portion OA=1.6 µm. In addition, a graph of a broken line shows the carrier density in the wide portion WP having the width Ww=4 µm in a case in which the width Wie of the end of the opening portion OA=4 µm. Herein, it is standardized so that the integrated values in the horizontal direction of the carrier density are the same value in the case of the width Wie=1.6 µm and the case of the width Wie=4 µm. As the calculation conditions, the p-type light guide layer PLG has a resistivity of 1 Ωcm and a film thickness of 0.1 µm and the p-type clad layer PCLD has a resistivity of 1 Ωcm and a film thickness of 0.5 µm. In addition, a carrier diffusion length inside the active layer MQW is 0.5 µm, and a current of 65 mA is injected in the case of a straight waveguide having a width of 4 µm and the resonator having a length of 800 µm.

Here, an overlap integral of a lightwave intensity waveform and the carrier density is calculated for each of the fundamental mode, the primary mode and the secondary mode of FIG. 5A, and each value is compared. Such comparison corresponds to a comparison of each light-induced emission rate received by the respective modes in a case in which constant carriers are injected per unit length of the current confinement region CC in the longitudinal direction (Y direction) and a constant light output is generated.

Figure 6A:
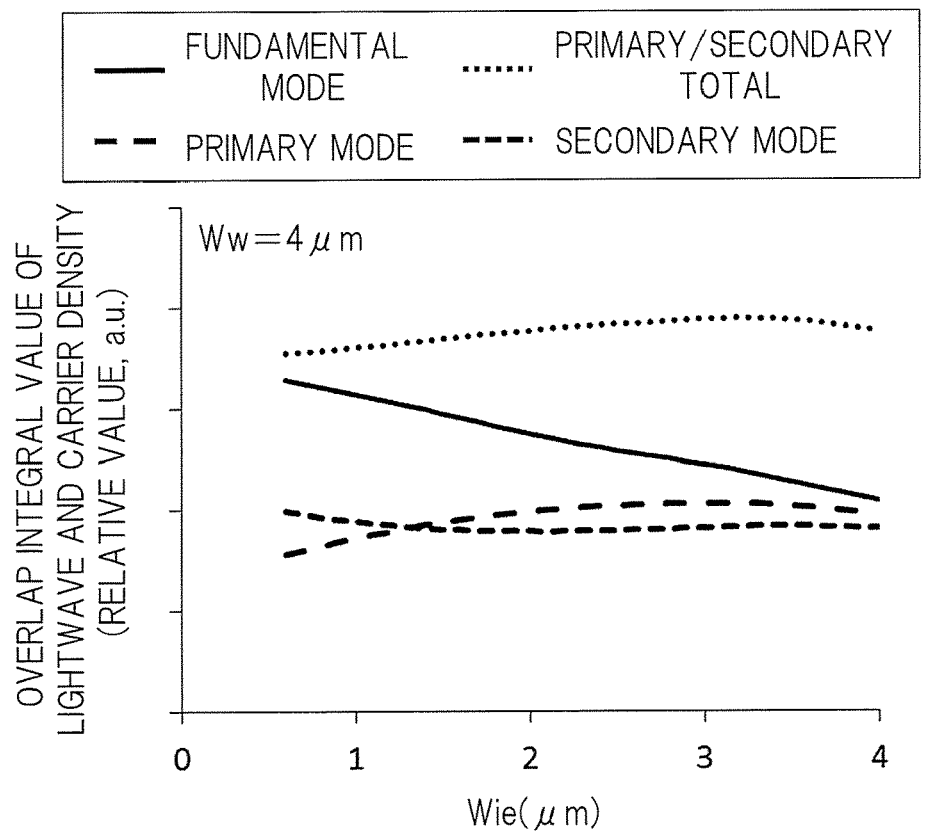
FIG. 6A is a diagram showing an overlap integral of a lightwave intensity waveform and a carrier density.
Figure 6B:
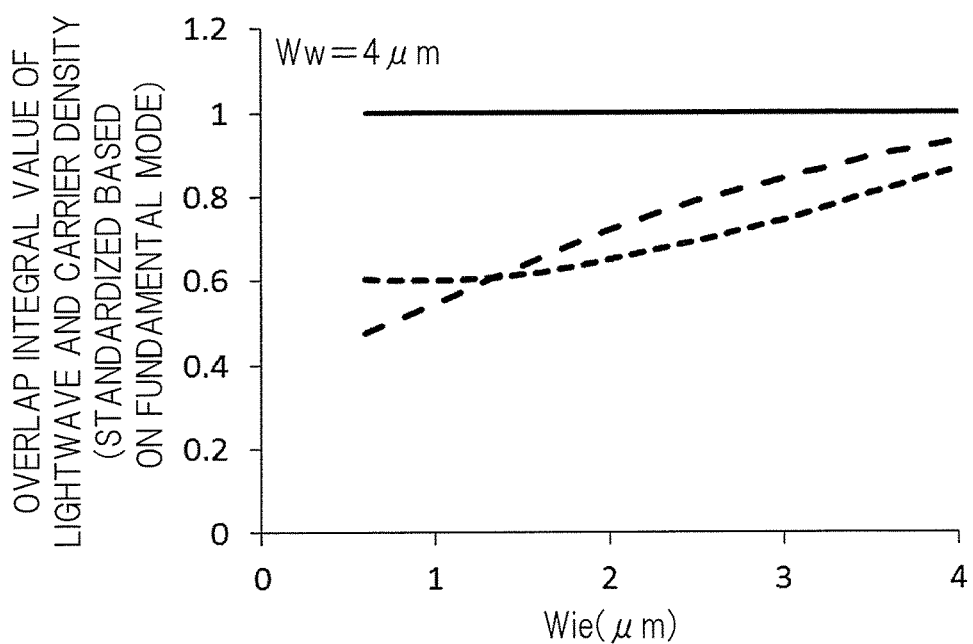
FIG. 6B is a diagram showing an overlap integral of a lightwave intensity waveform and a carrier density.

FIGS. 6A and 6B are diagrams showing the overlap integral of the lightwave intensity waveform and the carrier density. FIG. 6A shows each overlap integral value (relative value) regarding the fundamental mode, the primary mode and the secondary mode, and FIG. 6B shows the overlap integral values standardized based on the fundamental mode.

In the case of the broken line (the width Wie=4 µm) of FIG. 5B, the carrier density is relatively flat between a position in the horizontal direction of −1.5 µm and a position in the horizontal direction of 1.5 µm. Further, it is possible to confirm the spread of carrier density between a position in the horizontal direction of 2 μm and a position in the horizontal direction of 4 μm and between a position in the horizontal direction of −2 μm and a position in the horizontal direction of −4 μm. Thus, the overlap integral increases in the primary mode and the secondary mode in which the lightwave is spread to the outer side of the waveguide (FIGS. 6A and 6B). Thus, induced emission probabilities of the primary mode and the secondary mode are about 0.87 times and 0.93 times, respectively, of that of the fundamental mode, and differences among the modes are small as shown in FIG. 6B. As the width Wie decreases, a sharpness of the distribution width of the carrier density increases in a narrow range inside the waveguide. When the width Wie becomes 1.8 μm or smaller, the induced emission probabilities of both the primary and secondary modes are 0.7 times or lower of that of the fundamental mode.

From the above result, it is possible to find out the following effects <1> to <4> of the first embodiment.

<1> As shown in FIG. 5B, the width Wie is made narrower than the width Ww, the carrier density is sharpened within a range of the width Ww, and the carrier density in the right and left end portions of the wide portion WP in which the light intensity in the fundamental mode is small and the clamping action of the carrier density is weak is made small. Accordingly, it is possible to weaken the self-focusing action in a case in which the decrease in carrier density caused by the hole burning due to the increase of the light intensity occurs in the central portion of the wide portion WP. Thus, the generation of the positive feedback between the self-focusing and the weakening of the clamping action of the carrier density which is the problem in the structure of the examination example can be made less likely to occur.

<2> Due to the structure in which a current path is narrow in an upstream portion and spreads toward a lower portion of the p-type clad layer PCLD, an action of increasing the current toward the center of the waveguide with the short current path operates when the carrier consumption rate at the central portion of the waveguide increases in accordance with the intensity of the oscillated light in the fundamental mode, so that the hole burning is less likely to occur.

<3> The positive feedback starts to be generated between the hole burning at the central portion of the waveguide and the weakening of the carrier clamping action at the right and left end portions of the waveguide along with the increase of the light output. In this stage, an induced emission rate in the primary mode or the secondary mode is suppressed in advance to be 0.7 times or smaller of that of the fundamental mode. Thus, a light output value at which a surge of the carrier consumption rate starts to occur due to the induced emission in the primary mode or the secondary mode can be made higher.

<4> Since the width Wie of the opening portion OA of the insulating layer IL is made narrow in the wide portion WP and the tapered portion TP, it is possible to adjust the electrical resistance per unit length in the longitudinal direction (Y direction) of the resonator. To be specific, by increasing each electrical resistance of the wide portion WP and the tapered portion TP, it is possible to decrease a resistance difference between the wide portion WP and the narrow portion NP and between the tapered portion TP and the narrow portion NP. Accordingly, it is possible to suppress a tendency that the amount of carriers to be injected into the wide portion WP and the tapered portion TP in which the carrier clamping action is weak is biased.

The above-described effects <1> to <4> are synergistically exerted, and thus, it is possible to suppress the increase in carrier density at both sides (right and left in FIG. 4) of the wide portion WP and the tapered portion TP. Accordingly, it is possible to suppress the flexure in the high-current area of the current-light output characteristics, that is, the generation of the super luminescence which has been described in the paragraphs of "Examined Item". Consequently, it is possible to obtain a laser element that does not cause the flexure until a higher light output.

Further, the first embodiment has the following characteristic in addition to the above-described effects <1> to <4>.

<5> The length Lw of the wide portion WP shown in FIG. 4 is, for example, about 40 μm. This value of the length Lw is set to be, for example, $0.25 \times \lambda/(\text{Neff0}-\text{Neff2})$. Here, Neff0 is an effective refractive index of the fundamental mode in the wide portion WP, and Neff2 is an effective refractive index of the secondary mode in the wide portion WP. It is possible to suppress a reflectance loss of the resonator by setting the length Lw in this manner.

Namely, a lightwave in which the fundamental mode (zero-order) and the secondary mode which are even modes among the allowable three modes are mixed at a certain intensity ratio (the zero-order intensity is overwhelmingly large) is propagated in the wide portion WP. At this time, a beat is generated due to a difference between propagation constants of the fundamental mode (zero-order) and the secondary mode, and a value of the beat (beat length) is $\lambda/(\text{Neff0}-\text{Neff2})$. In a straight taper type (trapezoidal type) in which a change in width of the tapered portion TP is rectilinear, an end of the tapered portion TP on a wide side is substantially a middle point at which the value of the beat decreases from a node (a central intensity peak is maximum) toward an antinode (a central intensity peak is minimum).

In a case in which the beat is reflected by the cleavage surface and the cleavage surface is the antinode of the beat, when the reflected beat returns to the end of the tapered portion TP on the wide side again, it is exactly at the middle point from the antinode toward the node. Thus, the lightwave is smoothly connected, and the reflectance loss of the resonator becomes minimum. Such a condition is formulated as follows: $(0.25+N) \times \lambda/(\text{Neff0}-\text{Neff2})$.

In the above-described formula, N is an integer value of 0 or more, and it is possible to suppress the generation of the super luminescence by shortening the length Lw of the wide portion WP which includes a part with the weak carrier clamping action. Thus, it is preferable to use the condition of $0.25 \times \lambda/(\text{Neff0}-\text{Neff2})$ which corresponds to the case of N=0. In addition, it is possible to suppress an increase in area of the waveguide, that is, an increase in oscillation threshold by employing N=0. However, an optimal value of the length Lw does not necessarily coincide with $0.25 \times \lambda/(\text{Neff0}-\text{Neff2})$ constantly, and is varied depending on the effective refractive index difference. An or the width Ww of the waveguide in the horizontal direction, a value of the length Lt of the tapered portion TP and the like. Thus, it is preferable to set the length Lw to be 0.18 times to 0.35 times of $\lambda/(\text{Neff0}-\text{Neff2})$.

As described above, the semiconductor device (laser element) of the first embodiment has the above-described characteristics <1> to <5>. According to the examination by the inventors of the present invention, for example, the current-light output characteristics in which flexure is not caused until a light output of 400 mW or higher have been confirmed. In addition, it is possible to set a peak value of the light intensity density of the fundamental mode in the cleavage surface to be about 0.45 times. Specifically, it is possible to set the peak value of the wide portion WP having the width Ww=4.0 μm to be about 0.45 times of that of the narrow portion having the width of 1.3 µm. Accordingly, it is possible to confirm the stable operation at the high light output of at least 300 mW or higher.

Incidentally, the width (Wie) of the opening portion of the insulating layer IL above the wide portion WP and the tapered portion TP is set to, for example, about 1.6 µm in the first embodiment, but it may be set to be narrower (for example, 0.8 µm). In this case, the carrier injection density is more concentrated on the narrow portion NP, and it is possible to maximally bring out the above-described effects <1> to <3> in a range allowed with the balance in electrical resistance of the resonator in the longitudinal direction described in the above-described effect <4>. In this manner, the width (Wie) of the opening portion of the insulating layer IL above the wide portion WP and the tapered portion TP is not necessarily limited to a specific value, and can be appropriately adjusted within a range smaller than the width Ww of the wide portion WP while considering the balance in electrical resistance and the balance in gain described above.

Hereinafter, the configuration of the semiconductor laser of the first embodiment will be described in more details (see FIGS. 1 to 4).

As described above, the n-type clad layer NCLD is disposed on the n-type substrate NS.

For example, a substrate (n-type GaN substrate) made of gallium nitride (GaN) into which an n-type impurity is introduced is used as the n-type substrate NS. Further, the n-type substrate NS has a surface (0001) inclined in a direction <1-100> as the main surface. In other words, the n-type substrate NS has an off-angle from the surface (0001) in the direction <1-100>. An angle of inclination (off-angle) θ is, for example, about 0.1° to 3°, and is preferably about 0.2° to 1°.

For example, an aluminum gallium nitride layer (n-type AlGaN layer) into which an n-type impurity is introduced is used as the n-type clad layer NCLD. A thickness of the n-type clad layer (n-type AlGaN layer) NCLD is, for example, about 2 µm.

In addition, the n-type light guide layer NLG is disposed on the n-type clad layer NCLD.

For example, a gallium nitride layer (n-type GaN layer) into which an n-type impurity is introduced is used as the n-type light guide layer NLG. A thickness of the n-type light guide layer (n-type GaN layer) NLG is, for example, about 0.1 µm.

Incidentally, silicon (Si), for example, is used as the above-described n-type impurity of the n-type substrate NS, the n-type clad layer NCLD and the n-type light guide layer NLG.

In addition, the active layer MQW is disposed on the n-type light guide layer NLG.

The active layer MQW is formed of, for example, a laminate in which a quantum well layer made of an indium gallium nitride layer (InGaN layer) and a barrier layer made of an indium gallium nitride layer (InGaN layer) are alternately laminated. The structure of such a laminate is referred to as a multiple quantum well structure. Further, an indium composition of the indium gallium nitride layer (InGaN well layer) constituting the quantum well layer and an indium composition of the indium gallium nitride layer (InGaN barrier layer) constituting the barrier layer are different from each other. Each indium composition ratio and each layer thickness of these layers are adjusted in accordance with a desired oscillation wavelength. For example, it is possible to use an undoped $In_{0.1}Ga_{0.9}N$ well layer (a thickness of 3 nm) and an undoped $In_{0.1}Ga_{0.99}N$ barrier layer (a thickness of 13 nm). A region of the active layer MQW overlapping the current confinement region CC forms the waveguide.

In addition, the p-type light guide layer PLG is disposed on the active layer MQW.

A gallium nitride layer (p-type GaN layer) into which a p-type impurity is introduced is used as the p-type light guide layer PLG. A thickness of the p-type light guide layer (p-type GaN layer) PLG is, for example, about 0.1 µm.

The current block layer BL is partially disposed on the p-type light guide layer PLG.

An aluminum nitride layer (AlN layer) is used as the current block layer BL. Alternatively, an aluminum gallium nitride layer (AlGaN layer) may be used as the current block layer BL. A thickness of the current block layer (AlN layer) BL is, for example, about 0.1 µm.

As described above, the current block layer BL has the shape whose longitudinal direction is the Y direction, and the two current block layers BL are disposed at the predetermined interval. The current confinement region CC is formed between the current block layers BL, and the current confinement region CC extends in the Y direction. As described above, the wide portion WP, the tapered portion TP, the narrow portion NP, the tapered portion TP and the wide portion WP are disposed in this order between the HR side (lower side in FIG. 4) and the AR side (upper side in FIG. 4). Further, the relation that the width Wn<the width Ww is established. The Y direction shown in FIG. 4 is the light-emitting direction and serves as the direction <1-100>.

The p-type clad layer PCLD is disposed on the current block layer BL and the p-type light guide layer PLG.

For example, a superlattice layer in which an aluminum gallium nitride layer (p-type AlGaN layer) into which a p-type impurity is introduced and a gallium nitride layer (p-type GaN layer) into which a p-type impurity is introduced are alternately laminated is used as the p-type clad layer PCLD. A thickness of the superlattice layer is, for example, about 0.5 µm.

The p-type contact layer PCNT is disposed on the p-type clad layer PCLD.

A gallium nitride layer (p-type GaN layer) into which a p-type impurity is introduced is used as the p-type contact layer PCNT. A thickness of the p-type GaN layer is, for example, about 0.02 µm.

For example, magnesium (Mg) is used as the above-described p-type impurity of the p-type light guide layer PLG, the p-type clad layer PCLD and the p-type contact layer PCNT.

Incidentally, an aluminum gallium nitride layer (p-type AlGaN layer) into which a p-type impurity is introduced may be provided as a carrier barrier layer between the active layer MQW and the p-type light guide layer PLG.

Here, the active layer MQW has a smaller bandgap than the n-type clad layer NCLD. In addition, the active layer MQW has a smaller bandgap than the p-type clad layer PCLD. To be more specific, herein, a laminated portion of the p-type nitride semiconductor is provided on the active layer MQW, and the active layer MQW has a smaller bandgap than the respective layers constituting the laminated portion of the p-type nitride semiconductor. In addition, a laminated portion of the n-type nitride semiconductor is provided below the active layer MQW, and the active layer MQW has a smaller bandgap than the respective layers constituting the laminated portion of the n-type nitride semiconductor. In addition, each of the laminated portion of the n-type nitride semiconductor and the laminated portion of the p-type nitride semiconductor has a lower refractive index than the active layer MQW.

Further, the current block layer BL has a larger bandgap than any of the active layer MQW, the n-type clad layer NCLD and the p-type clad layer PCLD. To be more specific, the current block layer BL has a larger bandgap than any layer of the active layer MQW, the laminated portion of the p-type nitride semiconductor provided on the active layer MQW and the laminated portion of the n-type nitride semiconductor provided below active layer MQW.

The insulating layer IL is disposed on the p-type contact layer PCNT. The insulating layer IL has the opening portion OA above the current confinement region CC.

The p-side electrode PEL is disposed on the insulating layer IL and the p-type contact layer PCNT. Namely, the p-type contact layer PCNT and the p-side electrode PEL are in contact with each other via the opening portion OA of the insulating layer (insulating film) IL. For example, a laminate which is formed of an ohmic contact portion made of palladium (Pd)/platinum (Pt) and a cover structural portion made of titanium (Ti)/platinum (Pt)/gold (Au) is used as the p-side electrode PEL.

The n-side electrode NEL is disposed on the back surface of the n-type substrate NS. For example, a laminated film made of titanium (Ti) and gold (Au) is used as the n-side electrode NEL.

For example, a planar shape of the semiconductor laser of the first embodiment is a rectangular shape. Specifically, a long side thereof is 600 μm to 1000 μm and a short side thereof is 150 μm to 200 μm.

[Description of Manufacturing Method]

Subsequently, a manufacturing method of the semiconductor laser of the first embodiment will be described and the configuration of the semiconductor laser will be more clarified with reference to FIGS. 7 to 21. FIGS. 7 to 21 are cross-sectional views and plan views showing a manufacturing process of the semiconductor laser of the first embodiment.

Figure 7:
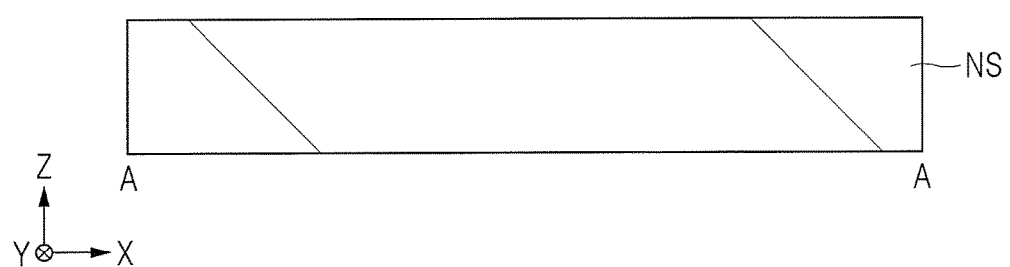
FIG. 7 is a cross-sectional view showing a manufacturing process of the semiconductor laser according to the first embodiment.

As shown in FIG. 7, the substrate which is made of, for example, gallium nitride (GaN) in which the n-type impurity is introduced and has an off-angle from the surface (0001) in the direction <1-100> is prepared as the n-type substrate NS (see FIGS. 5A and 5B). The off-angle θ is, for example, about 0.1° to 3°, and is preferably about 0.2° to 1°. Incidentally, it is possible to use a free-standing substrate as the n-type substrate NS. The free-standing substrate is a substrate obtained by growing gallium nitride on a support substrate such as a silicon carbide substrate or a sapphire substrate.

Figure 8:
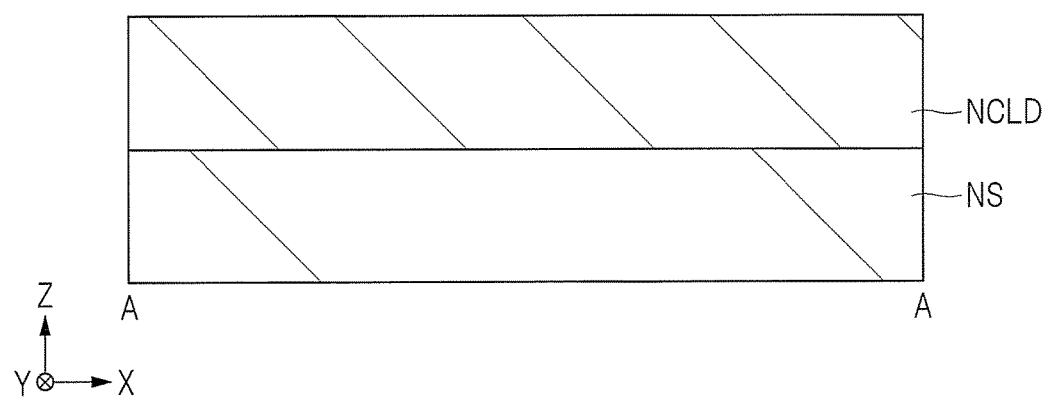
FIG. 8 is a cross-sectional view showing the manufacturing process of the semiconductor laser according to the first embodiment.

Subsequently, the n-type AlGaN layer is formed as the n-type clad layer NCLD on the n-type substrate NS as shown in FIG. 8. The n-type clad layer NCLD (n-type AlGaN layer) is crystal-grown through use of, for example, a metal organic vapor phase epitaxy (MOVPE) device while introducing a carrier gas and a material gas into the device. Hydrogen, nitrogen or a mixed gas of hydrogen and nitrogen is used as the carrier gas. A gas containing constituent elements of the nitride semiconductor is used as the material gas. For example, TMAl (trimethyl aluminum), TMGa (trimethyl gallium) and NH$_3$ (ammonia) are used as raw materials of Al, Ga and N, respectively, and SiH$_4$ (silane) is used as a raw material of the n-type impurity at the time of deposition of the n-type clad layer NCLD (n-type AlGaN layer). The n-type substrate NS is set in the MOVPE device, temperature of the substrate is increased while supplying NH$_3$, and the n-type clad layer NCLD (n-type AlGaN layer) having a thickness of about 2 μm is crystal-grown while introducing the material gas into the device together with the carrier gas after reaching a growth temperature. The growth temperature is, for example, about 1000° C. to 1100° C.

Figure 9:
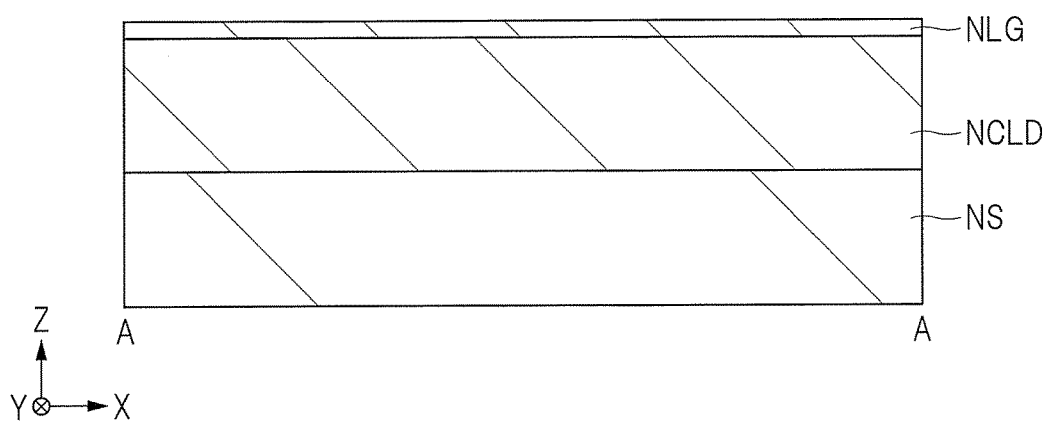
FIG. 9 is a cross-sectional view showing the manufacturing process of the semiconductor laser according to the first embodiment.

Subsequently, the n-type GaN layer having a thickness of about 0.1 μm is formed as the n-type light guide layer NLG on the n-type clad layer NCLD (n-type AlGaN layer) as shown in FIG. 9. For example, the n-type light guide layer NLG (n-type GaN layer) is crystal-grown through use of the MOVPE device while introducing a carrier gas and a material gas into the device. As the material gas, TMGa (trimethyl gallium) and NH$_3$ (ammonia) are used as raw materials of Ga and N, respectively, and SiH$_4$ (silane) is used as a raw material of the n-type impurity. The growth temperature is, for example, about 1000° C. to 1100° C.

Figure 10:
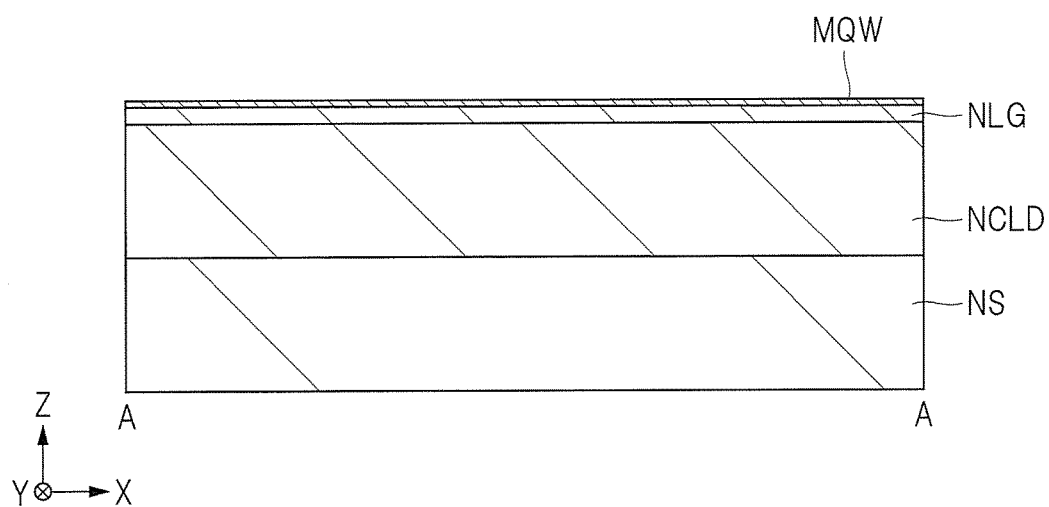
FIG. 10 is a cross-sectional view showing the manufacturing process of the semiconductor laser according to the first embodiment.

Subsequently, the active layer MQW (multiple quantum well structural body in which the InGaN well layer and the InGaN barrier layer having different indium compositions are alternately laminated) is crystal-grown on the n-type light guide layer NLG by switching the material gas as shown in FIG. 10. At the time of deposition of the active layer MQW (the InGaN well layer and the InGaN barrier layer), TMIn (trimethyl indium), TMGa (trimethyl gallium) and NH$_3$ (ammonia) are used as raw materials of In, Ga and N, respectively. The InGaN well layer and the InGaN barrier layer having the different indium compositions can be alternately laminated by switching a flow rate of TMIn (trimethyl indium) which is the raw material of In. The growth temperature is, for example, about 800° C. to 900° C. A total film thickness of the active layer MQW is, for example, about 0.035 μm.

Figure 11:
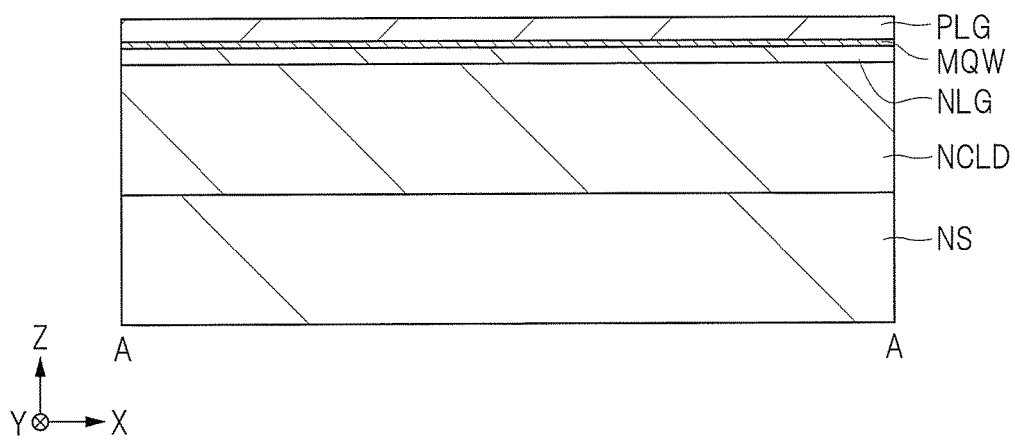
FIG. 11 is a cross-sectional view showing the manufacturing process of the semiconductor laser according to the first embodiment.

Subsequently, the p-type light guide layer PLG (p-type GaN layer) is crystal-grown on the active layer MQW by switching the material gas as shown in FIG. 11. At the time of deposition of the p-type light guide layer PLG (p-type GaN layer), TMGa (trimethyl gallium) and NH$_3$ (ammonia) are used as raw materials of Ga and N, respectively, and Cp$_2$Mg (bis(cyclopentadienyl)magnesium, C$_{10}$H$_{10}$Mg) is used as a raw material of the p-type impurity. The growth temperature is, for example, about 1000° C. to 1100° C.

Figure 12:
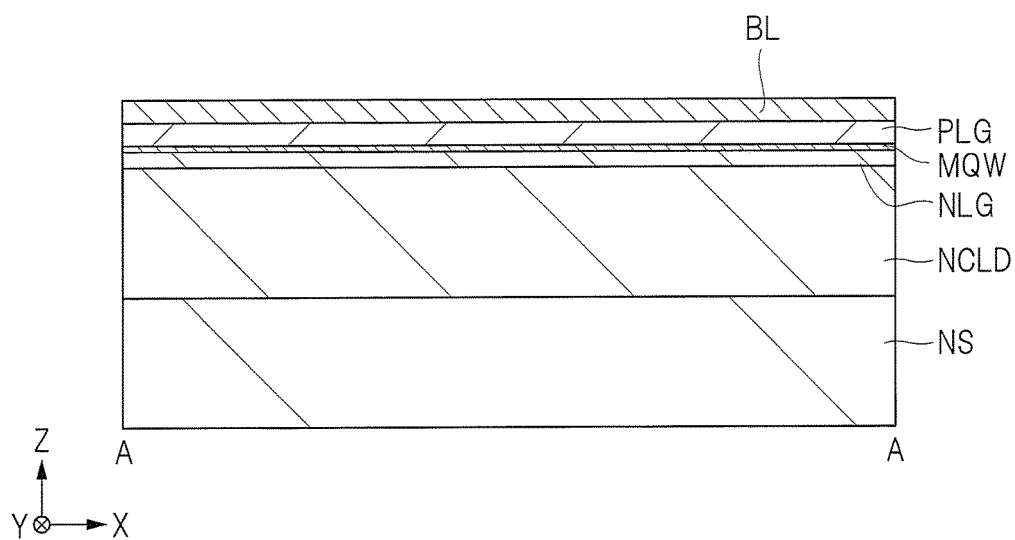
FIG. 12 is a cross-sectional view showing the manufacturing process of the semiconductor laser according to the first embodiment.

Subsequently, the current block layer BL (AlN layer) is formed as shown in FIGS. 12 to 15. First, the temperature inside the device is lowered, and the current block layer BL (AlN layer) having a thickness of about 0.1 μm is grown at a relatively low temperature as shown in FIG. 12. At the time of deposition of the current block layer BL (AlN layer), TMAl (trimethyl aluminum) and NH$_3$ (ammonia) are used as raw materials of Al and N. The growth temperature is, for example, about 200° C. to 600° C. In this manner, it is possible to form the current block layer BL (AlN layer) in an amorphous state by performing the deposition at the relatively low temperature (for example, at a temperature lower than that of the n-type clad layer NCLD or the active layer MQW to be described later).

Figure 13:
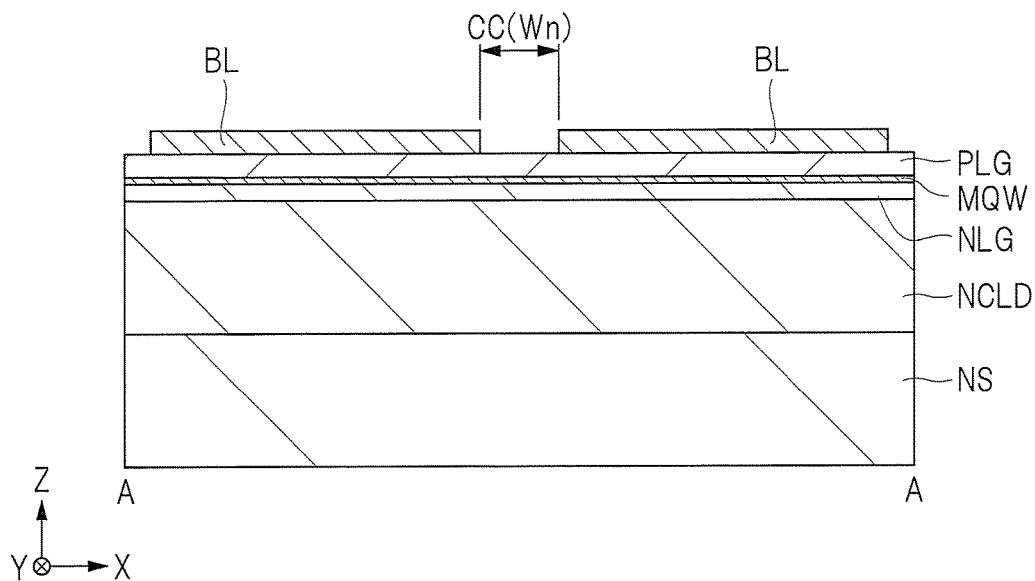
FIG. 13 is a cross-sectional view showing the manufacturing process of the semiconductor laser according to the first embodiment.
Figure 14:
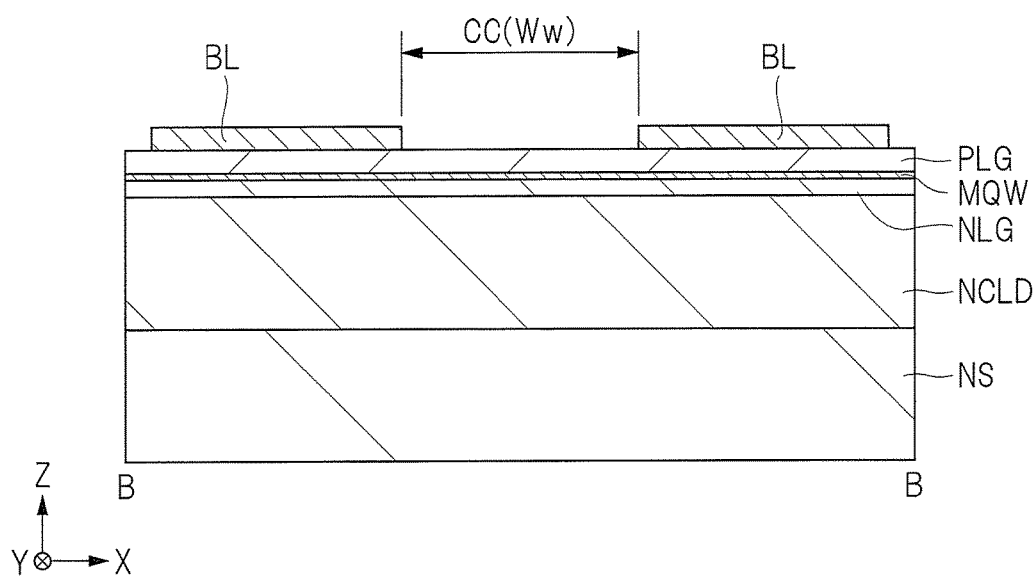
FIG. 14 is a cross-sectional view showing the manufacturing process of the semiconductor laser according to the first embodiment.
Figure 15:
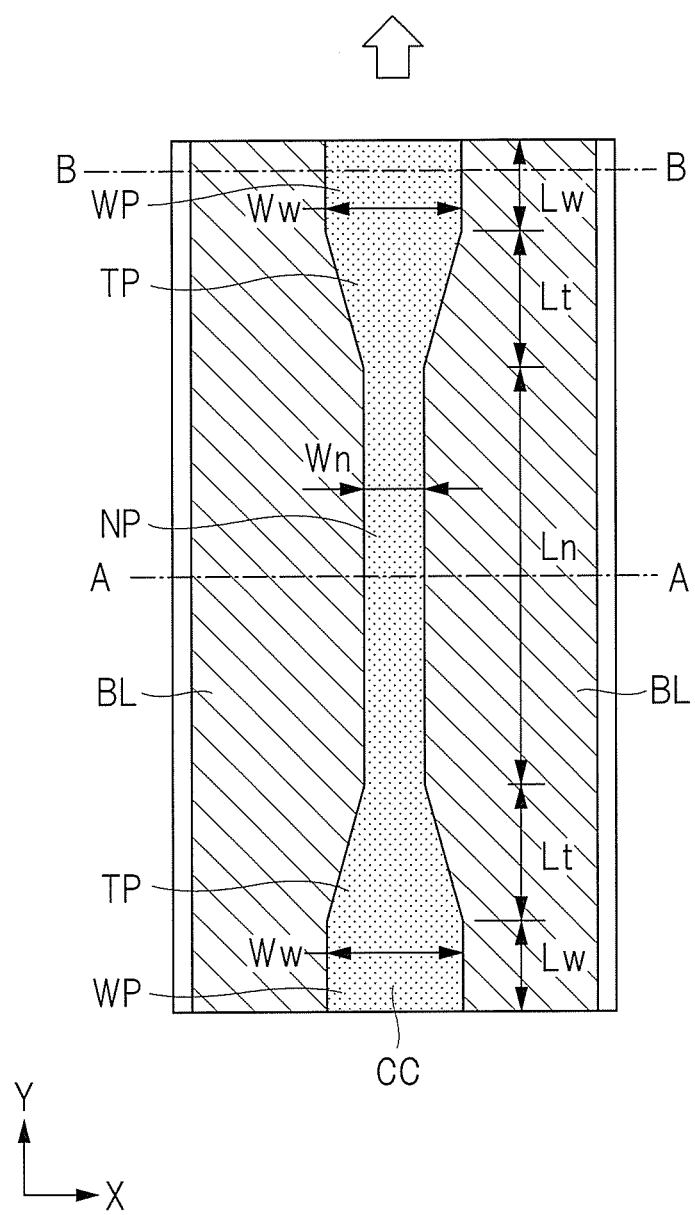
FIG. 15 is a cross-sectional view showing the manufacturing process of the semiconductor laser according to the first embodiment.

Subsequently, the current block layer BL (AlN layer) is patterned as shown in FIGS. 13 to 15. For example, a hard mask (not shown) is formed on the current block layer BL (AlN layer). For example, a silicon oxide film is formed on the current block layer BL (AlN layer) through use of a chemical vapor deposition (CVD) method or the like. Subsequently, a photoresist film is applied onto the silicon oxide film, and then, the photoresist film is left only in a region in which the current block layer BL (AlN layer) is to be left through use of a photolithography technique. Subsequently, the hard mask (silicon oxide film) is etched with using the photoresist film as a mask. Subsequently, the photoresist film is removed by asking or the like. Then, the current block layer BL (AlN layer) is etched with using the hard mask (silicon oxide film) as a mask. Any of a dry etching method and a wet etching method may be used as the etching method. Since the current block layer BL (AlN layer) is deposited at the relatively low temperature to form the current block layer BL (AlN layer) in the amorphous state as described above, it is possible to easily perform the etching even in the case of using the wet etching method. Thereafter, the hard mask (silicon oxide film) is removed. Incidentally, the current block layer BL (AlN layer) in the amorphous state is crystallized by a thermal load applied in the subsequent process.

The two current block layers BL are formed on the p-type light guide layer PLG (p-type GaN layer) through the above-described etching. The current confinement region CC is formed between the current block layers BL. The current confinement region CC extends to end portions of the semiconductor laser formation region (chip region). In other words, the current confinement region CC extends from the end serving as the cleavage surface on the HR side (lower side in FIG. 15) to the end serving as the cleavage surface on the AR side (upper side in FIG. 15). Further, the current confinement region CC includes the wide portion WP, the tapered portion TP, the narrow portion NP, the tapered portion TP and the wide portion WP which are disposed in this order. The relation that the width Wn<the width Ww is established.

Figure 16:
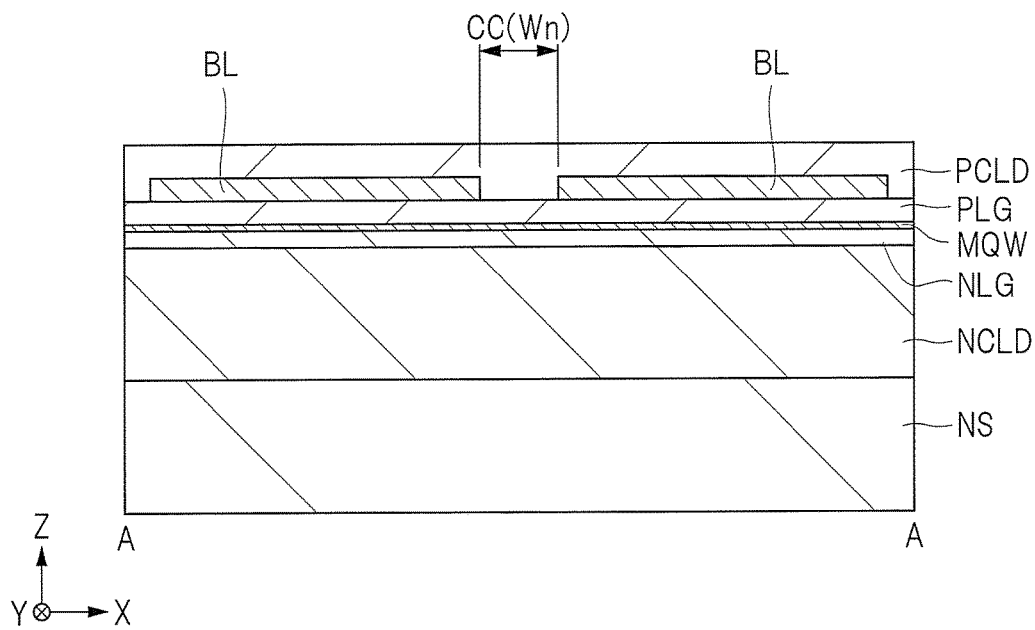
FIG. 16 is a cross-sectional view showing the manufacturing process of the semiconductor laser according to the first embodiment.

Subsequently, the material gas is switched, and the p-type clad layer PCLD having a thickness of about 0.5 µm is crystal-grown on the current block layer BL and the p-type light guide layer PLG as shown in FIG. 16. For example, a superlattice layer in which the aluminum gallium nitride layer (p-type AlGaN layer) into which the p-type impurity is introduced and the gallium nitride layer (p-type GaN layer) into which the p-type impurity is introduced are alternately laminated is formed on the p-type light guide layer PLG (p-type GaN layer) as the p-type clad layer PCLD. At the time of deposition of the p-type AlGaN layer, TMAl (trimethyl aluminum), TMGa (trimethyl gallium) and $NH_3$ (ammonia) are used as raw materials of Al, Ga and N, respectively, and $Cp_2Mg$ (bis(cyclopentadienyl)magnesium) is used as a raw material of the p-type impurity. At the time of deposition of the p-type GaN layer, the supply of TMAl (trimethyl aluminum) is stopped among the above-described material gases. In this manner, by repeating the supply and stop of TMAl (trimethyl aluminum) which is the raw material of Al among the material gases, it is possible to form the p-type clad layer PCLD formed of the superlattice layer in which the p-type AlGaN layer and the p-type GaN layer are alternately laminated. The growth temperature is, for example, about 1000° C. to 1100° C.

Figure 17:
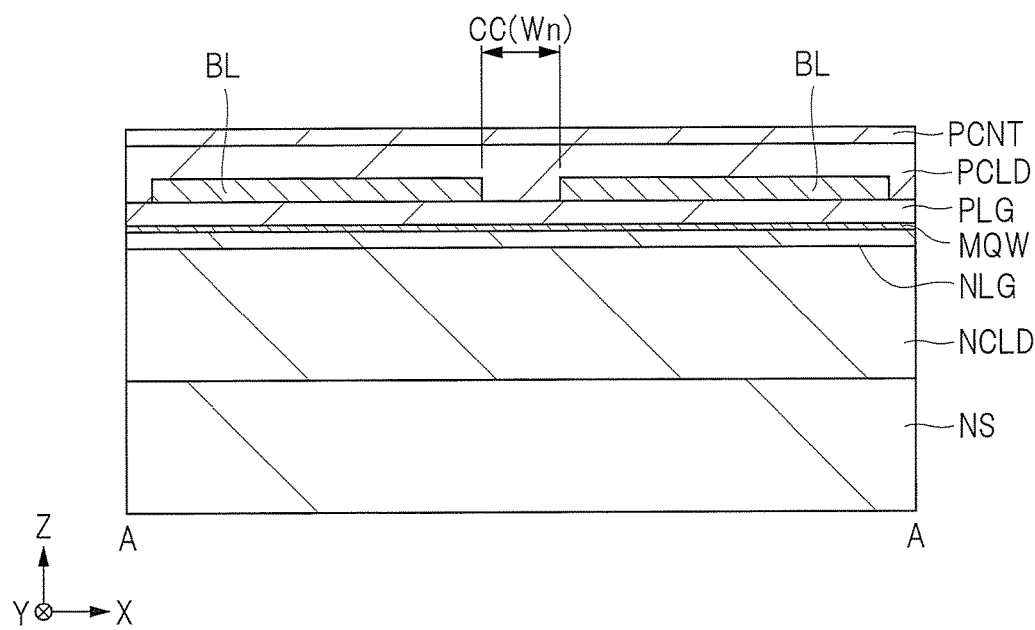
FIG. 17 is a cross-sectional view showing the manufacturing process of the semiconductor laser according to the first embodiment.
Figure 18:
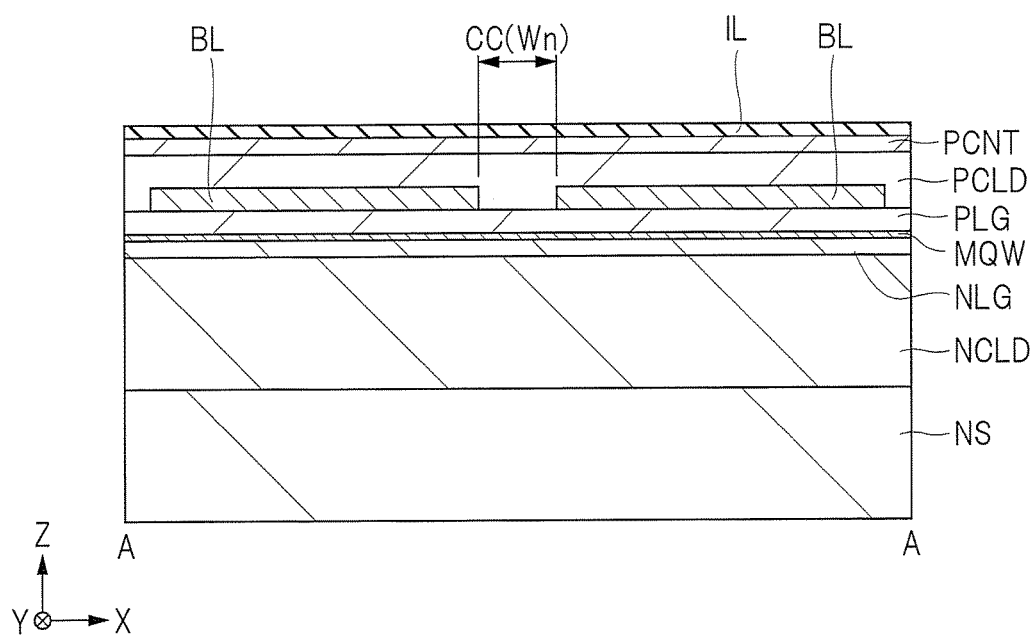
FIG. 18 is a cross-sectional view showing the manufacturing process of the semiconductor laser according to the first embodiment.
Figure 19:
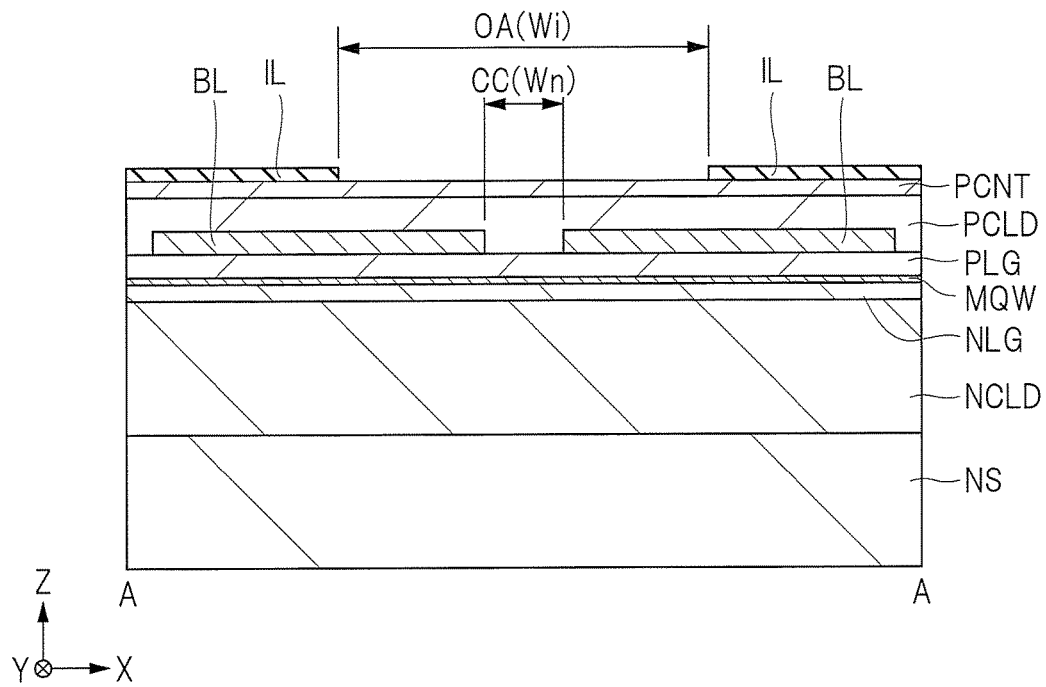
FIG. 19 is a cross-sectional view showing the manufacturing process of the semiconductor laser according to the first embodiment.
Figure 20:
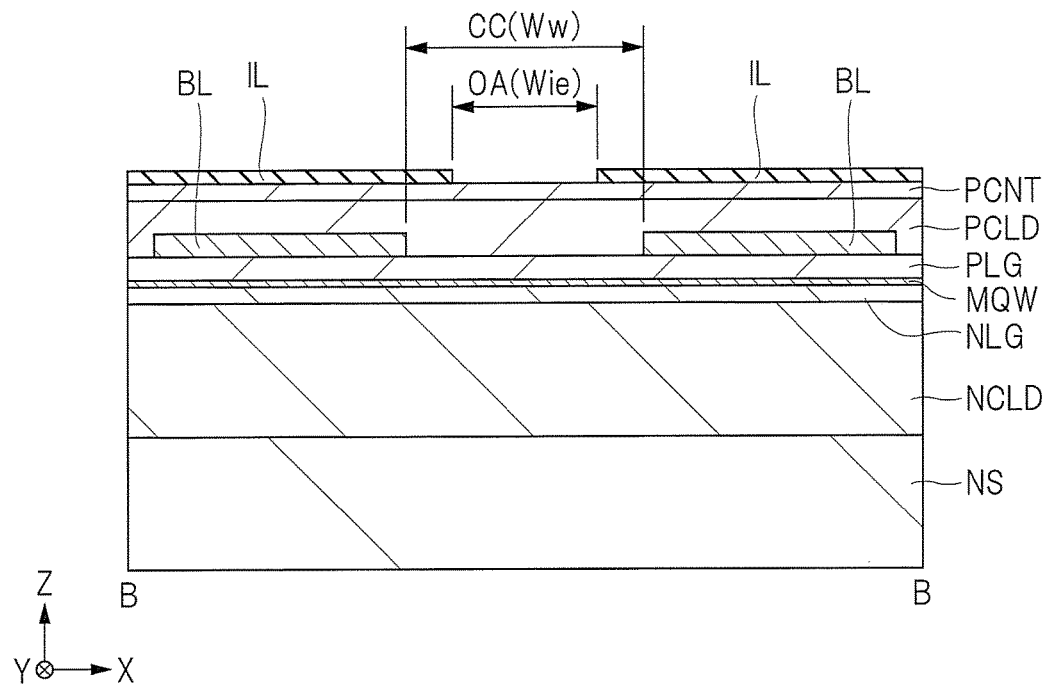
FIG. 20 is a cross-sectional view showing the manufacturing process of the semiconductor laser according to the first embodiment.

Subsequently, the material gas is switched, and the p-type contact layer PCNT (p-type GaN layer) having a thickness of about 0.02 µm is crystal-grown on the p-type clad layer PCLD as shown in FIG. 17. At the time of deposition of the p-type contact layer PCNT (p-type GaN layer), TMGa (trimethyl gallium) and $NH_3$ (ammonia) are used as raw materials of Ga and N, respectively, and $Cp_2Mg$ (bis(cyclopentadienyl)magnesium) is used as a raw material of the p-type impurity. The growth temperature is, for example, about 1000° C. to 1100° C.

Subsequently, for example, a silicon oxide film is formed as the insulating layer IL on the p-type contact layer PCNT through use of a CVD method or the like as shown in FIGS. 18 to 21. Subsequently, the insulating layer IL on the current confinement region is removed, and the opening portion OA is formed. For example, the insulating layer IL is etched with using a photoresist film (not shown) as a mask, and the photoresist film is then removed by asking or the like.

Accordingly, the insulating layer IL above the current confinement region CC is removed, and the opening portion OA is formed. The p-type contact layer PCNT is exposed on a bottom surface of the opening portion OA.

Figure 21:
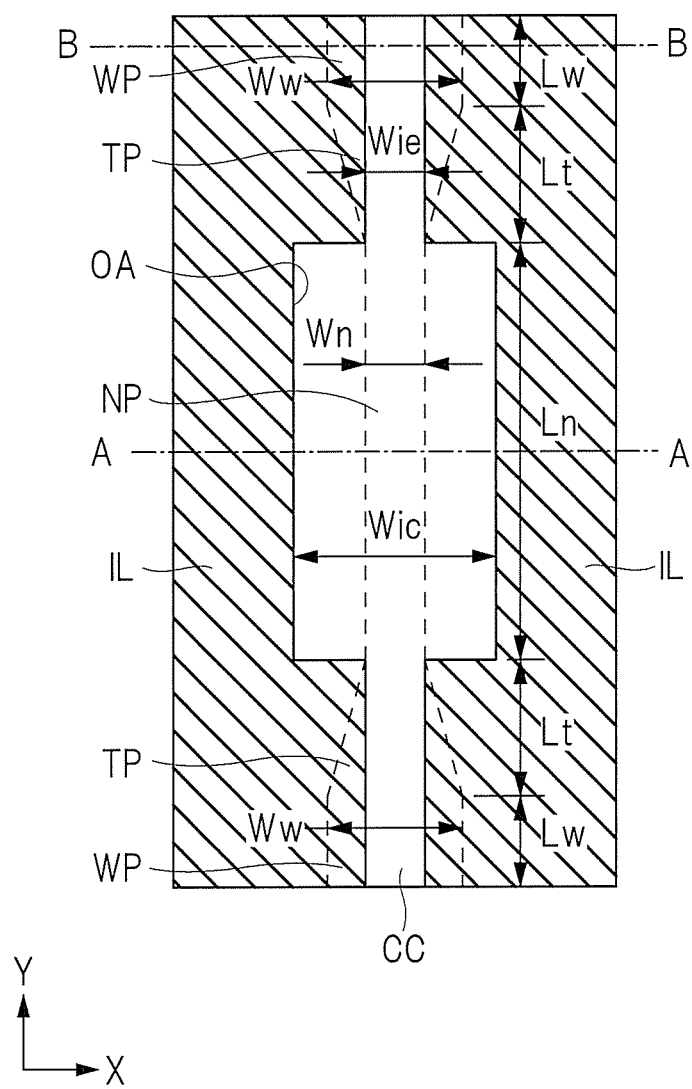
FIG. 21 is a plan view showing the manufacturing process of the semiconductor laser according to the first embodiment.

As described above, the opening portion OA includes a wide portion (the central width Wic) which is positioned at the substantially central portion in the Y direction, a narrow portion (the end width Wie) which is positioned on one side of the substantially central portion in the Y direction corresponding to the HR side (the lower side in FIG. 21), and a narrow portion (the end width Wie) which is positioned on the other side of the substantially central portion in the Y direction corresponding to the AR side (the upper side in FIG. 21). A relation that the central width Wic>the end width Wie is established. In addition, a relation that the width Ww of the wide portion WP>the end width Wie is established. In this manner, the width (Wie) of the opening portion OA of the insulating layer IL is made narrow, and it is thus possible to cover both ends (right and left ends in the X direction in FIG. 21) of the wide portion WP and the tapered portion TP with the insulating layer IL.

Thereafter, the p-side electrode is formed on the p-type contact layer PCNT and the insulating layer IL. For example, a palladium (Pd) film and a platinum (Pt) film are sequentially formed on the p-type contact layer PCNT and the insulating layer IL by an evaporation method or the like. Subsequently, if necessary, a laminated film including the palladium (Pd) film and the platinum (Pt) film is patterned (not shown), and then, these metals are alloyed through use of heat treatment, thereby obtaining ohmic contact with the semiconductor side. Further, a cover structural portion made of titanium (Ti)/platinum (Pt)/gold (Au) is formed. In this manner, the p-side electrode PEL is formed (see FIGS. 1 and 2).

Subsequently, the back surface of the n-type substrate NS is directed to an upper side and the back surface of the n-type substrate NS is polished, thereby slimming of the n-type substrate NS. For example, the n-type substrate NS is formed to have a thickness of about 100 µm. Subsequently, for example, a titanium (Ti) film and a gold (Au) film are sequentially formed on the back surface of the n-type substrate NS by an evaporation method or the like. Subsequently, these metals are alloyed through use of heat treatment, thereby forming the n-side electrode NEL (see FIGS. 1 and 2).

Thereafter, the n-type substrate NS including a plurality of chip regions is cut out for each chip region. First, a portion between the chip regions of the n-type substrate NS is cleaved. Namely, a portion between a certain chip region and the neighboring chip region is cleaved along a cleavage line. Accordingly, the cleavage surface (surface extending in the X direction) shown in FIG. 4 is formed. Subsequently, the anti-reflection film AR is formed on one of the cleavage surfaces, and the high-reflection film HR is formed on the other cleavage surface. A two-layer body including titanium oxide ($TiO_2$)/alumina ($Al_2O_3$) or the like with a reflectance, for example, of 10% is used as the anti-reflection film AR. The respective layers are formed by, for example, a sputtering method or the like. In addition, a multi-layer body including titanium oxide ($TiO_2$)/alumina ($Al_2O_3$) or the like with a reflectance of, for example, 95% is used as the high-reflection film HR. The respective layers are formed by, for example, a sputtering method or the like. Further, the n-type substrate NS is cut along a side extending in the Y direction of the chip region, and thus chip pieces are cut out.

It is possible to form the semiconductor laser of the first embodiment through the above-described processes.

Second Embodiment

Although the first embodiment employs the configuration in which the width (Wie) of the opening portion OA of the insulating layer IL is made narrow above the wide portion WP of the current confinement region CC and both ends (on the right and left in FIG. 4) of the wide portion WP are covered by the insulating layer IL, it is also possible to provide an inversion layer RL in the p-type clad layer PCLD and to cover both ends of the wide portion WP by the inversion layer RL. Also in this case, a sheet resistance increases due to the inversion layer RL and each carrier density in both ends of the wide portion WP can be decreased. Incidentally, the same parts as those in the first embodiment are denoted by the same reference characters, and the detailed description thereof will be omitted.

[Description of Structure]

Figure 22:
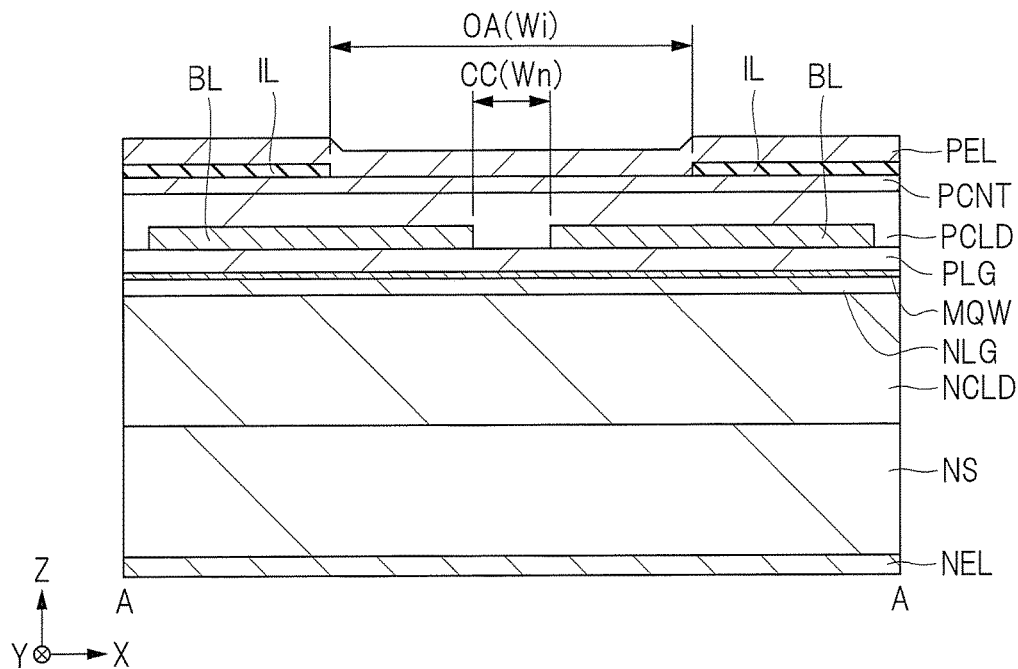
FIG. 22 is a cross-sectional view showing a configuration of a semiconductor laser according to the second embodiment.
Figure 23:
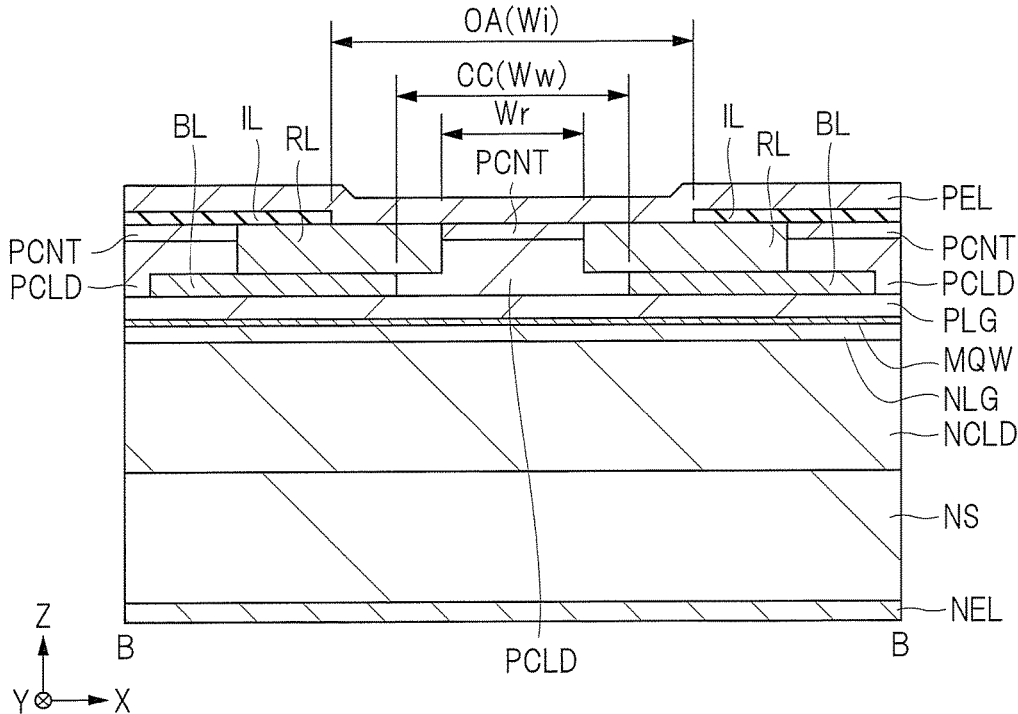
FIG. 23 is a cross-sectional view showing the configuration of the semiconductor laser according to the second embodiment.
Figure 24:
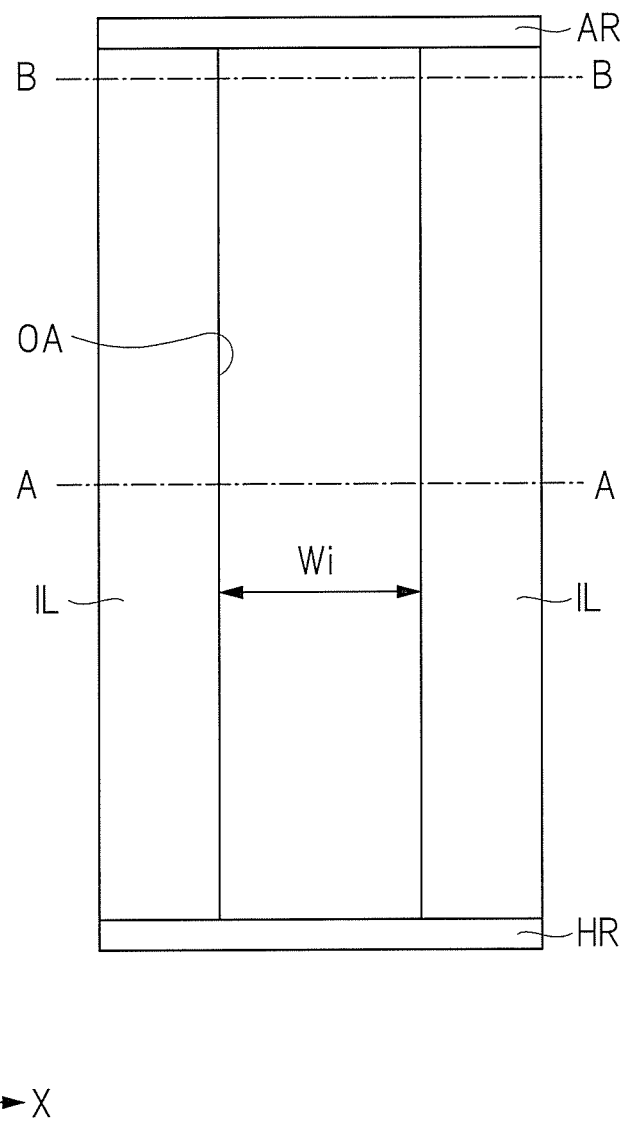
FIG. 24 is a plan view showing the configuration of the semiconductor laser according to the second embodiment.
Figure 25:
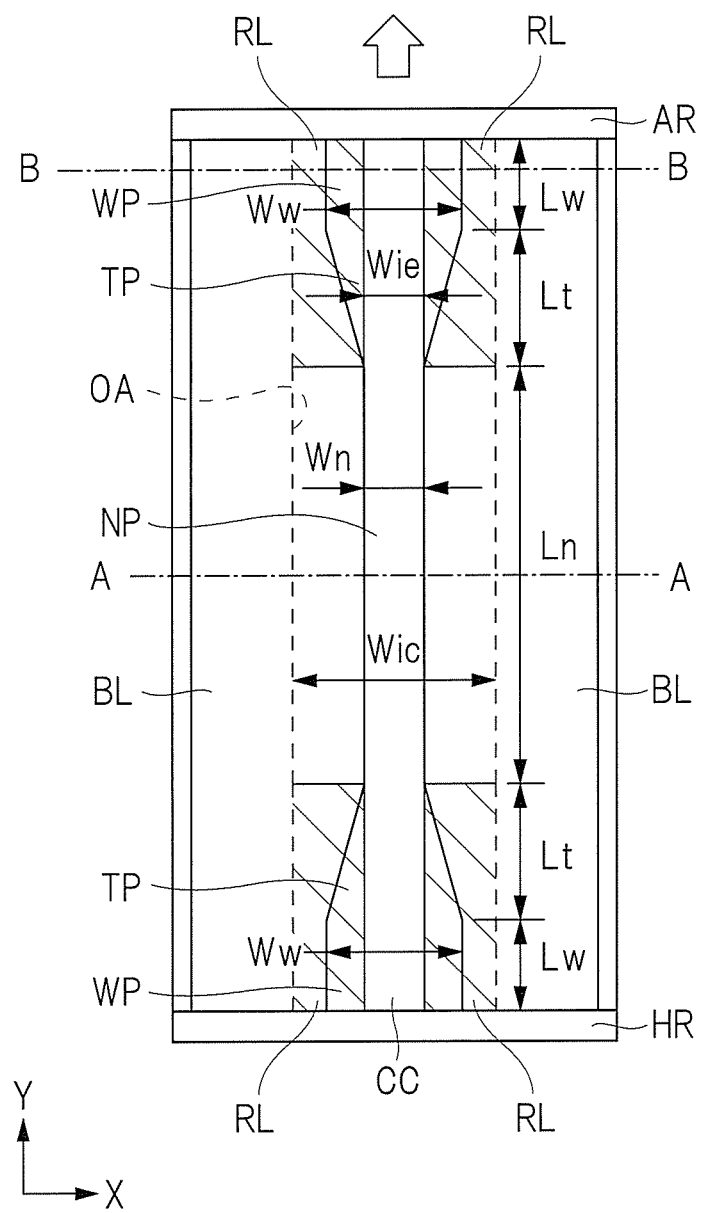
FIG. 25 is a plan view showing the configuration of the semiconductor laser according to the second embodiment.

FIGS. 22 to 25 are plan views and cross-sectional views showing a configuration of a semiconductor laser according to the second embodiment. FIGS. 22 and 23 are the cross-sectional views and FIGS. 24 and 25 are the plan views. The cross-sectional views of FIGS. 22 and 23 correspond to an A-A cross section and a B-B cross section of FIGS. 24 and 25.

As shown in FIGS. 22 to 25, the opening portion OA of the insulating layer IL is of a straight type in the semiconductor laser according to the second embodiment. Namely, a planar shape of the opening portion OA is a rectangular shape having a long side in the Y direction, and the width Wi of the opening portion OA in the X direction has almost the same value without change in the substantially central portion, the end on the HR side (the lower side in FIG. 24) and the end on the AR side (the upper side in FIG. 24) in the Y direction as shown in FIG. 24.

Further, the inversion layer RL is provided in the p-type clad layer PCLD. The inversion layer RL is an n-type semiconductor region (n-type nitride semiconductor region). For example, it is possible to form the inversion layer RL by injecting an n-type impurity (for example, Si) into the p-type clad layer PCLD.

The sheet resistance of the p-type clad layer PCLD increases due to the inversion layer RL, and the current is less likely to spread. Namely, when an impurity concentration of the p-type clad layer PCLD is increased in order to lower an electrical resistance of an element (laser element), the sheet resistance of the p-type clad layer PCLD decreases, so that the current is likely to spread. Thus, it is difficult to obtain the effect of sharpening the carrier density in the narrow portion NP. On the contrary, when the inversion layer RL is provided as in the second embodiment, it is possible to suppress the spread of current, and the carrier density can be sharpened in the narrow portion NP.

To be specific, the inversion layer RL is provided above both sides of the wide portion WP and the tapered portion TP as shown in FIGS. 23 and 25. For example, a pair of the inversion layers RL is disposed on one side of the current confinement region CC in the Y direction, that is, on the HR side (the lower side in FIG. 25) as shown in FIG. 25. A width (width Wie) between the inversion layers RL is smaller than the width Ww of the wide portion WP. In addition, a pair of the inversion layers RL is disposed on the other side of the current confinement region CC in the Y direction, that is, on the AR side (the upper side in FIG. 25). A width (width Wie) between the inversion layers RL is smaller than the width Ww of the wide portion WP. The width Wie is, for example, about 1.6 μm.

A bottom surface of the inversion layer RL, that is, a bottom surface of an injection region of the n-type impurity (for example, Si) is positioned at a depth of, for example, 0.25 μm from a surface of the p-type clad layer PCLD. The p-type clad layer PCLD remains at a part lower than the inversion layer RL in the wide portion WP of the current confinement region CC (FIG. 23). In this manner, at both ends of the wide portion WP, a thickness of the p-type clad layer PCLD is decreased to 0.25 μm which is the half of 0.5 μm.

In this manner, the sheet resistance of the p-type clad layer PCLD can be increased approximately twice at both ends of the wide portion WP. Accordingly, the carrier density can be sharpened at the wide portion WP, and it is possible to suppress the generation of the super luminescence in the wide portion WP.

According to the examination by the inventors of the present invention, for example, the current-light output characteristics in which flexure is not caused until a light output of 400 mW or higher have been confirmed. In addition, the stable operation at a high light output of at least 300 mW or higher can be confirmed. In addition, it is unnecessary to finely process the opening portion OA of the insulating layer IL, and it is possible to achieve the sharpening of carrier density distribution through use of the impurity injection. Accordingly, the current-light output characteristics in which flexure is not caused until a light output of 500 mW or higher have been confirmed.

[Description of Manufacturing Method]

Subsequently, a manufacturing method of the semiconductor laser according to the second embodiment will be described, and the configuration of the semiconductor laser will be more clarified with reference to FIGS. 26 to 30. FIGS. 26 to 30 are cross-sectional views and a plan view showing a manufacturing process of the semiconductor laser according to the second embodiment.

First, the n-type clad layer NCLD, the n-type light guide layer NLG, the active layer MQW, the p-type light guide layer PLG, the current block layer BL, the p-type clad layer PCLD and the p-type contact layer PCNT are formed on the n-type substrate NS (see FIG. 17) in the same manner as the first embodiment.

Figure 26:
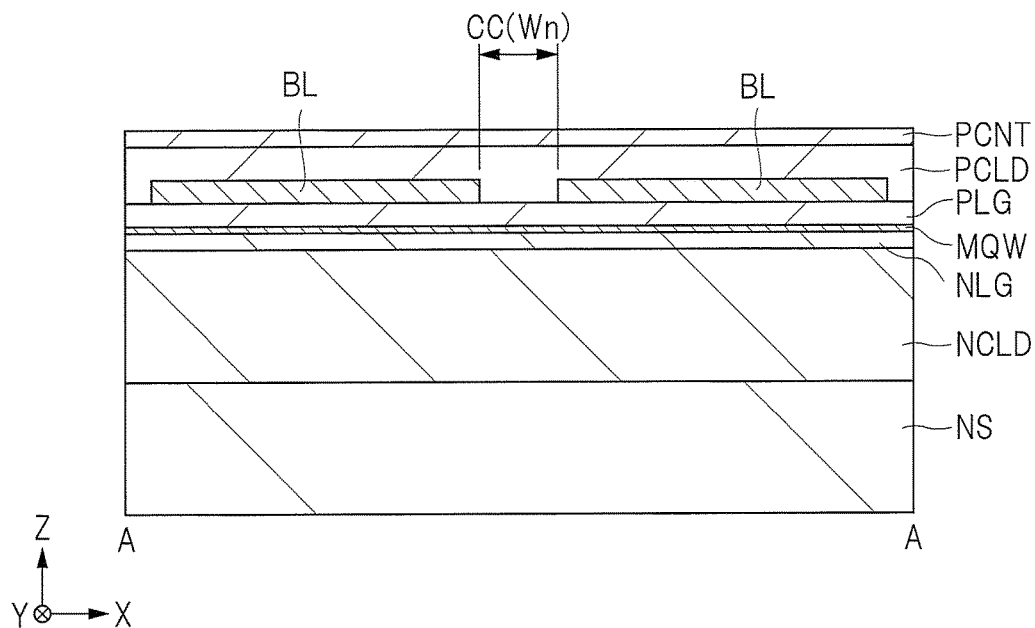
FIG. 26 is a cross-sectional view showing a manufacturing process of the semiconductor laser according to the second embodiment.
Figure 27:
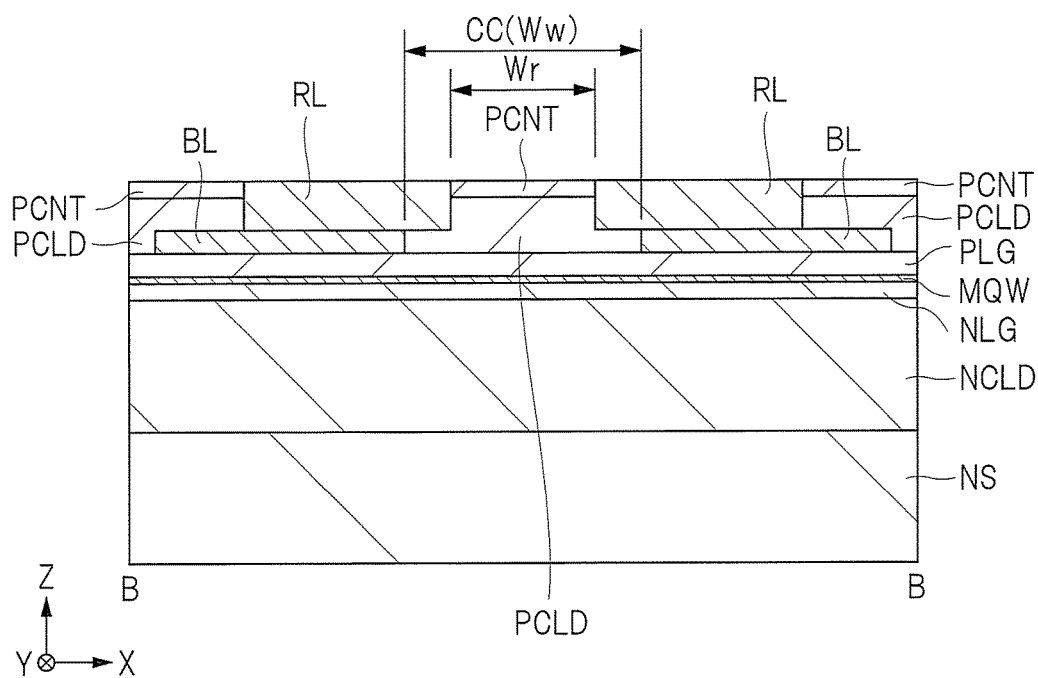
FIG. 27 is a cross-sectional view showing the manufacturing process of the semiconductor laser according to the second embodiment.
Figure 28:
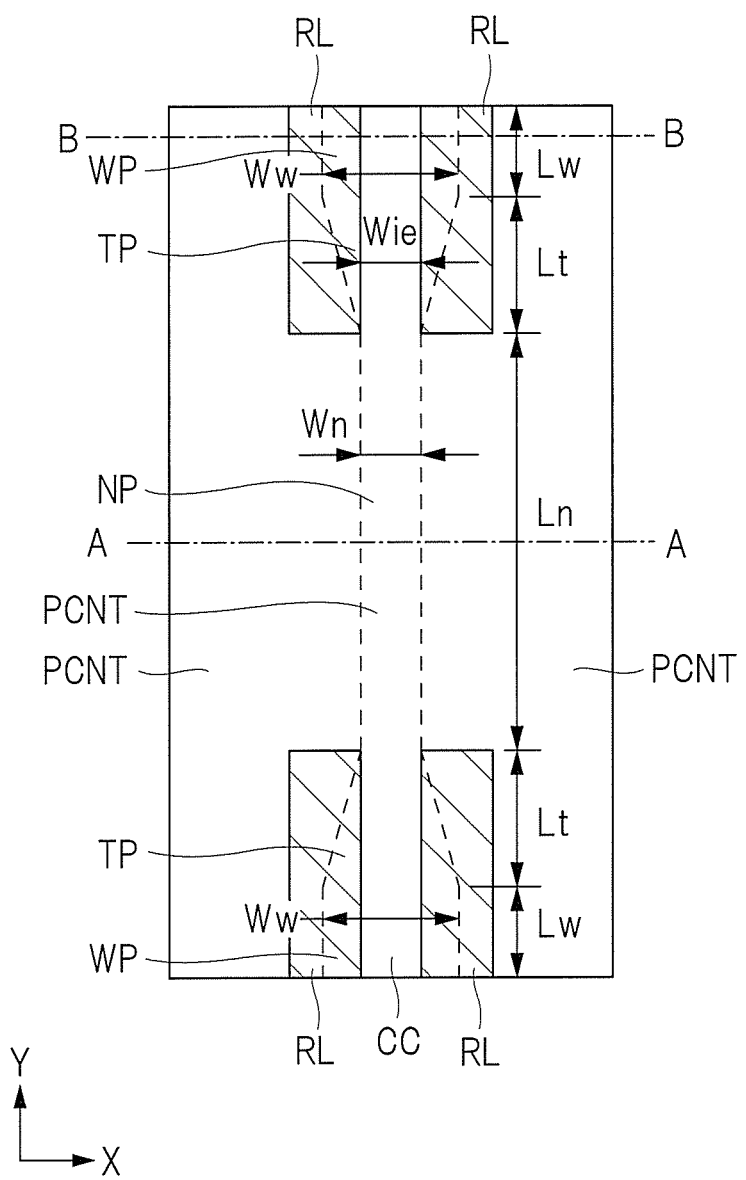
FIG. 28 is a plan view showing the manufacturing process of the semiconductor laser according to the second embodiment.
Figure 29:
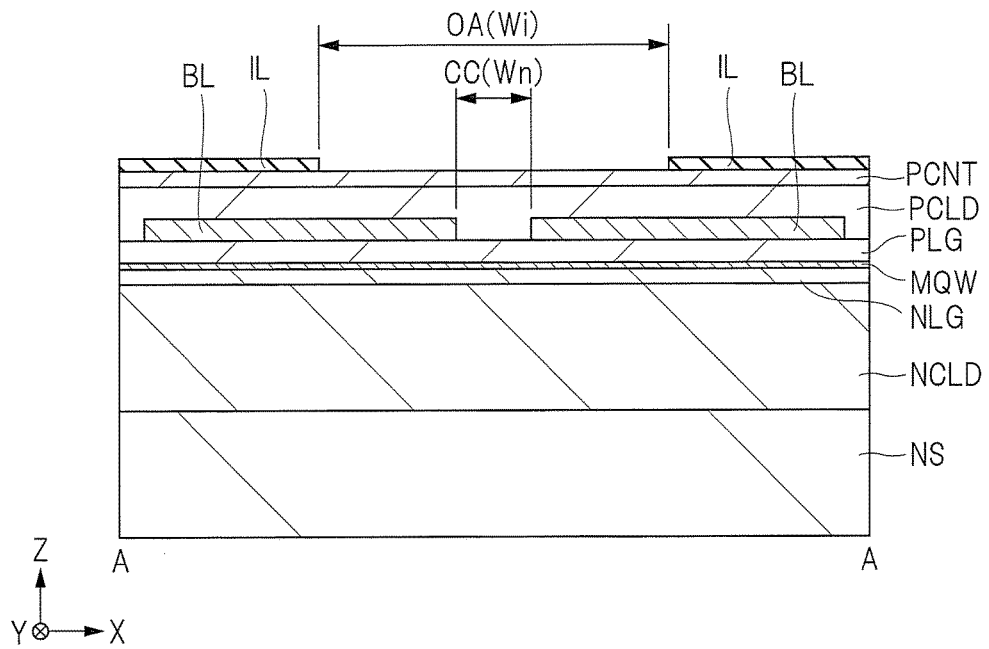
FIG. 29 is a cross-sectional view showing the manufacturing process of the semiconductor laser according to the second embodiment.
Figure 30:
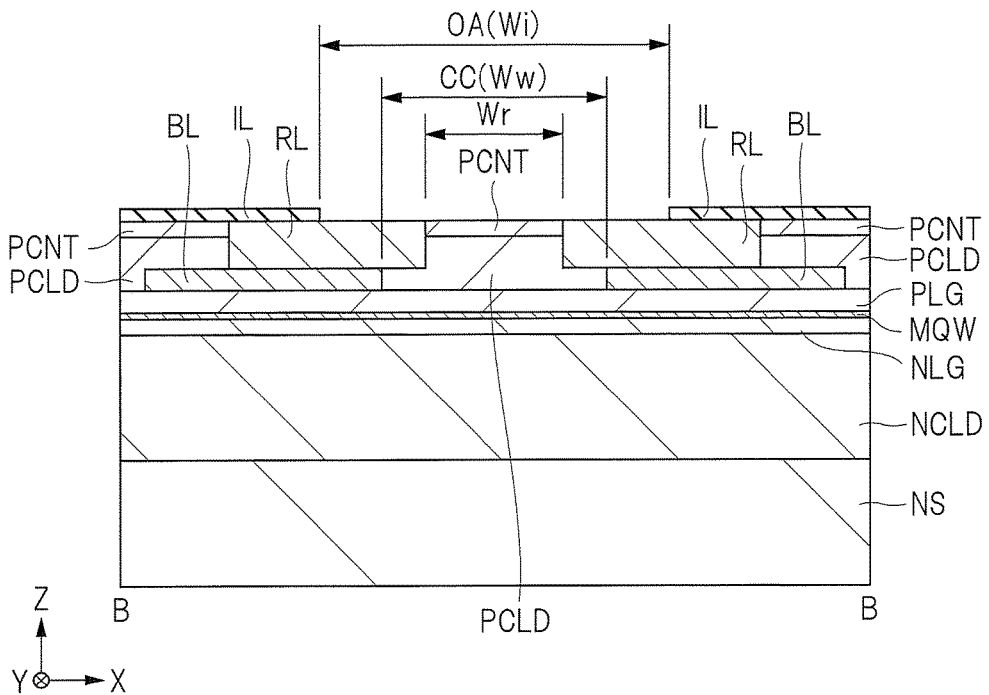
FIG. 30 is a cross-sectional view showing the manufacturing process of the semiconductor laser according to the second embodiment.

Subsequently, an n-type impurity (for example, Si) is injected into a region in the p-type contact layer PCNT and the p-type clad layer PCLD above both ends of the wide portion WP as shown in FIGS. 26 to 28.

For example, a hard mask (not shown) is formed on the p-type contact layer PCNT. A silicon nitride film is formed on the p-type contact layer PCNT by, for example, a CVD method or the like. Subsequently, after a photoresist film is applied onto the silicon nitride film, the photoresist film above both ends of the wide portion WP is removed through use of a photolithography technique. Subsequently, the hard mask (silicon nitride film) is etched with using the photoresist film as a mask. Then, the n-type impurity (for example, Si) is injected into the p-type contact layer PCNT and the p-type clad layer PCLD with using the hard mask (silicon nitride film) as a mask. For example, the n-type impurity (for example, Si) is injected to a depth of about 0.25 μm from the surface of the p-type clad layer PCLD. Subsequently, the photoresist film is removed by asking or the like, and annealing (heat treatment) is performed. Accordingly, a region in the p-type contact layer PCNT and the p-type clad layer PCLD into which the n-type impurity (for example, Si) is injected is inversed to an n-type, thereby forming the inversion layer RL. Subsequently, the hard mask (silicon nitride film) is removed.

Thereafter, for example, a silicon oxide film is formed as the insulating layer IL on the p-type contact layer PCNT and the inversion layer RL by a CVD method or the like in the same manner as the first embodiment. Subsequently, the insulating layer IL on the current confinement region is removed, and the opening portion OA is formed. The opening portion OA has the rectangular shape whose width Wi in the X direction is substantially uniform (see FIGS. 29, 30 and 24) as described above.

Thereafter, in the same manner as the first embodiment, the p-side electrode PEL and the n-side electrode NEL are formed and the substrate NS is cleaved in the X direction, and then, the anti-reflection film. AR and the high-reflection film HR are formed and the substrate NS is cut in the Y direction (FIGS. 22 to 25). It is possible to form the semiconductor laser of the second embodiment through the above-described processes.

Third Embodiment

Figure 37:
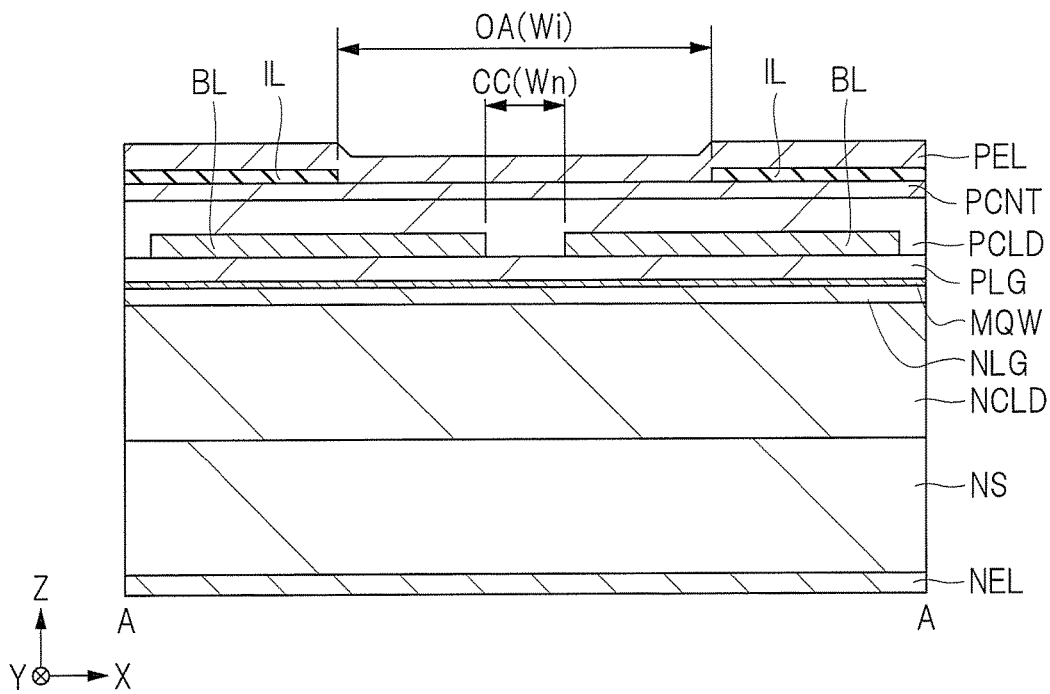
FIG. 37 is a cross-sectional view showing a configuration of a semiconductor laser according to the third embodiment.
Figure 38:
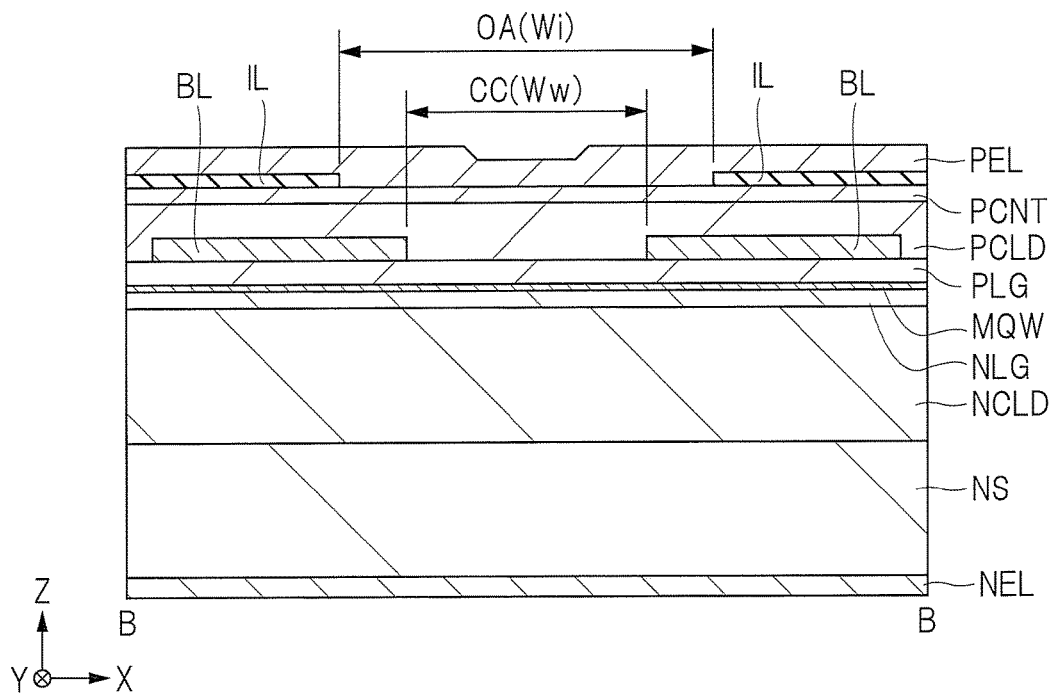
FIG. 38 is a cross-sectional view showing the configuration of the semiconductor laser according to the third embodiment.
Figure 39:
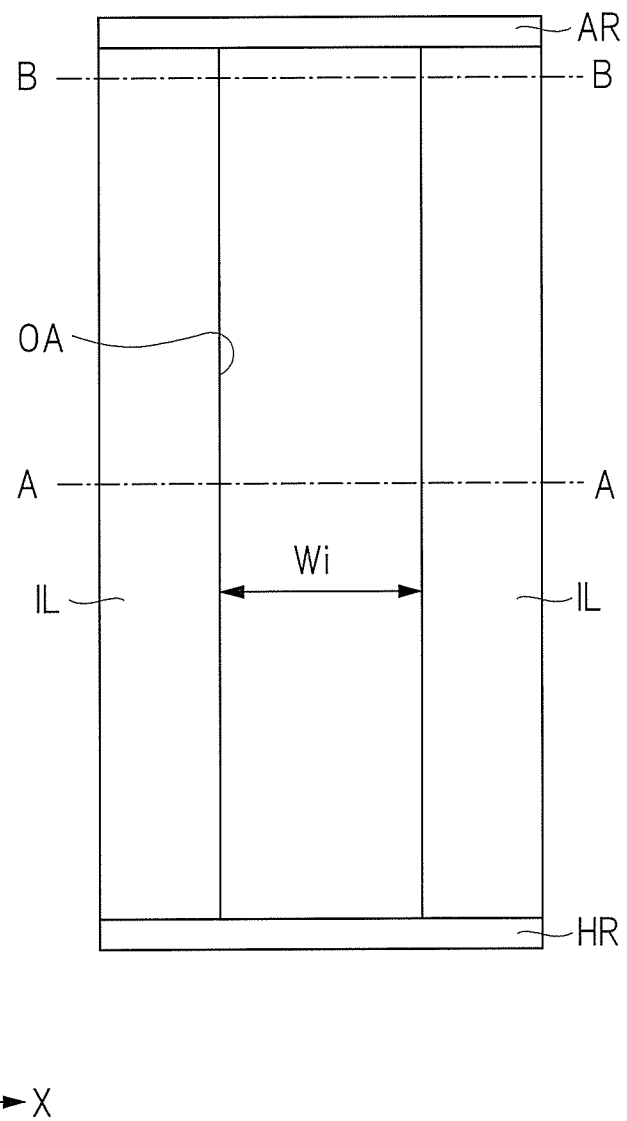
FIG. 39 is a plan view showing the configuration of the semiconductor laser according to the third embodiment.
Figure 40:
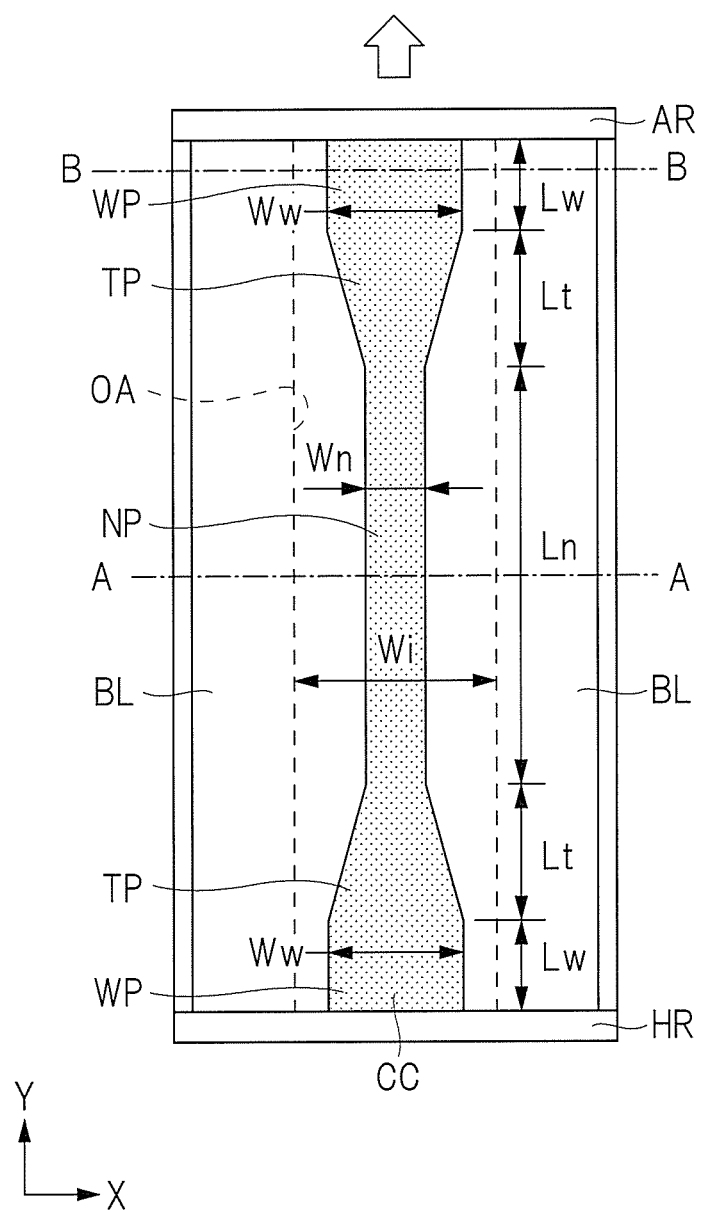
FIG. 40 is a plan view showing the configuration of the semiconductor laser according to the third embodiment.

Hereinafter, the third embodiment will be described in detail with reference to the drawings. FIGS. 37 to 40 are plan views and cross-sectional views showing a configuration of a semiconductor laser according to the third embodiment. FIGS. 37 and 38 are the cross-sectional views and FIGS. 39 and 40 are the plan views. The cross-sectional views of FIGS. 37 and 38 correspond to an A-A cross section and a B-B cross section of FIGS. 39 and 40. Incidentally, the same parts as those in the first embodiment will be denoted by the same reference characters, and the detailed description thereof will be omitted. In addition, it is possible to form the semiconductor laser according to the third embodiment through substantially the same process as that in the first embodiment.

As shown in FIGS. 37 and 38, the semiconductor laser according to the third embodiment uses the n-type substrate NS as a substrate and includes a plurality of nitride semiconductor layers which are sequentially laminated on the substrate NS. To be specific, the n-type clad layer NCLD, the n-type light guide layer NLG, the active layer MQW, the p-type light guide layer PLG, the p-type clad layer PCLD and the p-type contact layer PCNT are disposed on the n-type substrate NS in this order from bottom. In addition, the p-side electrode PEL is disposed on the p-type contact layer PCNT as the uppermost layer, and the n-side electrode NEL is disposed on the back surface of the n-type substrate NS. The p-type contact layer PCNT and the p-side electrode PEL are in contact with each other via the opening portion OA of the insulating layer (insulating film) IL (see FIG. 39).

Further, the current block layers BL are disposed between the n-type clad layer NCLD and the n-type light guide layer NLG in the semiconductor laser according to the third embodiment. The current confinement region CC is formed between these current block layers BL. As shown in FIG. 40, the current confinement region CC includes the narrow portion NP positioned at the central portion in the Y direction and the wide portions WP positioned at end portions thereof. The tapered portion TP is formed between the narrow portion NP and the wide portion WP. The width of the narrow portion NP is the width Wn and the width of the wide portion WP is the width Ww. In addition, the width of the opening portion OA is of the straight type having the width Wi. The relation that the width Wn<the width Ww<the width Wi is established. The length of the narrow portion NP in the Y direction is the length Ln, the length of the wide portion WP in the Y direction is the length Lw, and the length of the tapered portion TP in the Y direction is the length Lt.

Here, in the third embodiment, the length Lt of the tapered portion TP is set to be 0.65×Lad or more and 1.35×Lad or less. Here, Lad is an adiabatic length that corresponds to $0.37 \times \lambda/(\text{Neff0}-\text{Neff2})$, Neff0 is an effective refractive index of the fundamental mode in the wide portion WP, and Neff2 is an effective refractive index of the secondary mode in the wide portion WP.

Figure 41:
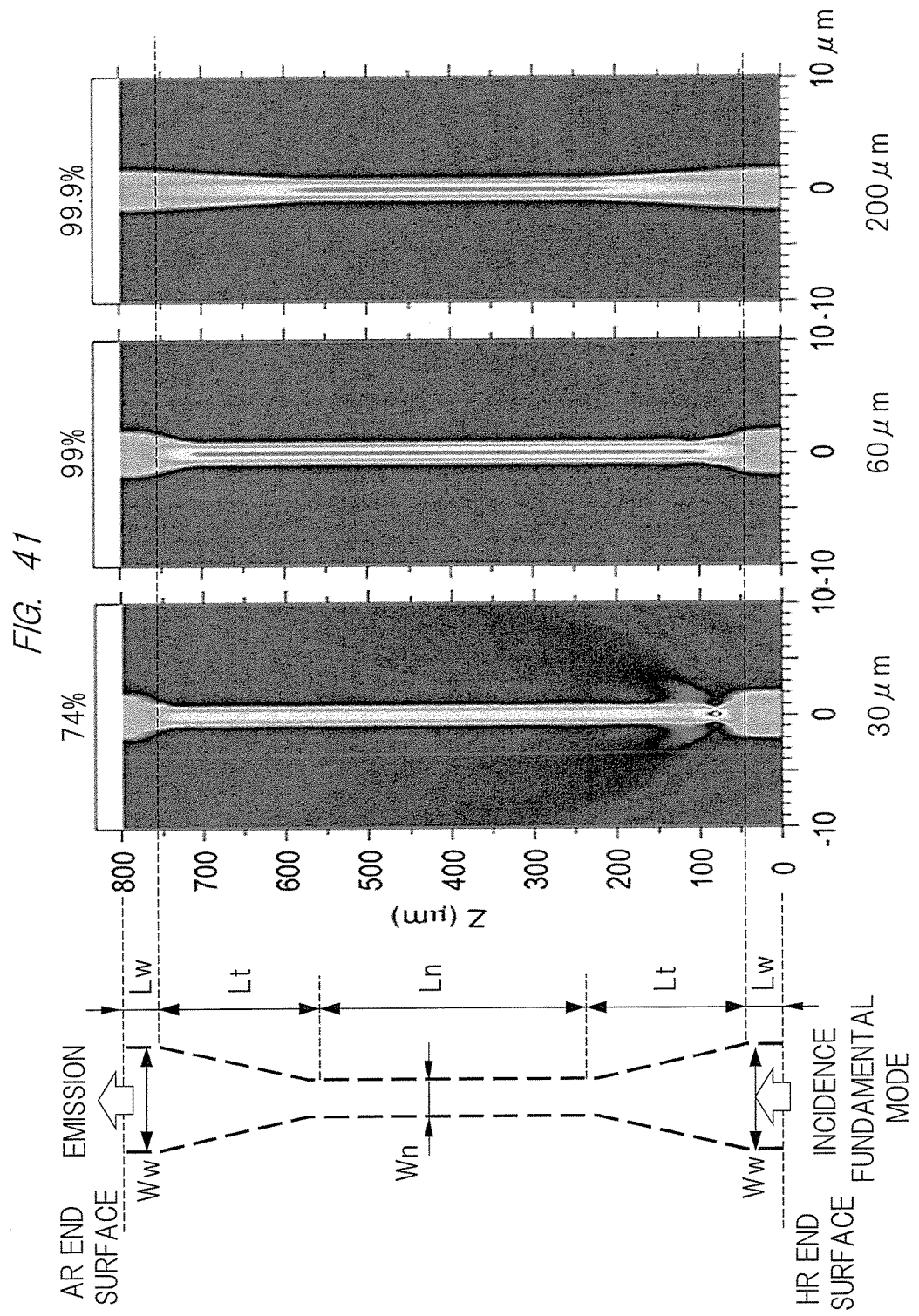
FIG. 41 is a diagram showing an electric field intensity distribution of a waveguide in the case of varying a length of a tapered portion.

FIG. 41 is a diagram showing an electric field intensity distribution of a waveguide in the case of varying the length of the tapered portion. To be specific, FIG. 41 shows the electric field intensity distribution of light propagating through a waveguide of 800 µm from the end surface on the HR side to the end surface on the AR side in each case of setting the values of Lt to 30 µm, 60 µm and 200 µm in the semiconductor laser according to the third embodiment described with reference to FIGS. 37 to 40. The electric field intensity distribution is calculated by using abeam propagation method and displayed in contour. When the values of Lt are 30 µm, 60 µm and 200 µm, each transmittance of 1Path of the waveguide is 74%, 99% and 99.9%, respectively, and each area increment ratio of a part at which a width of the waveguide exceeds the width Wn of the narrow portion NP, that is, a value expressed by (the entire area of waveguide−Wn×a length of resonator)/the entire area of waveguide is 22%, 27% and 42%, respectively. It can be understood that it is possible to reduce the area increment ratio from 42% to 27% while keeping the transmittance of 1Path at a high value of 99% by setting Lt=60 µm.

Figure 42:
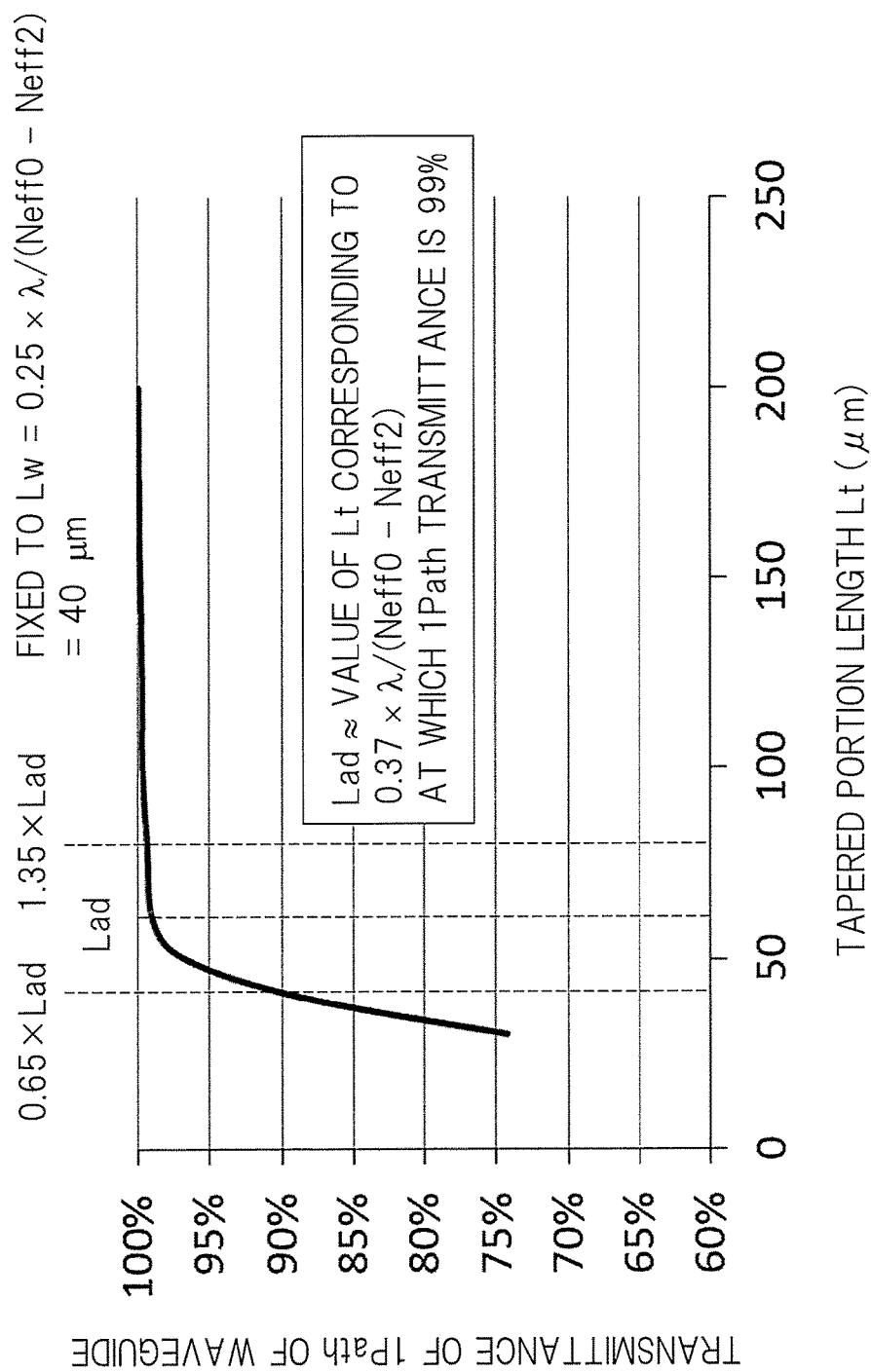
FIG. 42 is a diagram showing a relation between a length of the tapered portion and transmittance of 1Path of the waveguide.

FIG. 42 is a diagram showing a relation between the length of the tapered portion and the transmittance of 1Path of the waveguide. As shown in FIG. 42, a value of Lt that allows the transmittance of 1Path to be 99% is 60 µm. In addition, this value corresponds to $0.37\lambda/(\text{Neff0}-\text{Neff2})$. This value corresponds to the adiabatic length (Lad) in the meaning that it is the lower limit value that enables the dissipation of energy at the time of passing through the waveguide to be 1% or lower. As described above, it is possible to keep the transmittance of 1Path of the waveguide to 90% or higher when the value of Lt is 0.65 times the adiabatic length (Lad) or longer.

As described above, it is desirable to set the length Lt to a range in which the area increment ratio is reduced and the transmittance of 1Path of the waveguide is kept at 90%, so that the deterioration of the oscillation characteristics can be suppressed as much as possible, that is, to a range from 0.65×Lad to 1.35×Lad. When Lt is set to this range, it is possible to set the area increment ratio to 24% to 29%. Accordingly, it is possible to significantly reduce the area increment ratio as compared to a case in which a value of Lt is set to, for example, 200 µm (an area increment ratio is 42%), and thus, it is possible to more strongly suppress the generation of the super luminescence. As a result, it is possible to obtain the current-light output characteristics in which the flexure is not caused until the light output of, for example, 500 mW or higher.

Figure 43:
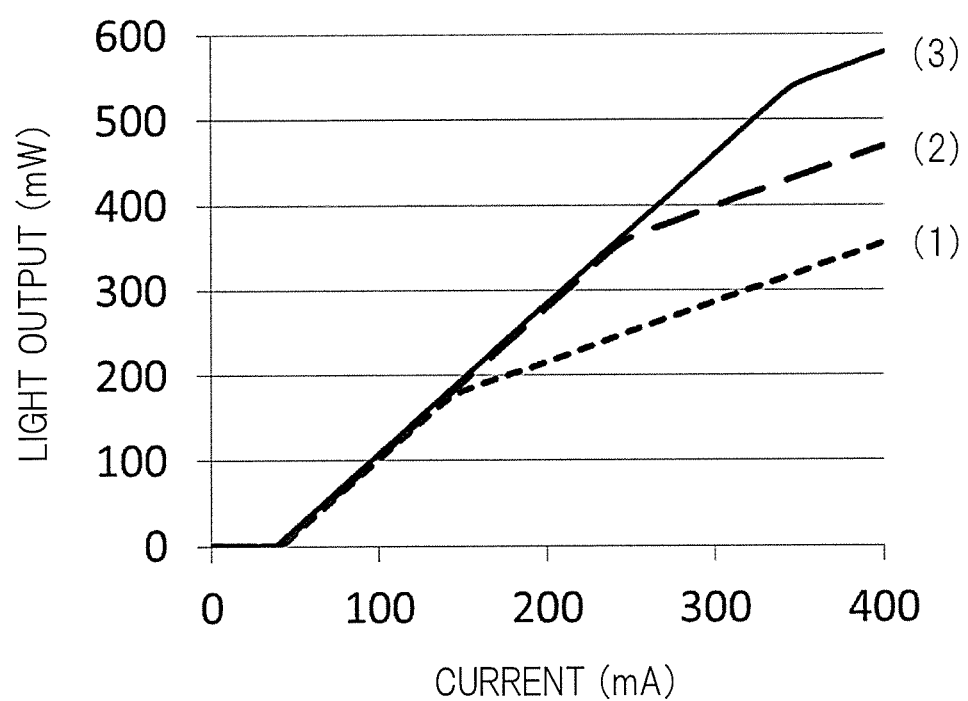
FIG. 43 is a diagram showing a relation between current and a light output in the case of varying the length of the tapered portion.

FIG. 43 is a diagram showing a relation between current and a light output in the case of varying the length of the tapered portion. A graph (1) indicates the case of Lt=200 µm and a graph (2) indicates the case of Lt=60 µm. Regarding the graphs (1) and (2), Ww=4 µm, Lw=40 µm and Wi (straight width)=20 µm. A graph (3) indicates a case in which Wie=1.6 µm and both sides of the wide portion WP and the tapered portion TP are covered by the insulating layer IL in the configuration of the first embodiment.

A flexure of the current-light output line is found in the vicinity of the light output of 180 mW in the graph (1), and a flexure of the current-light output line is found in the vicinity of the light output of 350 mW in the graph (2). This is an effect obtained by shortening Lt to 60 μm close to the adiabatic length (Lad) and reducing the area increment ratio. In addition, in the graph (3), in addition to the effect of reducing the area increment ratio achieved by shortening Lt, a flexure of the current-light output line can be shifted to a higher light output level by reducing the width (Wie) of the opening portion OA of the insulating layer IL in the wide portion WP and the tapered portion TP.

Fourth Embodiment

The length Lt of the tapered portion TP on the HR side and the length Lt of the tapered portion on the AR side are made almost equal to each other (for example, Lt=60 μm) in the semiconductor laser according to the third embodiment (FIGS. 37 to 40), but these may be set to be different values. Incidentally, the semiconductor laser according to the fourth embodiment has the same configuration as that in the third embodiment except for a length of the tapered portion TP. In addition, the same parts as those in the first embodiment will be denoted by the same reference characters, and the detailed description thereof will be omitted. In addition, it is possible to form the semiconductor laser according to the fourth embodiment through substantially the same process as that in the first embodiment.

Figure 44:
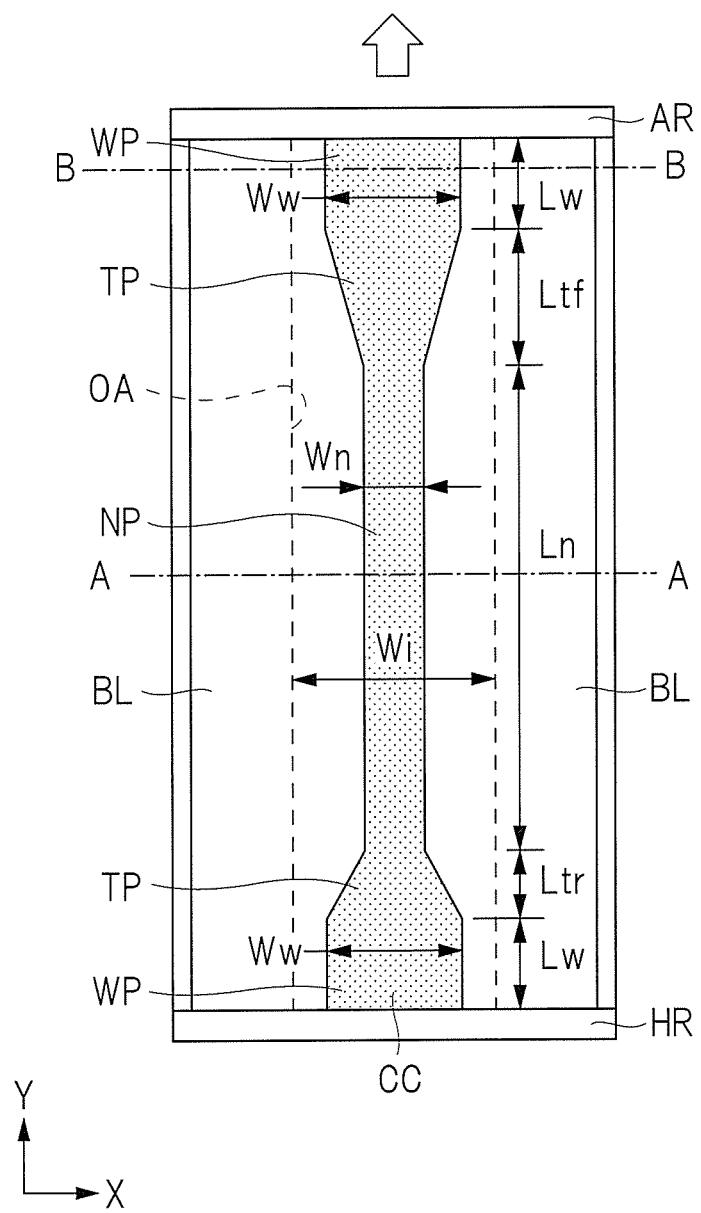
FIG. 44 is a plan view showing a configuration of a semiconductor laser according to the fourth embodiment.

FIG. 44 is a plan view showing the configuration of the semiconductor laser according to the fourth embodiment. As shown in FIG. 44, a length Ltf of the tapered portion TP on the AR side may be set to be larger than a length Ltr of the tapered portion on the HR side (Ltf>Ltr).

Figure 45:
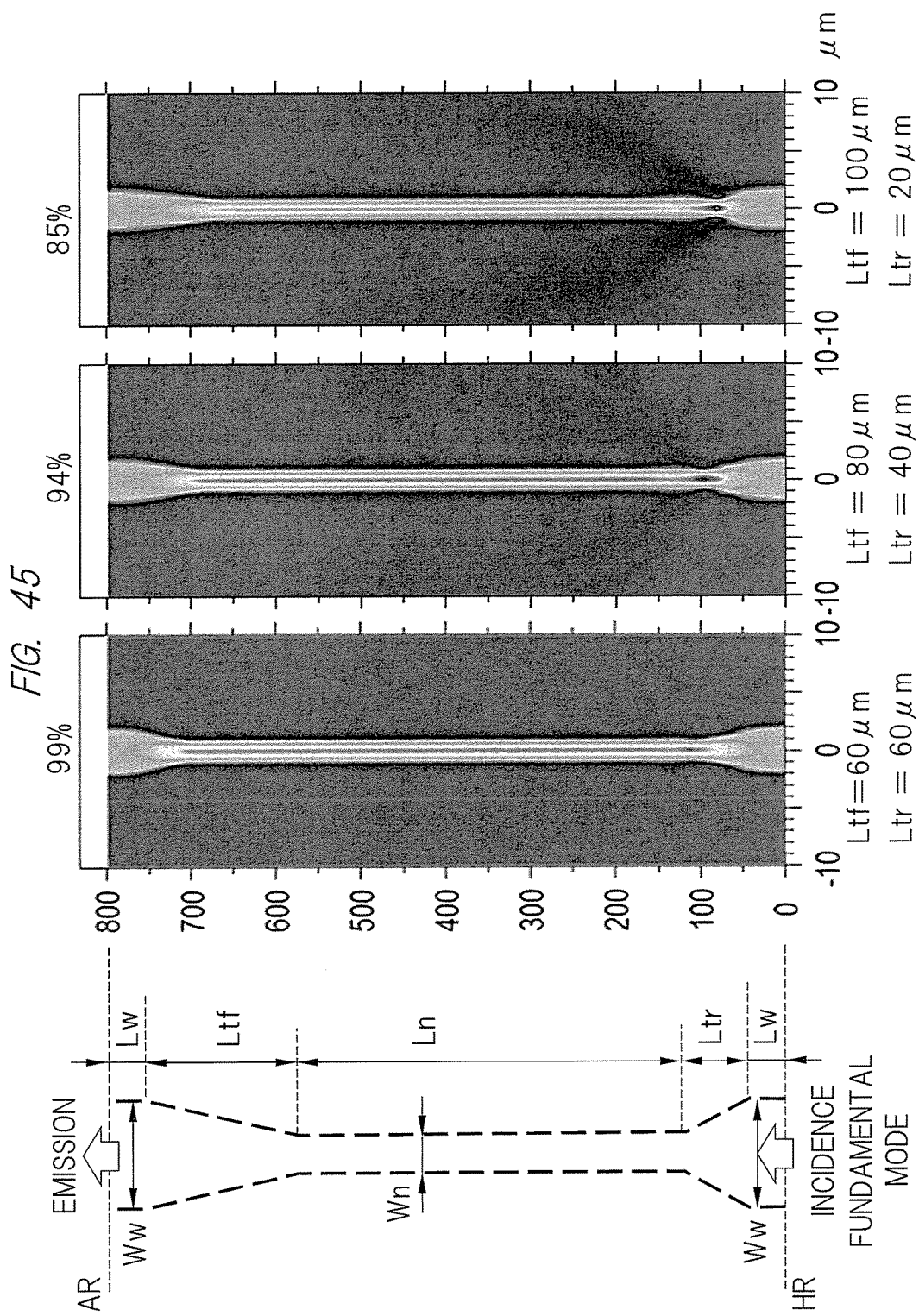
FIG. 45 is a diagram showing an electric field intensity distribution of a waveguide in the case of varying a ratio between lengths of the two tapered portions.

FIG. 45 is a diagram showing an electric field intensity distribution of a waveguide in the case of varying a ratio between lengths of two tapered portions. To be specific, FIG. 45 shows the electric field intensity distribution of light propagating through a waveguide of 800 μm from the end surface on the HR side to the end surface on the AR side for each combination of Ltf and Ltr. The electric field intensity distribution is calculated by using abeam propagation method and displayed in contour. An examination has been conducted regarding the case in which each combination of Ltf and Ltr is (Ltf=60 μm, Ltr=60 μm), (Ltf=80 μm, Ltr=40 μm) and (Ltf=100 μm, Ltr=20 μm). Namely, the examination has been conducted regarding a case in which a sum of Ltf and Ltr is 120 μm, which is twice the adiabatic length (Lad). Each transmittance of 1Path of the waveguide is 99%, 94% and 85%. In this manner, the transmittance of 85% or higher can be obtained even when the ratio between lengths of two tapered portions is varied.

Further, by setting Ltr≤0.65×Lad, the transmittance of 1Path of the waveguide can be kept to be a high value of 90% or higher.

In addition, it is possible to suppress the super luminescence by setting the length Ltr to be smaller than the length Ltf. The light intensity of the resonator of the semiconductor laser in the longitudinal direction decreases on the HR side (rear side) with a high reflectance as compared to the AR side (front side) with a low reflectance. Accordingly, the tendency that the action of clamping the density distribution of the injected carrier in the wide portion WP disposed near the end surface of the waveguide portion weakens becomes more remarkable on the HR side (rear side) than on the AR side (front side). In addition, a length on the AR side (front side) that the super luminescence light is propagated is only 1Path of the wide portion WP, but is practically doubled (2Path) on the HR side (rear side) because the lightwave reciprocates. Thus, the likelihood of occurrence of the super luminescence due to the increase of the carrier density of the right and left end portions of the waveguide accompanying the weakening tendency of the clamping action is more remarkable on the HR side (rear side) than on the AR side (front side). Thus, when the super luminescence is to be suppressed by the reduction of the area increment ratio, it is preferable to increase a shortening rate of the length of the tapered portion on the HR side (rear side) than on the AR side (front side) (Ltf>Ltr).

Of course, the length Ltr may be made smaller than the length Ltf (Ltf>Ltr) while setting each of the length Ltf and the length Ltr to be 0.65×Lad or more and 1.35×Lad or less as described in the third embodiment.

Fifth Embodiment

Figure 46:
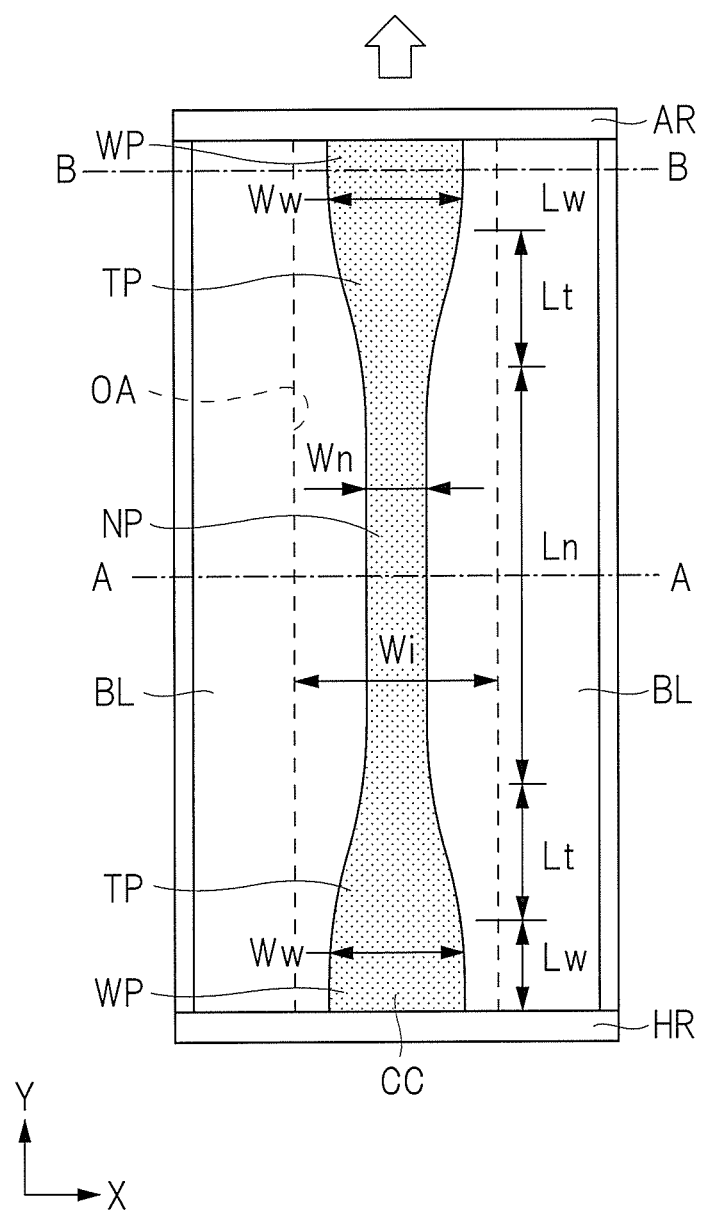
FIG. 46 is a plan view showing a configuration of a semiconductor laser according to the fifth embodiment.

Hereinafter, the fifth embodiment will be described in detail with reference to the drawings. FIG. 46 is a plan view showing a configuration of the semiconductor laser according to the fifth embodiment. Incidentally, the semiconductor laser according to the fifth embodiment is configured in the same manner as that in the third embodiment except for a shape of an end of a current confinement region. In addition, the same parts as those in the first embodiment and others will be denoted by the same reference characters, and the detailed description thereof will be omitted. In addition, it is possible to form the semiconductor laser according to the fifth embodiment through substantially the same process as that in the first embodiment.

As shown in FIG. 46, the semiconductor laser according to the fifth embodiment has the configuration in which a planar shape of the current confinement region has a curve line. To be specific, a boundary portion from the narrow portion NP to the tapered portion TP and a boundary portion from the tapered portion TP to the wide portion WP are formed in at least a cosine-curved shape when seen in a plan view. In other words, an end of a planar shape of the narrow portion NP, the tapered portion TP and the wide portion WP has a cosine curve. Such a shape of the tapered portion TP is referred to as a cosine taper. On the other hand, for example, the shape of the substantially trapezoidal tapered portion TP shown in the above-described examination example (FIG. 34) is referred to as a straight taper.

The area of the tapered portion TP is the same in the case of the cosine taper and the case of the straight taper. Meanwhile, in the case of the cosine taper, the boundary portion between the tapered portion TP and the wide portion WP is in the vicinity of a position of the antinode of the beat waveform of the zero-order mode and the secondary mode generated in the wide portion WP. Thus, even if the value of Lw is 0, that is, the wide portion WP is not provided, the coupling of light is not impaired when the reflected light at the end surface on the AR side returns again to the waveguide. In practice, it is preferable to secure a finite value of about 10 μm for Lw in terms of the constraint of accuracy of the cleavage. In addition, a deviation between a position of the antinode of the beat waveform and a position of the boundary portion between the tapered portion TP and the wide portion WP may occur depending on combinations of values of Ww, Wn and Lt, and thus, it is preferable to set Lw to 0.1×λ/(Neff0−Neff2) or smaller.

As described above, Lw can be further shortened by employing the cosine taper, so that the area increment ratio can be further reduced. Thus, it is possible to suppress the generation of the super luminescence, and the current-light output characteristics in which the flexure is not caused until a still higher light output can be obtained.

Of course, the configuration of the cosine taper may be employed in addition to each configuration of the third and fourth embodiments.

Sixth Embodiment

Hereinafter, various application examples will be described in the sixth embodiment. For example, combinations of each of the third, fourth and fifth embodiments and the first embodiment will be described.

First Application Example

For example, the configuration of Lt of the third embodiment may be applied to the configuration of the first embodiment.

Figure 47:
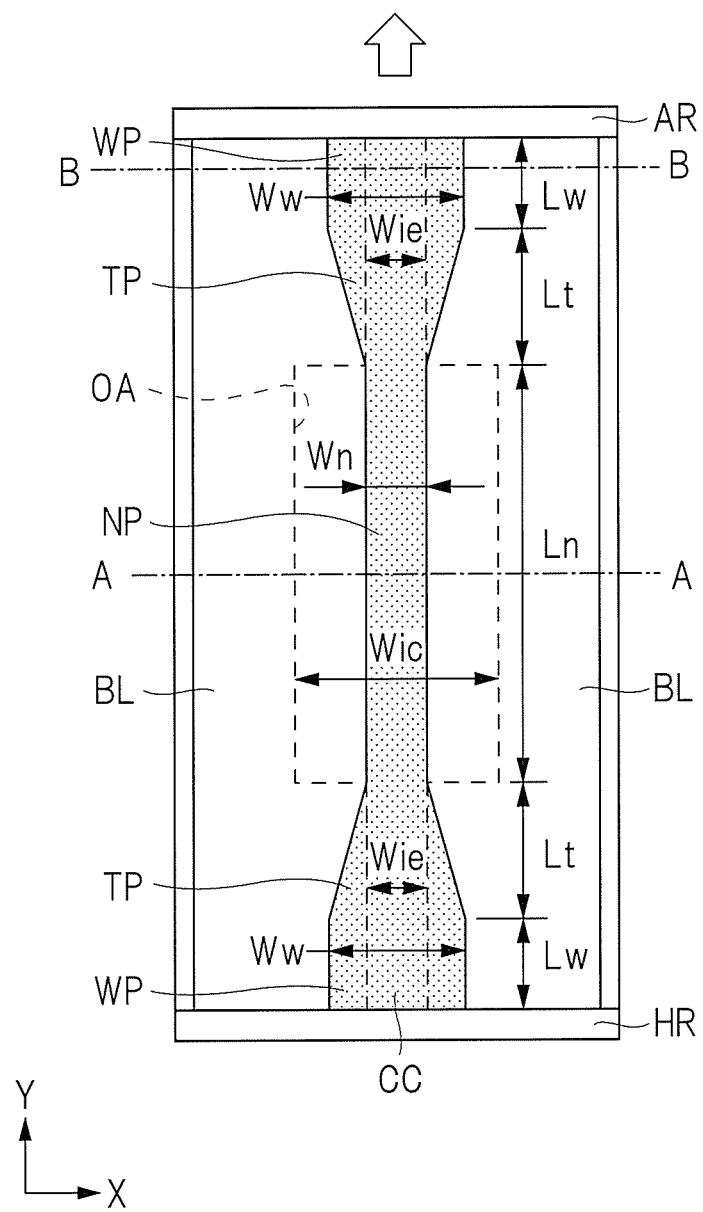
FIG. 47 is a plan view showing a configuration of a semiconductor laser according to a first application example of the sixth embodiment.

FIG. 47 is a plan view showing a configuration of a semiconductor laser according to the first application example of the sixth embodiment.

As shown in FIG. 47, the width (Wie) of the opening portion OA of the insulating layer IL is made narrow above the wide portion WP of the current confinement region CC, and both ends (on the right and left in FIG. 47) of the wide portion WP are covered by the insulating layer IL (see the first embodiment). In addition, the length Lt of the tapered portion TP of the current confinement region CC is set to the range from 0.65×Lad to 1.35×Lad (see the third embodiment).

Second Application Example

For example, the configuration of Lt of the fourth embodiment may be applied to the configuration of the first embodiment.

Figure 48:
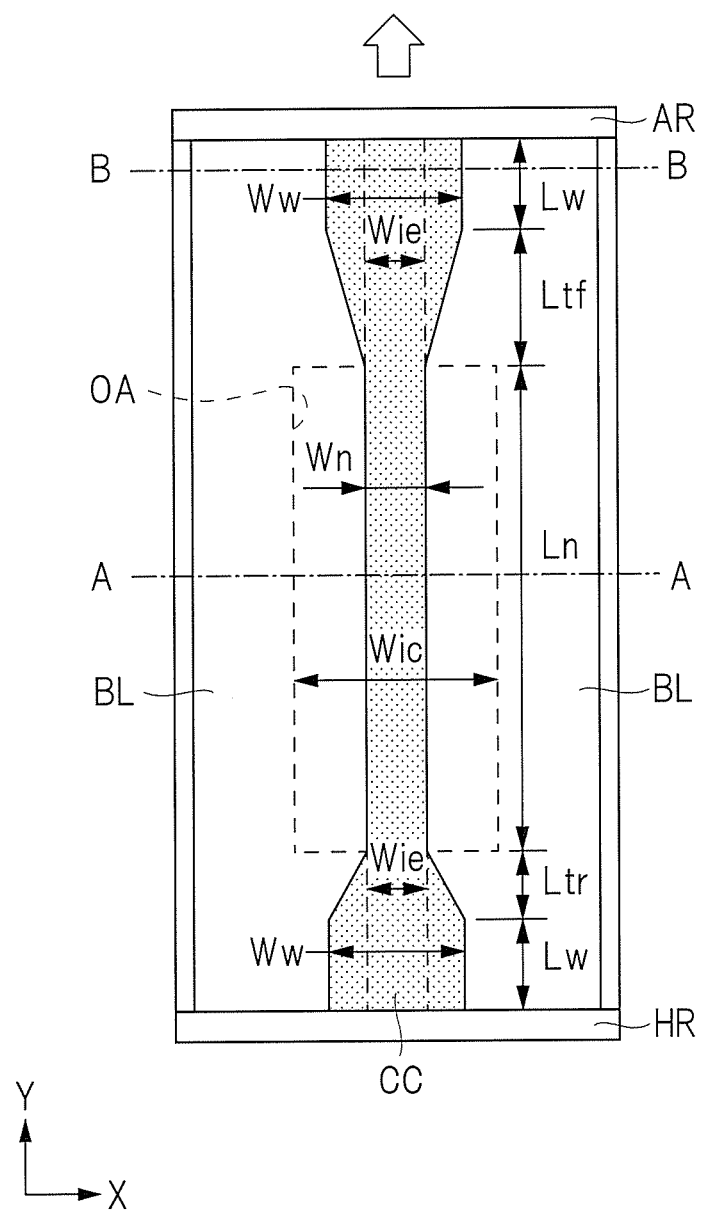
FIG. 48 is a plan view showing a configuration of a semiconductor laser according to a second application example of the sixth embodiment.

FIG. 48 is a plan view showing a configuration of a semiconductor laser according to the second application example of the sixth embodiment.

As shown in FIG. 48, the width (Wie) of the opening portion OA of the insulating layer IL is made narrow above the wide portion WP of the current confinement region CC, and both ends (on the right and left in FIG. 48) of the wide portion WP are covered by the insulating layer IL (see the first embodiment). In addition, the length Ltr of the tapered portion TP on the HR side is made smaller than the length Ltf of the tapered portion on the AR side (Ltf >Ltr, see the fourth embodiment).

Third Application Example

For example, the configuration of the narrow portion NP, the tapered portion TP and the wide portion WP of the fifth embodiment may be applied to the configuration of the first embodiment.

Figure 49:
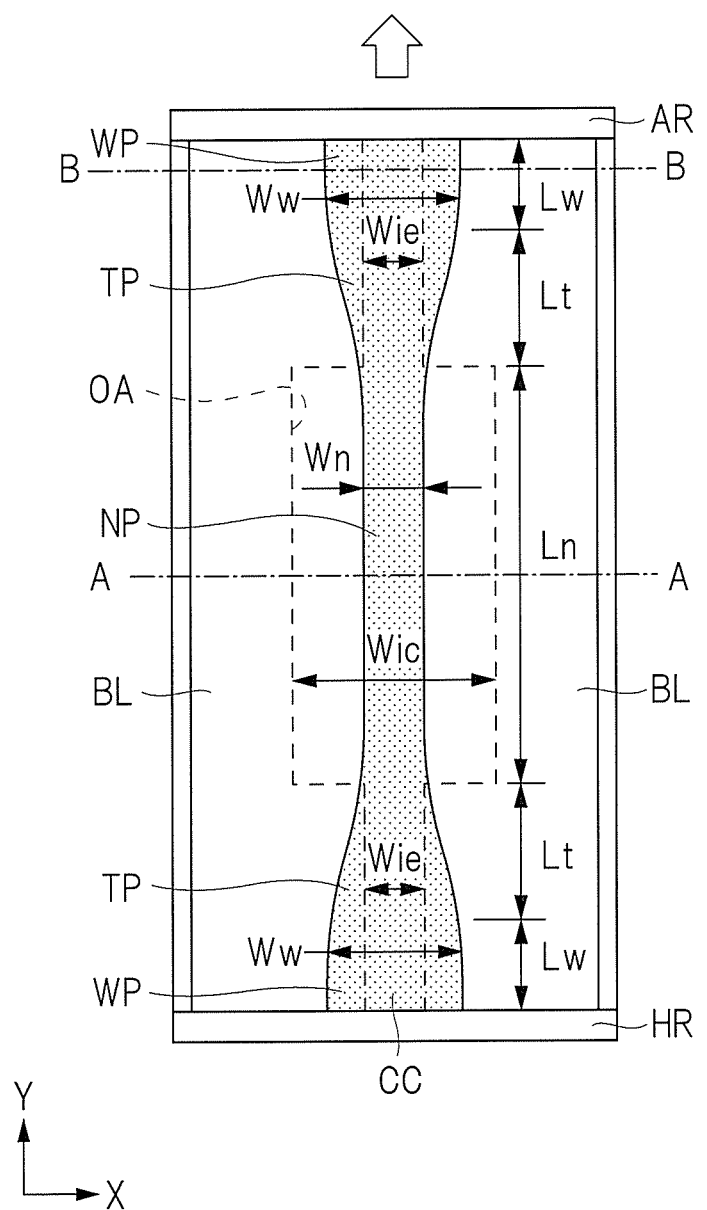
FIG. 49 is a plan view showing a configuration of a semiconductor laser according to a third application example of the sixth embodiment.

FIG. 49 is a plan view showing a configuration of a semiconductor laser according to the third application example of the sixth embodiment.

As shown in FIG. 49, the width (Wie) of the opening portion OA of the insulating layer IL is made narrow above the wide portion WP of the current confinement region CC, and both ends (on the right and left in FIG. 49) of the wide portion WP are covered by the insulating layer IL (see the first embodiment). In addition, the boundary portion from the narrow portion NP to the tapered portion TP and the boundary portion from the tapered portion TP to the wide portion WP have at least the cosine-curved shape in a planar shape of the narrow portion NP, the tapered portion TP and the wide portion WP (see the fifth embodiment).

(Others)

The configuration of the second embodiment and the configuration of the third embodiment may be combined, the configuration of the second embodiment and the configuration of the fourth embodiment may be combined, and the configuration of the second embodiment and the configuration of the fifth embodiment may be combined other than the first to third application examples described above. In addition, various combinations of the configurations such as a combination of the configuration of the first or second embodiment and the configurations of the third and fourth embodiments and a combination of the configuration of the first or second embodiment and the configurations of the third, fourth and fifth embodiments are also conceivable.

Seventh Embodiment

Although the semiconductor laser having a planar structure is provided without patterning the p-type contact layer PCNT and the p-type clad layer PCLD in the first embodiment (FIG. 1), a semiconductor laser having a ridge structure may be provided by patterning the p-type contact layer PCNT and the p-type clad layer PCLD to have a convex shape. Incidentally, the same parts as those in the first embodiment will be denoted by the same reference characters, and the detailed description thereof will be omitted. Hereinafter, a semiconductor laser (semiconductor device) of the seventh embodiment will be described in detail with reference to the drawings.

[Description of Structure]

Figure 50:
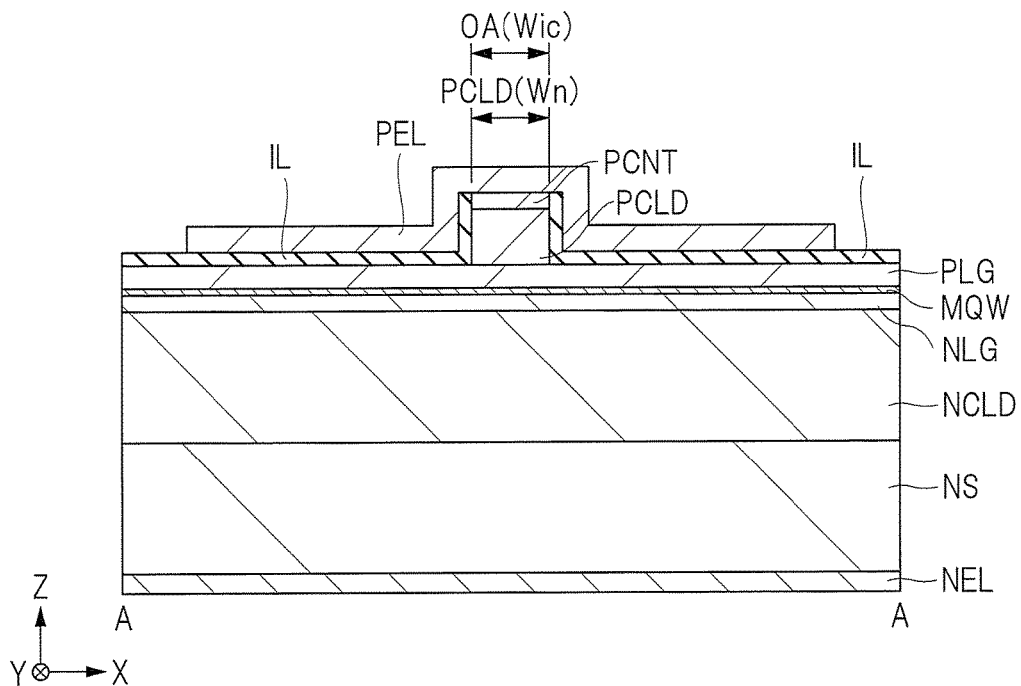
FIG. 50 is a cross-sectional view showing a configuration of a semiconductor laser according to the seventh embodiment.
Figure 51:
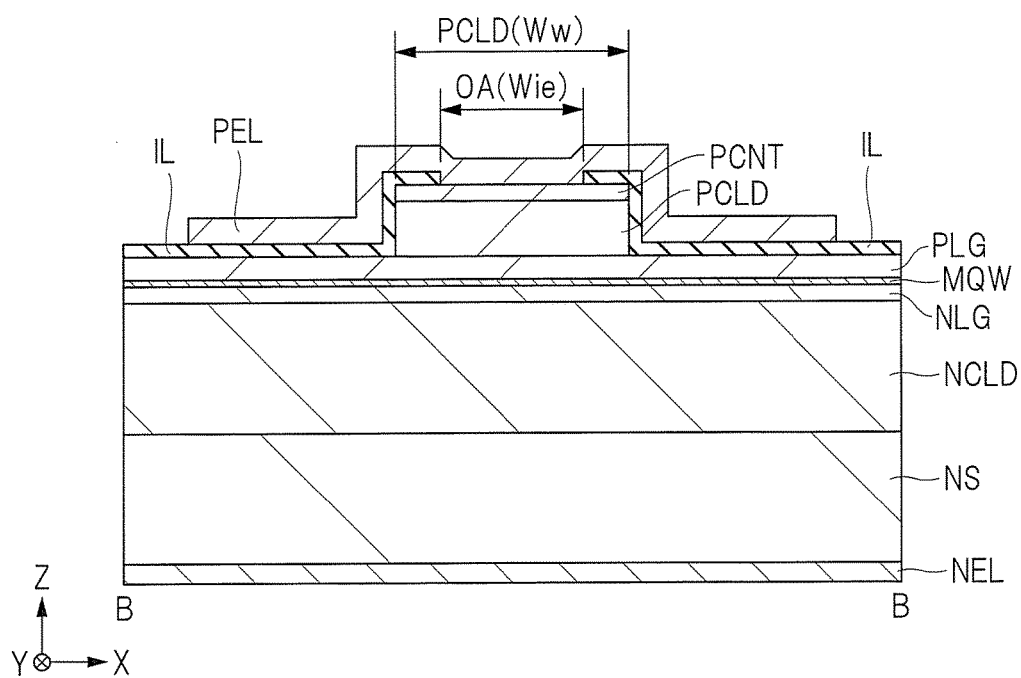
FIG. 51 is a cross-sectional view showing the configuration of the semiconductor laser according to the seventh embodiment.
Figure 52:
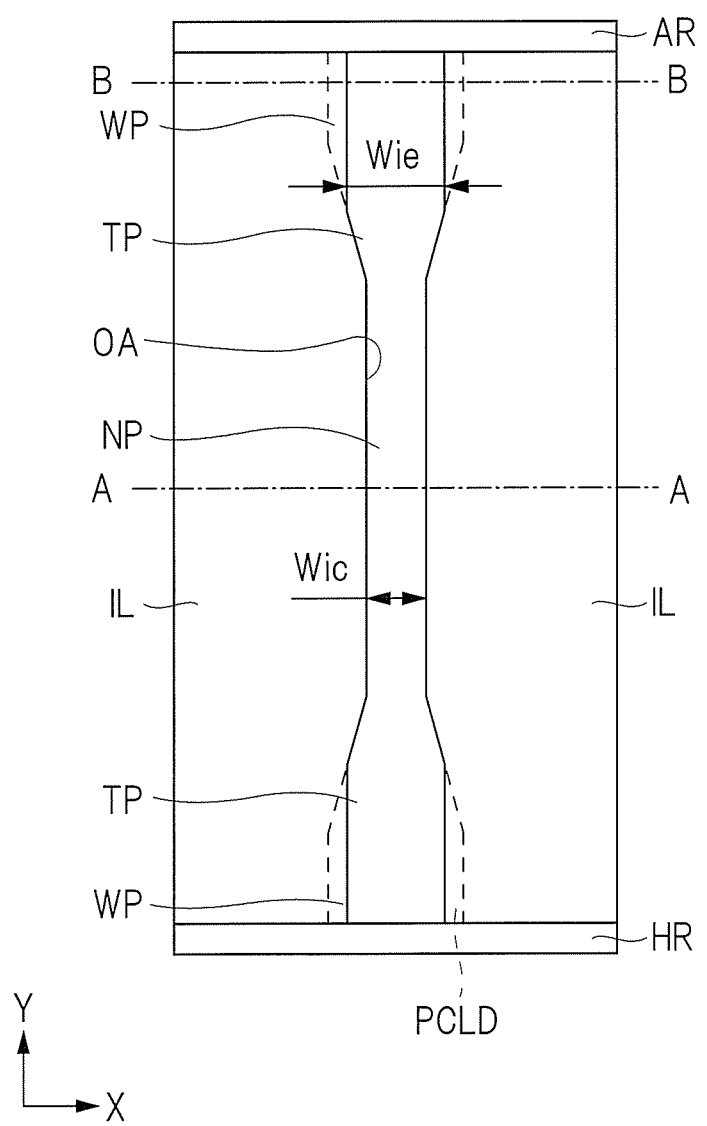
FIG. 52 is a plan view showing the configuration of the semiconductor laser according to the seventh embodiment.
Figure 53:
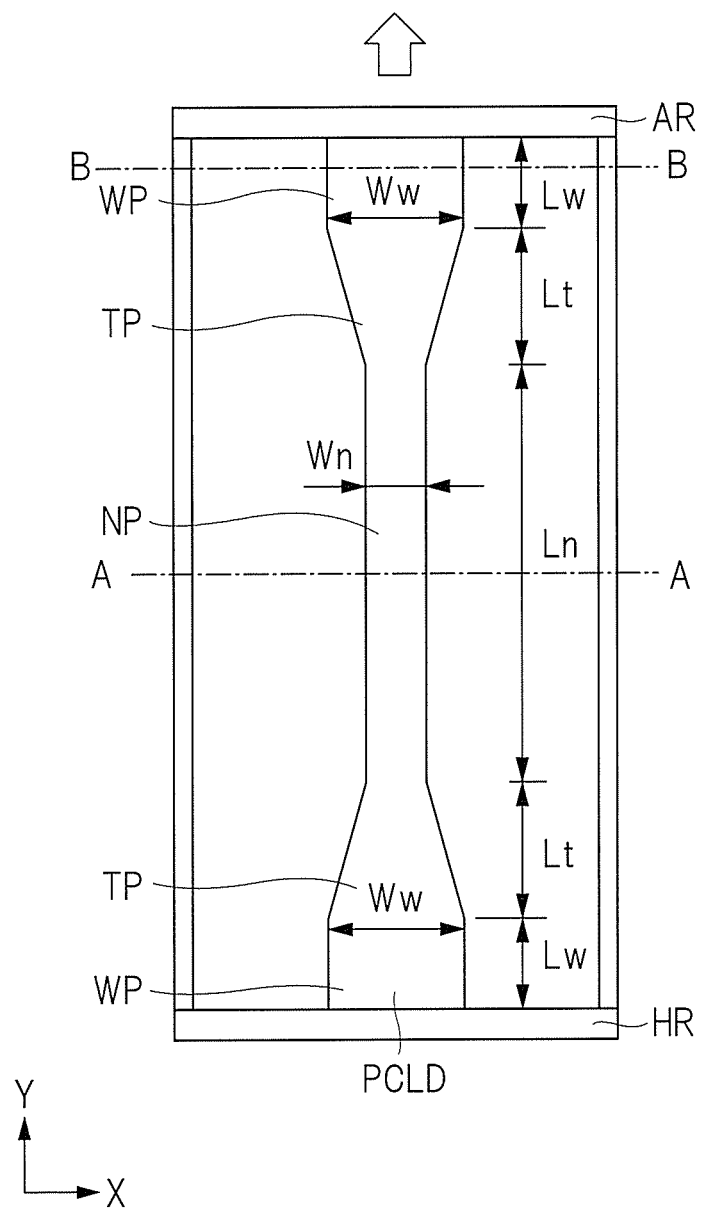
FIG. 53 is a plan view showing the configuration of the semiconductor laser according to the seventh embodiment.

FIGS. 50 to 53 are plan views and cross-sectional views showing a configuration of the semiconductor laser according to the seventh embodiment. FIGS. 50 and 51 are the cross-sectional views and FIGS. 52 and 53 are the plan views. The cross-sectional views of FIGS. 50 and 51 correspond to an A-A cross section and a B-B cross section of FIGS. 52 and 53.

As shown in FIGS. 50 to 53, a laminated portion including the p-type contact layer PCNT and the p-type clad layer PCLD extends in the Y direction in the semiconductor laser according to the seventh embodiment. In other words, a longitudinal direction of the laminated portion (ridged portion) including the p-type contact layer PCNT and the p-type clad layer PCLD is the Y direction. To be specific, the laminated portion including the p-type contact layer PCNT and the p-type clad layer PCLD includes the narrow portion NP which is positioned at the substantially central portion in the Y direction and the wide portions WP which are positioned at end portions in the Y direction. The tapered portion (substantially trapezoidal portion) TP is formed between the narrow portion NP and the wide portion WP, and the width thereof gradually increases from the narrow portion NP to the wide portion WP. A width of the narrow portion NP is the width Wn and a width of the wide portion WP is the width Ww. A length of the narrow portion NP in the Y direction is a length Ln, a length of the wide portion WP in the Y direction is a length Lw and a length of the tapered portion TP in the Y direction is a length Lt.

Here, in the semiconductor laser according to the seventh embodiment, the p-type contact layer PCNT and the p-side electrode PEL are in contact with each other via the opening portion OA of the insulating layer IL. As shown in FIG. 52, the opening portion OA extends in the Y direction. In other words, a longitudinal direction of the opening portion OA is the Y direction. Further, the width (central width) of the opening portion OA at the substantially central portion in the Y direction is the width Wic. In addition, a width of the opening portion OA on the HR side on one side of the substantially central portion in the Y direction (the lower side in FIG. 52) is the width Wie. Also, a width (end width) of the opening portion OA on the AR side on the other side of the substantially central portion in the Y direction (the upper side in FIG. 52) is the width Wie. A relation that the width Wic<the width Wie and a relation that the width Ww>the width Wie are established.

Further, the width (Wie) of the opening portion OA of the insulating layer IL is made narrow above the wide portion WP of the laminated portion including the p-type contact layer PCNT and the p-type clad layer PCLD, and both ends (on the right and left in FIG. 52) of the wide portion WP are covered by the insulating layer IL (see FIGS. 51 and 52). In other words, both ends (on the right and left in FIG. 52) of the wide portion WP overlap the insulating layer IL.

Hereinafter, a configuration of the semiconductor laser according to the seventh embodiment will be described in more details.

For example, the semiconductor laser according to the seventh embodiment uses the n-type substrate NS and includes a plurality of nitride semiconductor layers sequentially laminated on the n-type substrate NS like the first embodiment. To be specific, the n-type clad layer NCLD is disposed on the n-type substrate NS like the first embodiment. The same materials as those of the first embodiment can be used as constituent materials of the n-type substrate NS and the n-type clad layer NCLD.

Further, the n-type light guide layer NLG, the active layer MQW and the p-type light guide layer PLG are sequentially disposed on the n-type clad layer NCLD. Incidentally, the aluminum gallium nitride layer (p-type AlGaN layer) into which the p-type impurity is introduced may be provided as the carrier barrier layer between the active layer MQW and the p-type light guide layer PLG. The same materials as those of the first embodiment can be used as constituent materials of these layers.

Here, the p-type clad layer PCLD and the p-type contact layer PCNT are disposed on the p-type light guide layer PLG. A laminated portion including the p-type clad layer PCLD and the p-type contact layer PCNT extends in the Y direction (see FIG. 53).

Side surfaces of the laminated portion including the p-type clad layer PCLD and the p-type contact layer PCNT and an upper surface of the p-type light guide layer PLG are covered by the insulating layer IL. The p-side electrode PEL is disposed on an upper surface of the laminated portion and the n-side electrode NEL is disposed on the back surface of the n-type substrate NS.

The upper surface of the laminated portion including the p-type clad layer PCLD and the p-type contact layer PCNT and the p-side electrode PEL are in contact with each other via the opening portion OA of the insulating layer (insulating film) IL (see FIGS. 50 and 51). This laminated portion including the p-type clad layer PCLD and the p-type contact layer PCNT corresponds to the current confinement region CC (between the current block layers BL) described in the first embodiment. Side surfaces (a surface on an upper side and a surface on a lower side or end surfaces in FIGS. 52 and 53) on which the active layer MQW is exposed become cleavage surfaces constituting a resonator to be described below. An anti-reflection film AR or a high-reflection film HR is formed on the two cleavage surfaces opposed to each other. A side (AR side) on which the anti-reflection film. AR is formed is a light emission side.

Hereinafter, an operation of the semiconductor laser will be briefly described.

First, a positive voltage is applied to the p-side electrode PEL, and a negative voltage is applied to the n-side electrode NEL. Accordingly, a forward current flows from the p-side electrode PEL toward the n-side electrode NEL, and holes are injected from the p-side electrode PEL to the active layer MQW via the laminated portion including the p-type contact layer PCNT and the p-type clad layer PCLD. At this time, since the insulating layer IL has the lower refractive index than the p-type clad layer PCLD, the light is trapped immediately below the above-described laminated portion. Accordingly, the optical waveguide suitable for laser oscillation is formed like the semiconductor laser including the current block layer BL (the current confinement region CC) described in the first embodiment.

Here, the above-described laminated portion includes the narrow portion NP which is positioned at the substantially central portion in the Y direction and the wide portions WP which are positioned at end portions in the Y direction as described above. The width Wn of the narrow portion NP (for example, about 1.3 µm) and the width Wic of the opening portion OA of the insulating layer IL are almost the same in the substantially central portion in the Y direction. The width Ww of the wide portion WP (for example, about 4 µm) is larger than the width Wn at the end in the Y direction. Further, the width Wie of the opening portion OA (for example, 1.6 µm) of the insulating layer IL on the wide portion WP is smaller than the width Ww. Thus, both sides of the wide portion WP are covered by the insulating layer IL (see FIG. 52).

Accordingly, the current from the p-side electrode PEL flows into the laminated portion including the p-type clad layer PCLD and the p-type contact layer PCNT via the opening portion OA having the width Wie (for example, 1.6 µm), and holes are injected into the active layer MQW immediately below the laminated portion. For example, Ln=320 µm, Lt=200 µm and Lw=40 µm.

In this manner, the wide portion WP of the ridged portion and both ends (on the right and left in FIG. 52) of the tapered portion TP are covered by the insulating layer IL in the seventh embodiment. Accordingly, the carrier density can be sharpened at the wide portion WP and the generation of the super luminescence in the wide portion WP can be suppressed like the first embodiment. Thus, it is possible to achieve the improvement of the beam quality and the higher output of the beam.

[Description of Manufacturing Method]

Subsequently, a manufacturing method of the semiconductor laser according to the seventh embodiment will be described, and the configuration of the semiconductor laser will be more clarified with reference to FIGS. 54 to 57. FIGS. 54 to 57 are cross-sectional views showing a manufacturing process of the semiconductor laser according to the seventh embodiment.

Figure 54:
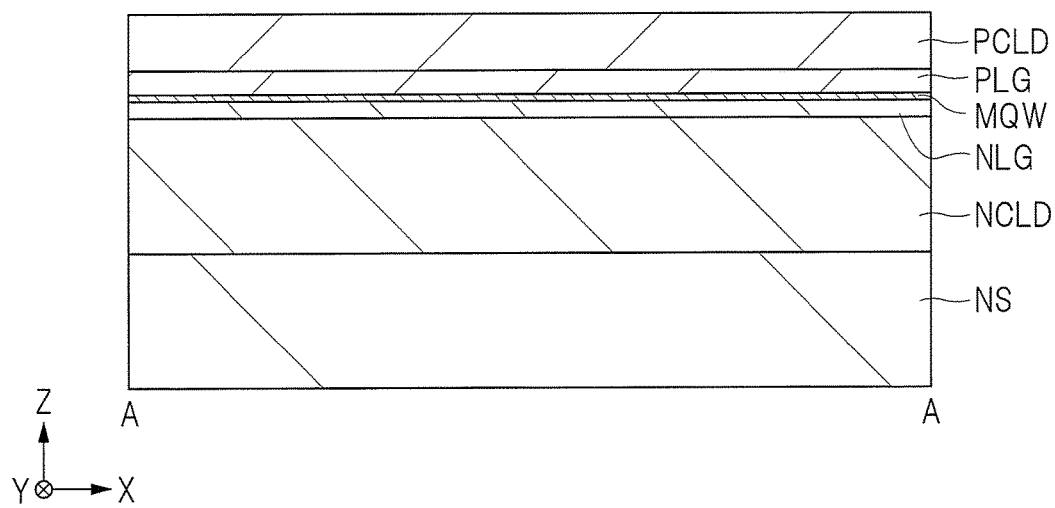
FIG. 54 is a cross-sectional view showing a manufacturing process of the semiconductor laser according to the seventh embodiment.

First, the n-type clad layer NCLD, the n-type light guide layer NLG, the active layer MQW, the p-type light guide layer PLG and the p-type clad layer PCLD are sequentially formed on the n-type substrate NS as shown in FIG. 54. The same materials as those of the first embodiment can be used as constituent materials of these layers and these layers can be formed through the same processes as those in the first embodiment.

Figure 55:
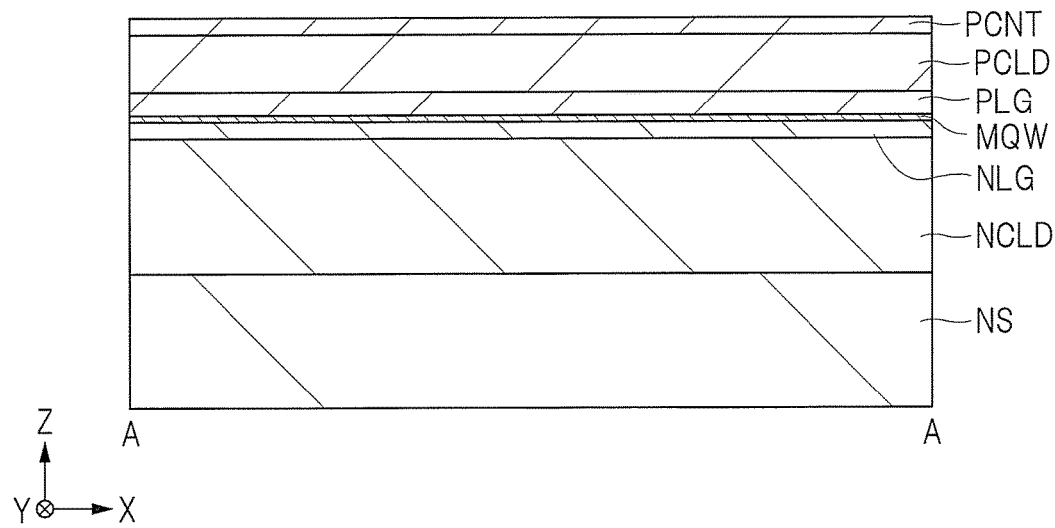
FIG. 55 is a cross-sectional view showing the manufacturing process of the semiconductor laser according to the seventh embodiment.

Subsequently, the p-type contact layer PCNT is formed on the p-type clad layer PCLD as shown in FIG. 55. The same material as that of the first embodiment can be used as the constituent material of the p-type contact layer PCNT and it can be formed through the same process as that in the first embodiment.

Figure 56:
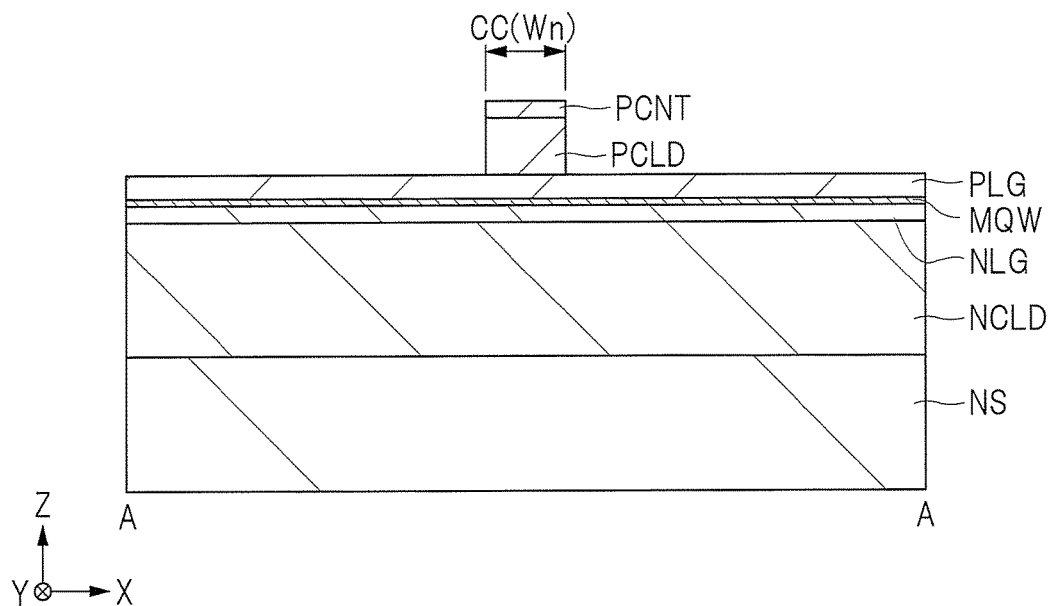
FIG. 56 is a cross-sectional view showing the manufacturing process of the semiconductor laser according to the seventh embodiment.

Subsequently, a laminated film including the p-type clad layer PCLD and the p-type contact layer PCNT is etched with using a hard mask or a photoresist film having a predetermined shape as a mask as shown in FIG. 56. Accordingly, the ridged portion formed of the laminated portion including the p-type clad layer PCLD and the p-type contact layer PCNT is formed.

Figure 57:
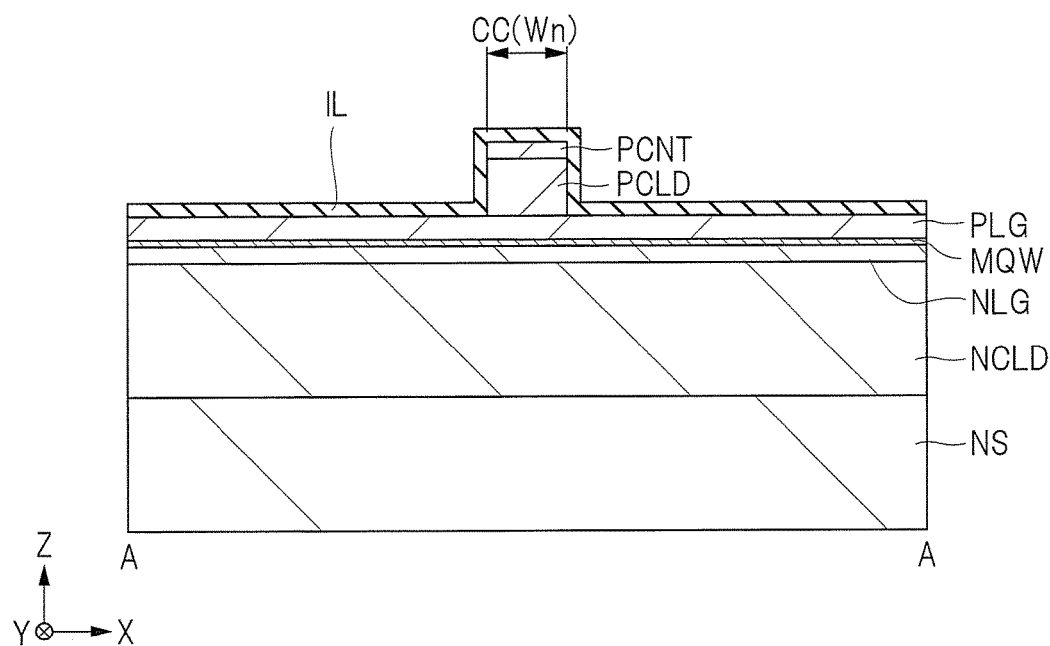
FIG. 57 is a cross-sectional view showing the manufacturing process of the semiconductor laser according to the seventh embodiment.

Thereafter, a silicon oxide film is formed as the insulating layer IL on the p-type contact layer PCNT and the inversion layer RL by, for example, a CVD method or the like in the same manner as the first embodiment (FIG. 57). Subsequently, the insulating layer IL on the ridged portion is removed and the opening portion OA is formed.

As described above, the opening portion OA includes a portion (the central width Wic) which is positioned at the substantially central portion in the Y direction, a portion (the end width Wie) which is positioned on one side of the substantially central portion in the Y direction corresponding to the HR side (the lower side in FIG. 52), and a portion (the end width Wie) which is positioned on the other side of the substantially central portion in the Y direction corresponding to the AR side (the upper side in FIG. 52). A relation that the central width Wic<the end width Wie is established. In addition, a relation that the width Ww of the wide portion WP>the end width Wie is established. In this manner, the width (Wie) of the opening portion OA of the insulating layer IL is made narrow, and accordingly, it is possible to cover both ends (right and left ends in the X direction in FIG. 52) of the wide portion WP and the tapered portion TP with the insulating layer IL.

Thereafter, in the same manner as the first embodiment, the p-side electrode PEL and the n-side electrode NEL are formed and the substrate NS is cleaved in the X direction, and then, the anti-reflection film AR and the high-reflection film HR are formed and the substrate NS is cut in the Y direction (FIGS. 50 to 53). It is possible to form the semiconductor laser of the seventh embodiment through the above-described processes.

In the seventh embodiment, the laminated portion (ridged portion) including the p-type contact layer PCNT and the p-type clad layer PCLD may be formed to have the same planar shape as the current confinement region (CC) described in the third to fifth embodiments. In this case, the opening portion OA may be formed to have the same shape as the planar shape of the ridged portion.

There is no limitation in the application of the semiconductor laser described in the first to seventh embodiments, and the semiconductor laser can be mounted in the following devices. For example, the semiconductor laser according to the first to seventh embodiments can be used as a light source of a precision measuring instrument (industrial or medical sensor device or analysis device). Accordingly, it is possible to achieve higher output of the light source, so that the higher performance of the device (for example, speeding up, expansion of diversity in size and type of a measurement object, improvement of reliability and the like) can be achieved. In addition, it is possible to mount the semiconductor laser in industrial appliances such as a direct-imaging exposure device or printer and a precision processing device (3D printer). Accordingly, it is possible to achieve the higher performance of the device, for example, the speeding up of the processing, an increase in size of a processing target, expansion of diversity, the improvement of reliability and the like.

In the foregoing, the invention made by the inventors of the present invention has been concretely described based on the embodiments. However, it is needless to say that the present invention is not limited to the foregoing embodiments and various modifications and alterations can be made within the scope of the present invention.

APPENDIX 1

A semiconductor device includes:

a substrate;

a first nitride semiconductor layer disposed above a main surface of the substrate;

a second nitride semiconductor layer disposed above the first nitride semiconductor layer;

a third nitride semiconductor layer disposed above the second nitride semiconductor layer;

an insulating film which is disposed above the third nitride semiconductor layer and includes an opening portion; and a first side surface and a second side surface to which the second nitride semiconductor layer is exposed, wherein each of the first side surface and the second side surface extends in a first direction, the third nitride semiconductor layer extends in a second direction intersecting the first direction and includes a first portion, a second portion disposed on the first side surface on one side of the first portion, and a third portion disposed on the second side surface on the other side of the first portion, a width of the second portion is larger than a width of the first portion, the width of the second portion is larger than a width of the opening portion of the insulating film positioned above the second portion, and both ends of the second portion are covered by the insulating film.

APPENDIX 2

In the semiconductor device described in Appendix 1, a width of the third portion is larger than the width of the first portion, the width of the third portion is larger than a width of the opening portion of the insulating film positioned above the third portion, and both ends of the third portion are covered by the insulating film.

APPENDIX 3

In the semiconductor device described in Appendix 2, the insulating film covers a side surface of the first portion, and extends above the second nitride semiconductor layer in the first portion.

APPENDIX 4

In the semiconductor device described in Appendix 2, the first nitride semiconductor layer has a larger bandgap than the second nitride semiconductor layer and is of a first conductivity type, and the third nitride semiconductor layer has a larger bandgap than the second nitride semiconductor layer and is of a second conductivity type which is an opposite conductivity type to the first conductivity type.

APPENDIX 5

A semiconductor device includes:

a substrate;

a first nitride semiconductor layer disposed above a main surface of the substrate;

a second nitride semiconductor layer disposed above the first nitride semiconductor layer;

a third nitride semiconductor layer disposed above the second nitride semiconductor layer;

two fourth nitride semiconductor layers which are disposed between the third nitride semiconductor layer and the second nitride semiconductor layer and are spaced apart from each other;

a current confinement region which is a region between the two fourth nitride semiconductor layers; and a first side surface and a second side surface to which the second nitride semiconductor layer is exposed, wherein each of the first side surface and the second side surface extends in a first direction, the current confinement region, which is the region between the two fourth nitride semiconductor layers, extends in a second direction intersecting the first direction and includes a first portion, a second portion disposed on the first side surface on one side of the first portion, a third portion disposed on the second side surface on the other side of the first portion, a fourth portion positioned between the first portion and the second portion, and a fifth portion positioned between the first portion and the third portion, a width of the second portion is larger than a width of the first portion, a planar shape of the fourth portion is a tapered shape whose width in the first direction gradually increases from the width of the first portion to the width of the second portion, a planar shape of the fifth portion is a tapered shape whose width in the first direction gradually increases from the width of the first portion to a width of the third portion, and a length of the fourth portion in the second direction is smaller than a length of the fifth portion in the second direction.

What is claimed is:

1. A semiconductor device comprising:
a substrate;
a first nitride semiconductor layer disposed above a main surface of the substrate;
a second nitride semiconductor layer disposed above the first nitride semiconductor layer;
a third nitride semiconductor layer disposed above the second nitride semiconductor layer;
two fourth nitride semiconductor layers which are disposed between the third nitride semiconductor layer and the second nitride semiconductor layer and are spaced apart from each other;
a current confinement region which is a region between the two fourth nitride semiconductor layers;
an insulating film which is disposed above the third nitride semiconductor layer and includes an opening portion above the current confinement region; and
a first side surface and a second side surface to which the second nitride semiconductor layer is exposed,
wherein each of the first side surface and the second side surface extends in a first direction,
the current confinement region extends in a second direction intersecting the first direction and includes a first portion, a second portion disposed on the first side surface on one side of the first portion, and a third portion disposed on the second side surface on the other side of the first portion,
a width of the second portion is larger than a width of the first portion, the width of the second portion is larger than a width of the opening portion of the insulating film positioned above the second portion, and both ends of the second portion are covered by the insulating film, wherein the width of the first portion is smaller than a width of the opening portion of the insulating film positioned above the first portion.

2. The semiconductor device according to claim 1,
wherein a width of the third portion is larger than the width of the first portion,
the width of the third portion is larger than a width of the opening portion of the insulating film positioned above the third portion, and
both ends of the third portion are covered by the insulating film.

3. The semiconductor device according to claim 1,
wherein the first nitride semiconductor layer has a larger bandgap than the second nitride semiconductor layer and is of a first conductivity type,
the third nitride semiconductor layer has a larger bandgap than the second nitride semiconductor layer and is of a second conductivity type which is an opposite conductivity type to the first conductivity type, and
the fourth nitride semiconductor layer has a larger bandgap than the third nitride semiconductor layer.

4. The semiconductor device according to claim 3,
wherein a fourth portion whose width gradually increases from the width of the first portion to the width of the second portion is provided between the first portion and the second portion, and
a fifth portion whose width gradually increases from the width of the first portion to the width of the third portion is provided between the first portion and the third portion.

5. A semiconductor device comprising:
a nitride semiconductor layer;
a current block layer formed in the nitride semiconductor layer and including a first opening which defines a current confinement region, the current confinement region including:
a first portion having first width; and
a second portion having a second width greater than the first width;
an insulating layer formed on the nitride semiconductor layer and including a second opening, the second opening including:
a first portion formed over the first portion of the current confinement region and having a third width greater than the first width; and
a second portion formed over the second portion of the current confinement region and having a fourth width less than the second width and less than the third width.

6. The semiconductor device of claim 5, wherein the second portion of the current confinement region is formed at an end of the first portion of the current confinement region in a light-emitting direction.

7. The semiconductor device of claim 5, wherein the insulating layer is formed over the second portion of the current confinement region in a plan view.

8. The semiconductor device of claim 5, wherein the current confinement region further comprises a tapered portion formed between the first portion of the current confinement region and the second portion of the current confinement region in a light-emitting direction.

9. The semiconductor device of claim 8, wherein a width of the tapered portion increases in a direction from the first portion of the current confinement region toward the second portion of the current confinement region.

10. The semiconductor device of claim 8, wherein a length of the tapered portion of the current confinement region in the light-emitting direction is less than a length of the first portion of the current confinement region in the light-emitting direction.

11. The semiconductor device of claim 10, wherein the length of the tapered portion of the current confinement region in the light-emitting direction is greater than a length of the second portion of the current confinement region in the light-emitting direction.

12. The semiconductor device of claim 5, further comprising:
   a light-emitting layer, the nitride semiconductor layer being formed on the light-emitting layer;
   a contact layer formed on the nitride semiconductor layer, the insulating layer being formed on the contact layer such that a surface of the contact layer is exposed through the second opening in the insulating layer; and
   an electrode formed on the insulating layer and on the surface of the contact layer in the second opening in the insulating layer.

13. The semiconductor device of claim 12, wherein the current block layer has a bandgap greater than the light-emitting layer, and a bandgap greater than the nitride semiconductor layer.

* * * * *